US011289519B2

United States Patent
Hogyoku

(10) Patent No.: US 11,289,519 B2
(45) Date of Patent: Mar. 29, 2022

(54) SEMICONDUCTOR DEVICE AND ELECTRONIC APPARATUS

(71) Applicant: SONY SEMICONDUCTOR SOLUTIONS CORPORATION, Kanagawa (JP)

(72) Inventor: Susumu Hogyoku, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 85 days.

(21) Appl. No.: 16/478,679

(22) PCT Filed: Jan. 17, 2018

(86) PCT No.: PCT/JP2018/001091
§ 371 (c)(1),
(2) Date: Jul. 17, 2019

(87) PCT Pub. No.: WO2018/139282
PCT Pub. Date: Aug. 2, 2018

(65) Prior Publication Data
US 2019/0371833 A1 Dec. 5, 2019

(30) Foreign Application Priority Data
Jan. 30, 2017 (JP) .............................. JP2017-014303

(51) Int. Cl.
*H01L 27/146* (2006.01)
*G02B 7/02* (2021.01)
(Continued)

(52) U.S. Cl.
CPC .............. *H01L 27/146* (2013.01); *G02B 7/02* (2013.01); *G03B 17/02* (2013.01); *H01L 23/373* (2013.01);
(Continued)

(58) Field of Classification Search
CPC ......... G02B 7/02; G03B 17/02; H01L 27/146; H01L 23/373; H01L 2924/15151;
(Continued)

(56) References Cited

U.S. PATENT DOCUMENTS

2008/0173792 A1  6/2008  Wen-Kun et al.
2010/0039553 A1* 2/2010  Kim ..................... H04N 5/2254
                                                         348/374
(Continued)

FOREIGN PATENT DOCUMENTS

CN      101232033 A     7/2008
CN      101924081 A    12/2010
(Continued)

OTHER PUBLICATIONS

International Search Report and Written Opinion of PCT Application No. PCT/JP2018/001091, dated Mar. 20, 2018, 10 pages of ISRWO.

*Primary Examiner* — Cuong B Nguyen
(74) *Attorney, Agent, or Firm* — Chip Law Group

(57) ABSTRACT

The present technology relates to a semiconductor device capable of providing a heat-stable optical system, and an electronic apparatus. A semiconductor device is provided, and the semiconductor device includes a sensor and a holding substrate that holds the sensor. In the semiconductor device, $(E_I \times t_I)+(E_S \times t_S)>30$ and $1.5<CTE_I<4.5$ are satisfied, where $E_S$ (GPa) represents a Young's modulus of the sensor, $t_S$ (mm) represents a thickness of the sensor, $CTE_I$ (ppm/K) represents a linear expansion coefficient of the holding substrate, $E_I$ (GPa) represents a Young's modulus of the holding substrate, and $t_I$ (mm) represents a thickness of the holding substrate. The present technology can be applied to a semiconductor package housing an image sensor, for example.

9 Claims, 47 Drawing Sheets

(51) Int. Cl.
*G03B 17/02* (2021.01)
*H01L 23/373* (2006.01)
*H04N 5/225* (2006.01)
*H04N 5/369* (2011.01)
*H04N 7/18* (2006.01)

(52) U.S. Cl.
CPC ............. *H04N 5/225* (2013.01); *H04N 5/369* (2013.01); *H04N 7/18* (2013.01)

(58) Field of Classification Search
CPC ... H01L 2924/3511; H01L 2224/73253; H01L 2224/16225; H01L 27/14601; H01L 27/14625; H01L 27/14618; H04N 5/225; H04N 5/369; H04N 7/18; H04N 5/2253; H04N 7/183
See application file for complete search history.

(56) References Cited

U.S. PATENT DOCUMENTS

| | | |
|---|---|---|
| 2010/0314703 A1 | 12/2010 | Chen |
| 2012/0015150 A1 | 1/2012 | Suzuki |
| 2012/0193779 A1* | 8/2012 | Lee ........................ H01L 21/563 257/737 |
| 2012/0211640 A1* | 8/2012 | Suzuki .............. H01L 27/14618 250/208.1 |
| 2018/0020131 A1* | 1/2018 | Zhao ..................... H01R 13/04 |

FOREIGN PATENT DOCUMENTS

| | | |
|---|---|---|
| DE | 102008005607 A1 | 10/2008 |
| JP | 2000-269472 A | 9/2000 |
| JP | 2005-005488 A | 1/2005 |
| JP | 2005-340539 A | 12/2005 |
| JP | 2008-235869 A | 10/2008 |
| JP | 2012-020892 A | 2/2012 |
| JP | 2014-194541 A | 10/2014 |
| JP | 2014-216394 A | 11/2014 |
| JP | 2014-229674 A | 12/2014 |
| JP | 2015-046438 A | 3/2015 |
| KR | 10-2008-0069549 A | 7/2008 |
| TW | 200835318 A | 8/2008 |
| TW | 201446497 A | 12/2014 |
| TW | 201707156 A | 2/2017 |
| WO | 2014/133007 A1 | 9/2014 |
| WO | 2017/010063 A1 | 1/2017 |

* cited by examiner

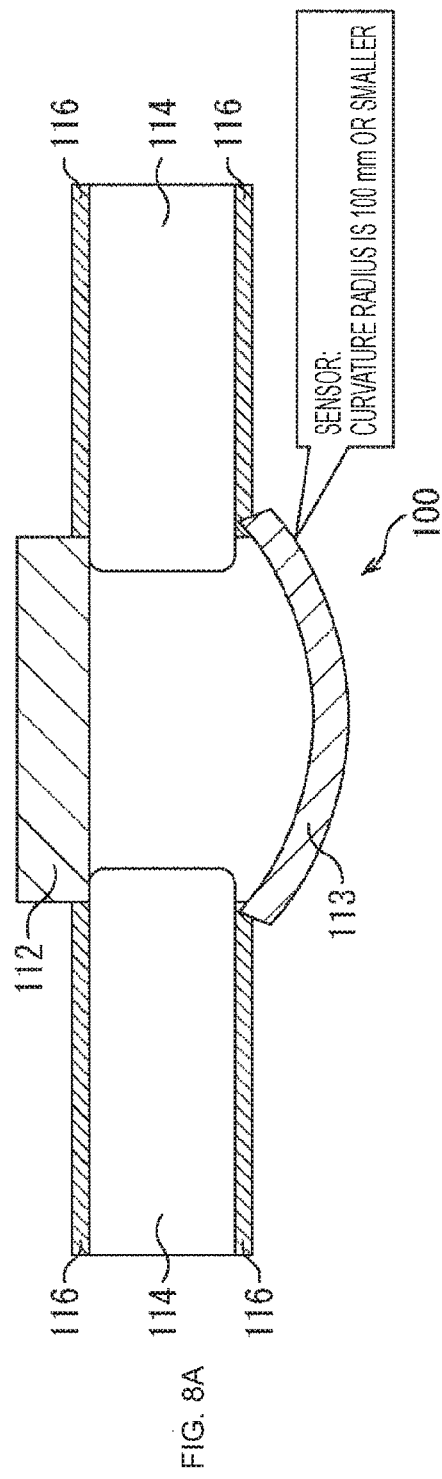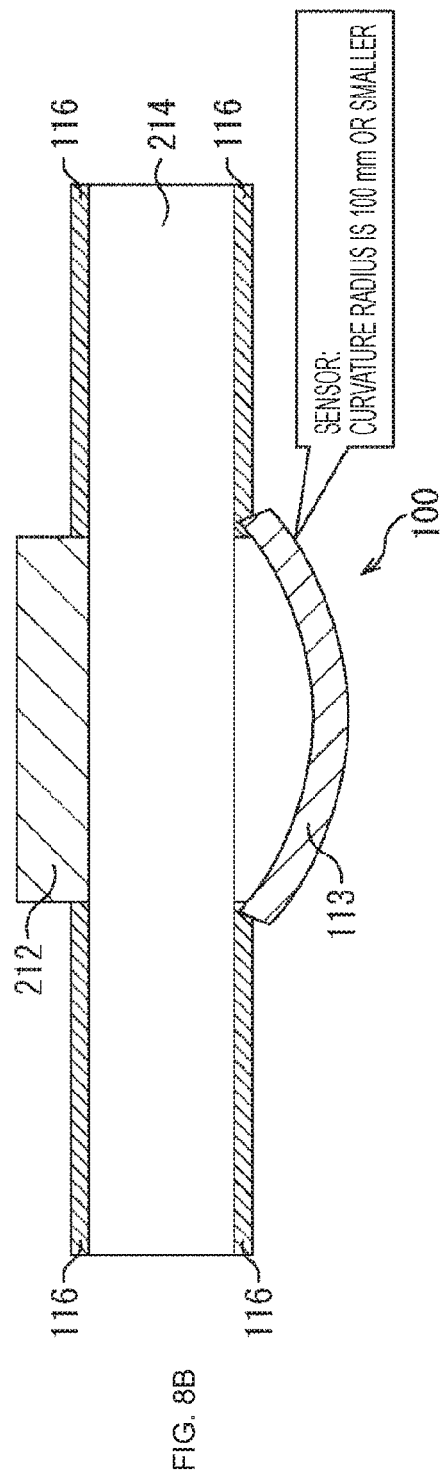

SEMICONDUCTOR DEVICE AND ELECTRONIC APPARATUS

CROSS REFERENCE TO RELATED APPLICATIONS

This application is a U.S. National Phase of International Patent Application No. PCT/JP2018/001091 filed on Jan. 17, 2018, which claims priority benefit of Japanese Patent Application No. JP 2017-014303 filed in the Japan Patent Office on Jan. 30, 2017. Each of the above-referenced applications is hereby incorporated herein by reference in its entirety.

TECHNICAL FIELD

The present technology relates to a semiconductor device and an electronic apparatus, and more particularly, to a semiconductor device capable of providing a heat-stable optical system, and an electronic apparatus.

BACKGROUND ART

Solid-state imaging elements such as charge coupled device (CCD) image sensors and complementary metal oxide semiconductor (CMOS) image sensors to which a semiconductor microfabrication technology is applied have been widely adopted for digital cameras, mobile telephone devices, and the like.

As pixel miniaturization for sensor chips has progressed in recent years, there is a tendency to use a lens with a small f-number to increase the light quantity per pixel. Because of this, the lens focal depth becomes smaller, and therefore, emphasis is put particularly on the thermal stability of the shape of sensor warpage that is necessary for achieving focusing.

Techniques for improving the thermal stability of sensor warpage are disclosed in Patent Document 1 and Patent Document 2, for example.

Patent Document 1 discloses a technique for stabilizing the shape of sensor warpage. By this technique, a material that has high stability to heat like ceramic that is fired at high temperature, and also has high shape stability to humidity and the like is used as the material of a substrate that holds an optical sensor.

Patent Document 2 discloses a technique for stabilizing the shape of sensor warpage. By this technique, a material such as alkali-free glass having a linear expansion coefficient (CTE) close to that of silicon (Si) of a semiconductor chip (a sensor chip) is used as the material of the core of a substrate that holds an optical sensor.

CITATION LIST

Patent Documents

Patent Document 1: Japanese Patent Application Laid-Open No. 2005-340539
Patent Document 2: Japanese Patent Application Laid-Open No. 2014-229674

SUMMARY OF THE INVENTION

Problems to be Solved by the Invention

However, it is not possible to maintain sufficient thermal stability of sensor warpage simply by selecting a substrate material as in the techniques disclosed in Patent Documents 1 and 2 described above. Therefore, there is a demand for structures with higher thermal stability.

The present technology has been made in view of those circumstances, and is to enable provision of a heat-stable optical system.

Solutions to Problems

A semiconductor device according to a first aspect of the present technology is a semiconductor device that includes a sensor and a holding substrate that holds the sensor. In the semiconductor device, $(E_I \times t_I) + (E_S \times t_S) > 30$ and $1.5 < CTE_I < 4.5$ are satisfied, where $E_S$ (GPa) represents a Young's modulus of the sensor, $t_S$ (mm) represents a thickness of the sensor, $CTE_I$ (ppm/K) represents a linear expansion coefficient of the holding substrate, $E_I$ (GPa) represents a Young's modulus of the holding substrate, and $t_I$ (mm) represents a thickness of the holding substrate.

In the semiconductor device according to the first aspect of the present technology, $(E_I \times t_I) + (E_S \times t_S) > 30$ and $1.5 < CTE_I < 4.5$ are satisfied, where $E_S$ (GPa) represents a Young's modulus of the sensor, $t_S$ (mm) represents a thickness of the sensor, $CTE_I$ (ppm/K) represents a linear expansion coefficient of the holding substrate, $E_I$ (GPa) represents a Young's modulus of the holding substrate, and $t_I$ (mm) represents a thickness of the holding substrate.

An electronic apparatus according to a second aspect of the present technology is an electronic apparatus including a semiconductor device that includes a sensor and a holding substrate that holds the sensor. In the semiconductor device, $(E_I \times t_I) + (E_S \times t_S) > 30$ and $1.5 < CTE_I < 4.5$ are satisfied, where $E_S$ (GPa) represents a Young's modulus of the sensor, $t_S$ (mm) represents a thickness of the sensor, $CTE_I$ (ppm/K) represents a linear expansion coefficient of the holding substrate, $E_I$ (GPa) represents a Young's modulus of the holding substrate, and $t_I$ (mm) represents a thickness of the holding substrate.

The electronic apparatus according to the second aspect of the present technology includes a semiconductor device in which $(E_I \times t_I) + (E_S \times t_S) > 30$ and $1.5 < CTE_I < 4.5$ are satisfied, where $E_S$ (GPa) represents a Young's modulus of the sensor, $t_S$ (mm) represents a thickness of the sensor, $CTE_I$ (ppm/K) represents a linear expansion coefficient of the holding substrate, $E_I$ (GPa) represents a Young's modulus of the holding substrate, and $t_I$ (mm) represents a thickness of the holding substrate.

Effects of the Invention

According to the first and second aspects of the present technology, an optical system that is stable to heat can be provided.

Note that the effects of the present technology are not necessarily limited to the effects described herein, and may include any of the effects described in the present disclosure.

BRIEF DESCRIPTION OF DRAWINGS

FIGS. 8A and 8B are diagrams showing a condition (the curvature radius of the sensor: 100 mm or smaller) for a first simulation.

MODES FOR CARRYING OUT THE INVENTION

Figure 1:
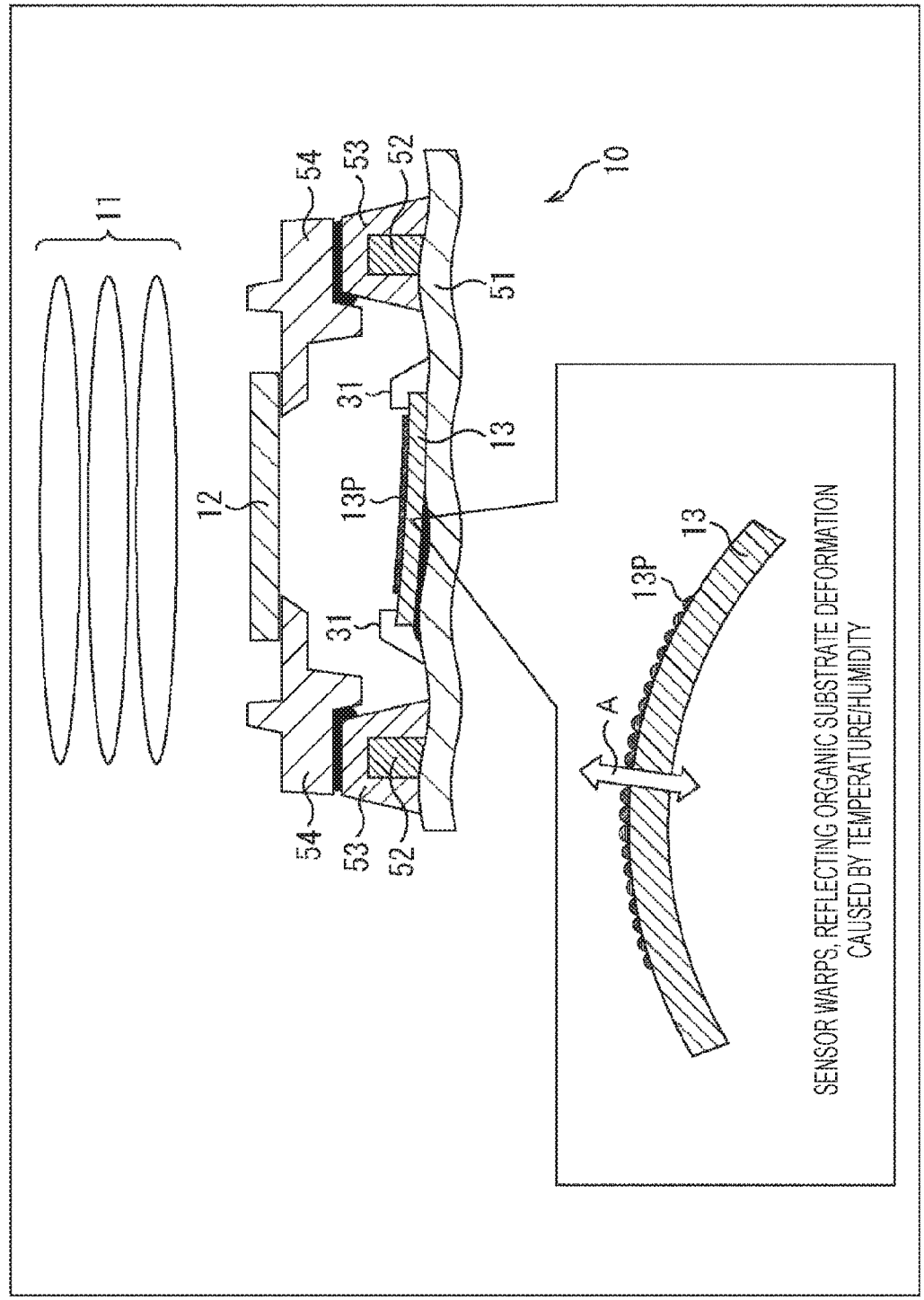
FIG. 1 is a cross-sectional view of the structure of a conventional semiconductor device.

The following is a description of embodiments of a technology (the present technology) according to the present disclosure, with reference to the drawings. Note that explanation will be made in the following order.

1. Outline of the present technology
2. Example simulations
3. First embodiment: basic structures
4. Second embodiment: structures in which electrodes are protected
5. Third embodiment: structures equipped with heating elements
6. Fourth embodiment: structures with biased electrode arrangement
7. Fifth embodiment: structures equipped with a drive mechanism for correction
8. Sixth embodiment: structures equipped with a curved sensor 9. Modifications
  (1) Modifications of semiconductor devices according to the first embodiment
  (2) Modifications of the third structure of a semiconductor device according to the first embodiment
  (3) Modifications of semiconductor devices according to the first through sixth embodiments
  (4) Example of a manufacturing method
10. Configuration of an electronic apparatus
11. Examples of use of an image sensor
12. Example applications to moving objects 1. Outline of the Present Technology (Structure of a Conventional Semiconductor Device)

FIG. 1 is a cross-sectional view of the structure of a conventional semiconductor device.

In FIG. 1, a semiconductor package 10 is a conventional semiconductor device that houses and packages a sensor 13 as a semiconductor chip. A plurality of pixels 13P is two-dimensionally arranged in a matrix fashion on the light receiving surface of the sensor 13, and light entering through a lens group 11 is received via a filter unit 12. The entering light is photoelectrically converted by the pixels 13P, and the resultant electrical signal is output.

The sensor 13 is mounted on an organic substrate 51, and is secured with an adhesive at a position where the sensor 13 can receive entering light. Note that (the pad unit of) the sensor 13 and (the lead unit of) the organic substrate 51 are electrically connected by wire bonding using wires 31. Further, components 52 are secured onto the organic substrate 51, and are covered with mold resin 53. A frame unit 54 is further provided on the mold resin 53, to secure the filter unit 12.

Here, as shown in a frame for illustrating the sensor 13, in a case where the organic substrate 51 is deformed due to temperature or humidity, the sensor 13 warps, reflecting the deformation. Specifically, the sensor 13 warps in the direction of an arrow A in the frame.

Figure 2:
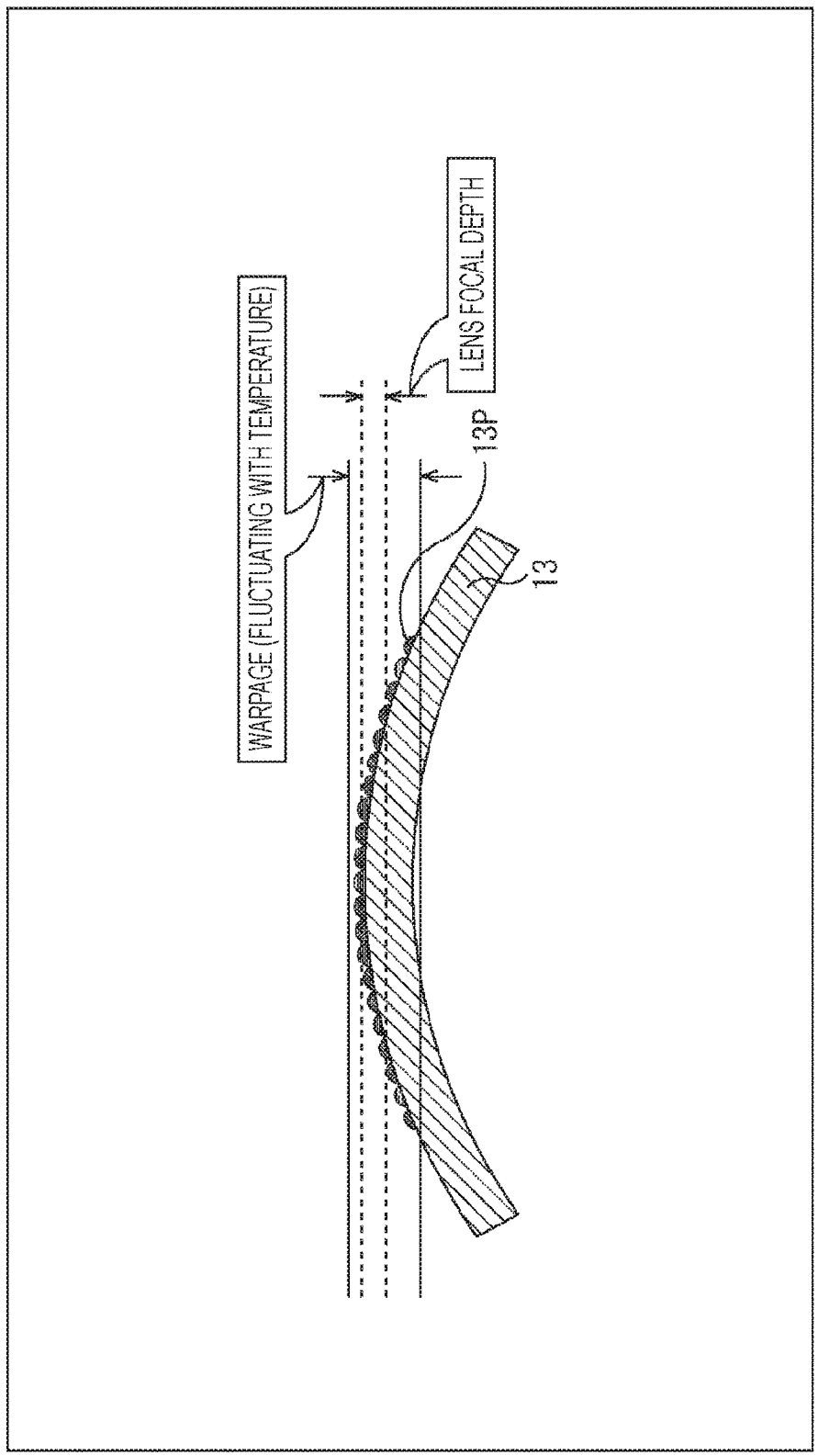
FIG. 2 is a diagram showing the relationship between the amount of sensor warpage and the focal depth of a lens.

Further, as the pixel miniaturization of the sensor 13 has progressed, there is a tendency to use the lens group 11 with a small f-number to increase the light quantity of the pixels 13P, as described above. In addition, in a case where the lens group 11 having a small f-number is used, the lens focal depth becomes smaller as shown in FIG. 2. Note that the focal depth $\Delta$ is calculated as follows: $\Delta=2\varepsilon F$ ($\varepsilon$: resolution, F: f-number).

At this stage, if the amount of warpage of the sensor 13 which fluctuates with temperature becomes larger than the lens focal depth as shown in FIG. 2, focusing is affected, and therefore, there has been a demand for a heat-stable optical system.

Figure 3:
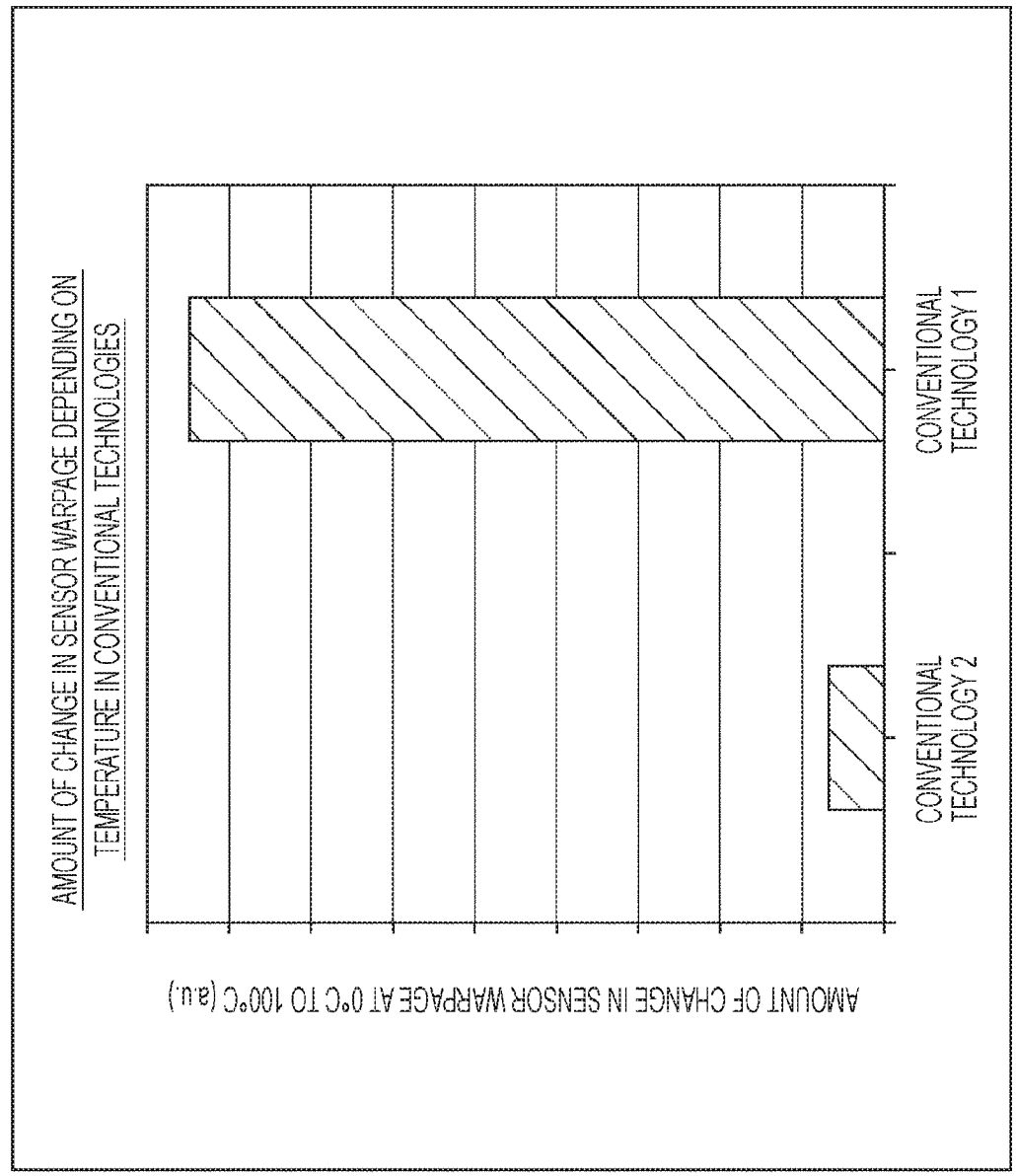
FIG. 3 is a chart showing the amounts of change in sensor warpage depending on temperature in conventional technologies.

Here, the technology disclosed in the above mentioned Patent Document 1 is referred to as "Conventional Technology 1", and the technology disclosed in the above mentioned Patent Document 2 is referred to as "Conventional Technology 2". The amounts of sensor warpage in a case where these conventional technologies are used are as shown in FIG. 3, for example. Specifically, in FIG. 3, the ordinate axis indicates the change in the amount of sensor warpage at 0° C. to 100° C. (the amount of change in sensor warpage). Conventional Technologies 1 and 2 each have a certain amount of change in sensor warpage, and therefore, it is safe to say that the temperature stability of warpage of the sensor is poor.

In view of this, in a semiconductor device to which the present technology is applied, sufficient thermal stability is maintained for sensor warpage so that a heat-stable optical system can be provided. In the description below, a semiconductor device to which the present technology is applied is explained.

(Structure of a Semiconductor Device of the Present Technology)

Figure 4:
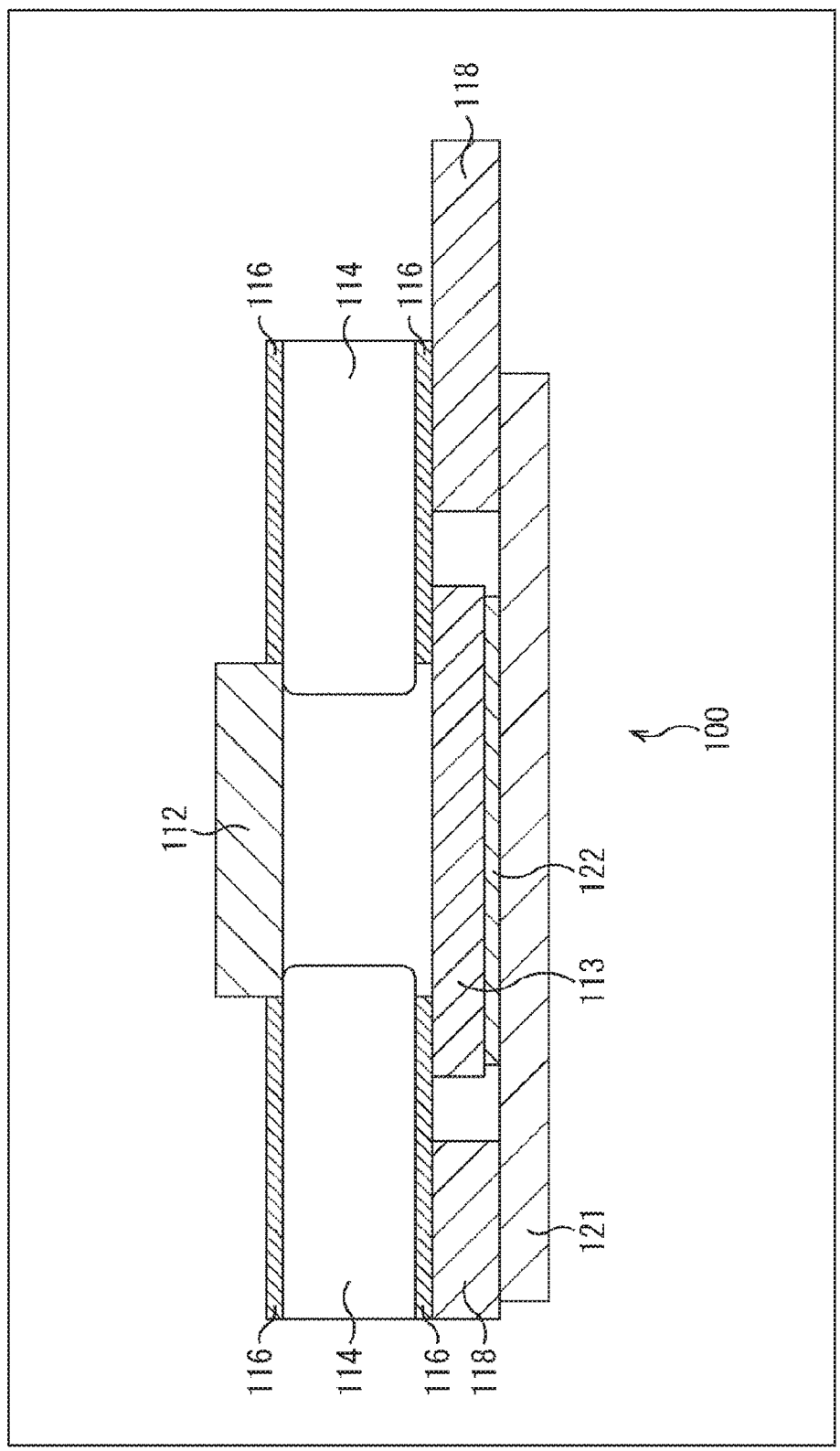
FIG. 4 is a cross-sectional view of a structure of a semiconductor device to which the present technology is applied.

FIG. 4 is a cross-sectional view of the structure of a semiconductor device to which the present technology is applied.

In FIG. 4, a semiconductor package 100 is a semiconductor device that houses and packages a sensor 113 as a semiconductor chip.

The image sensor 113 is a solid-state imaging element such as a charge coupled device (CCD) image sensor or a complementary metal oxide semiconductor (CMOS) image sensor. A plurality of pixels is two-dimensionally arranged in a matrix fashion on the light receiving surface of the sensor 113, and light entering through a lens group (not shown) is received via a sealing member 112. The entering light is photoelectrically converted by (the pixels) of the sensor 113, and the resultant electrical signal is output. Note that the sealing member 112 may have the functions of a filter.

A holding substrate 114 is a core substrate (a sensor holding substrate) for holding the sensor 113. The holding substrate 114 has a structure as a sensor holding mode in which the peripheral portion of the sensor 113 is held by substrate electrodes from the light receiving surface side. Further, an opening having a rectangular shape is formed in the central portion of the holding substrate 114, and light that has passed through the opening enters the sensor 113 from the light receiving surface.

Furthermore, on-substrate circuits 116 are provided on the upper surface (the surface on the light entering side) and the lower surface (the surface on the opposite side from the light entering side) of the holding substrate 114. The on-substrate circuit 116 provided on the lower surface side is electrically connected to lead-out circuits 118 by an anisotropic conductive film (ACF), for example.

A backing member 121 is a member (a sensor backing member) that backs the sensor 113. The backing member 121 is secured (connected) to the lower surface (the surface on the opposite side from the light entering side) of the sensor 113 by an adhesive 122.

In the semiconductor package 100 designed as described above, the physical property values of the respective components such as the sensor 113, the holding substrate 114, and the backing member 121 are adjusted as described below, to prevent warpage of the sensor 113 from changing (or make warpage of the sensor 113 hardly change).

Firstly, where the Young's modulus of the sensor 113 is represented by $E_S$ (GPa), the thickness of the sensor 113 is represented by $t_S$ (mm), the Young's modulus of the holding substrate 114 is represented by $E_I$ (GPa), and the thickness of the holding substrate 114 is represented by $t_I$ (mm), $(E_I \times t_I)+(E_S \times t_S)$ is adjusted so that warpage of the sensor 113 will not change (or will hardly change) with temperature.

Secondly, where the linear expansion coefficient (CTE: Coefficient of Thermal Expansion) of the holding substrate 114 is represented by $CTE_I$ (ppm/K), the $CTE_I$ is adjusted so that warpage of the sensor 113 will not change (or will hardly change) with temperature.

Thirdly, the volume of the on-substrate circuits 116 (the circuit on the holding substrate 114 (excluding the lead-out circuits 118)) relative to the volume of the holding substrate 114 is adjusted so that warpage of the sensor 113 will not change (or will hardly change) with temperature.

Fourthly, where the Young's modulus of the backing member 121 is represented by $E_C$ (GPa), and the thickness of the backing member 121 is represented by is $t_C$ (mm), ($E_C \times t_C$) is adjusted so that warpage of the sensor 113 will not change (or will hardly change) with temperature.

Figure 5:
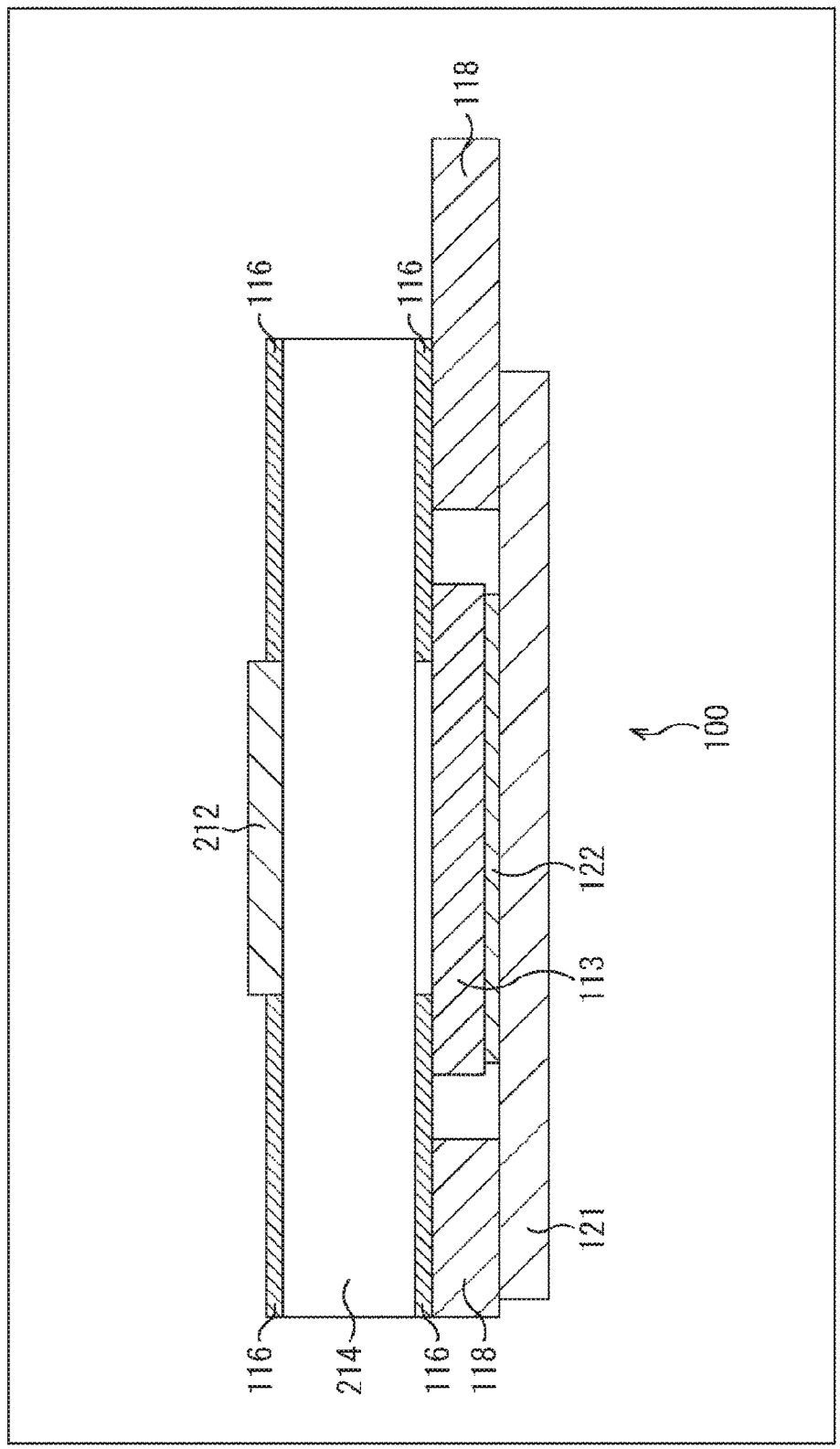
FIG. 5 is a cross-sectional view of another structure of a semiconductor device to which the present technology is applied.

Note that, in FIG. 5, a structure in which a holding substrate 214 without any opening, instead of the holding substrate 114 having an opening, is provided as a holding substrate that holds the sensor 113, and a filter unit 212 having the functions of a filter is provided on the holding substrate 214 is shown as another structure of the semiconductor package 100 shown in FIG. 4. Even in a case where the structure shown in FIG. 5 is adopted, it is possible to prevent warpage of the sensor 113 from changing with temperature (or making warpage of the sensor 113 hardly change with temperature), by adjusting the physical property values of the respective components including the holding substrate 214 as described above.

Figure 6:
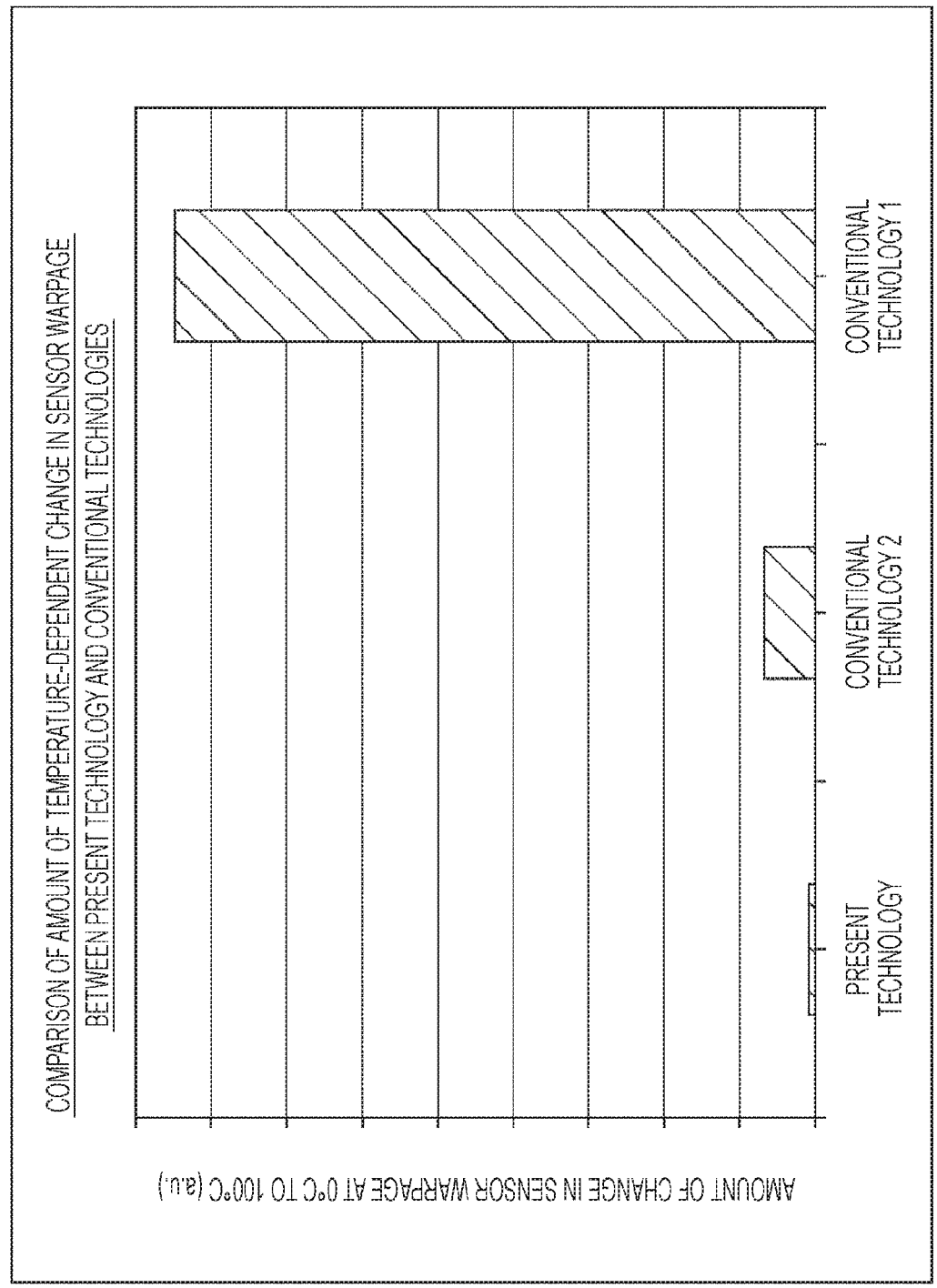
FIG. 6 is a chart showing comparisons of the amount of change in sensor warpage depending on temperature between the present technology and the conventional technologies.

Here, the amount of change in sensor warpage in a case where the present technology for adjusting the physical property values of the above described components is used is as shown in FIG. 6, for example. Note that, in FIG. 6, the amounts of change in sensor warpage in cases where Conventional Technologies 1 and 2 shown in FIG. 3 are used are also shown for comparison with the present technology.

That is, in FIG. 6, the ordinate axis indicates the amount of change in sensor warpage at 0° C. to 100° C. as in FIG. 3. In the case where the present technology is used, the amount of change in sensor warpage is much smaller than those in the cases where Conventional Technologies 1 and 2 are used. Thus, it is possible to enhance temperature stability of sensor warpage by using the present technology.

Figure 7:
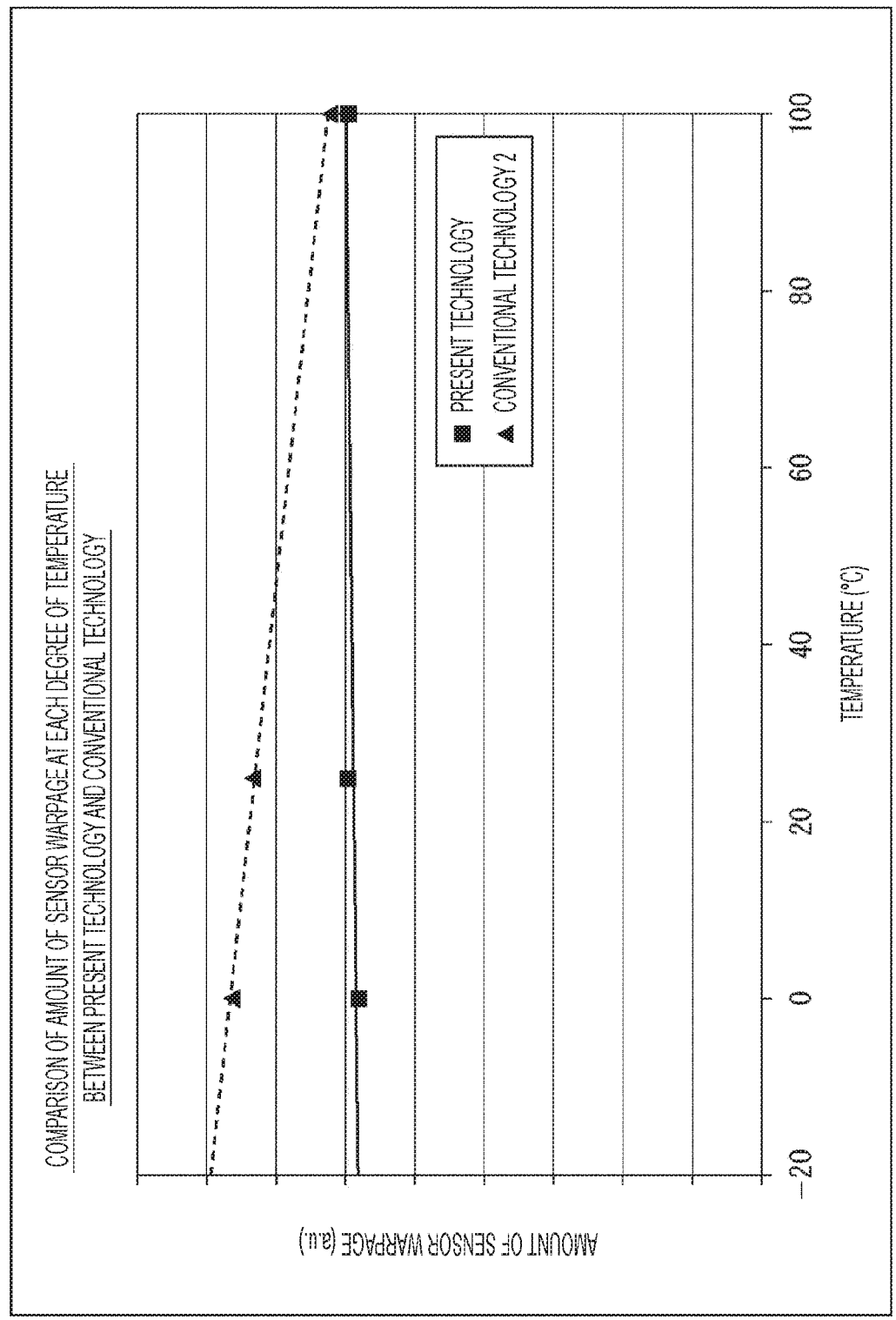
FIG. 7 is a chart showing a comparison of the amount of sensor warpage at each degree of temperature between the present technology and a conventional technology.

Further, when the amount of sensor warpage in a case where the present technology is used is compared with the amount of sensor warpage in a case where Conventional Technology 2 is used, the comparison result is as shown in FIG. 7, for example. Note that, in FIG. 7, the ordinate axis indicates the amount of sensor warpage, and the abscissa axis indicates temperature (° C.).

That is, the result of the present technology shows the relationship between temperature and the amount of sensor warpage in a case where the physical property values of the respective components are adjusted as described above in the semiconductor package 100 shown in FIG. 4 or 5. With attention being paid to the result of the present technology, the value of the amount of sensor warpage is substantially constant in the temperature range of −20° C. to 100° C. On the other hand, when attention is paid to the result of Conventional Technology 2, a downward-sloping straight line represents the amount of sensor warpage, which is larger at lower temperature.

As described above, in the semiconductor package 100 shown in FIG. 4 or 5, it is possible to keep the amount of sensor warpage substantially constant with temperature change, by adjusting the physical property values of the respective components.

2. Example Simulations

In the meantime, the physical property values of the respective components designed (adjusted) in the semiconductor package 100 shown in FIG. 4 or FIG. 5 were found through specific simulations performed by the inventor (the present inventor) of the present technology. In view of this, the simulations are described below in detail, with reference to FIGS. 8A, 8B, 9, 10, 11, 12, 13, 14, 15, 16, 17, 18, and 19.

(1) First Simulation

Figure 9:
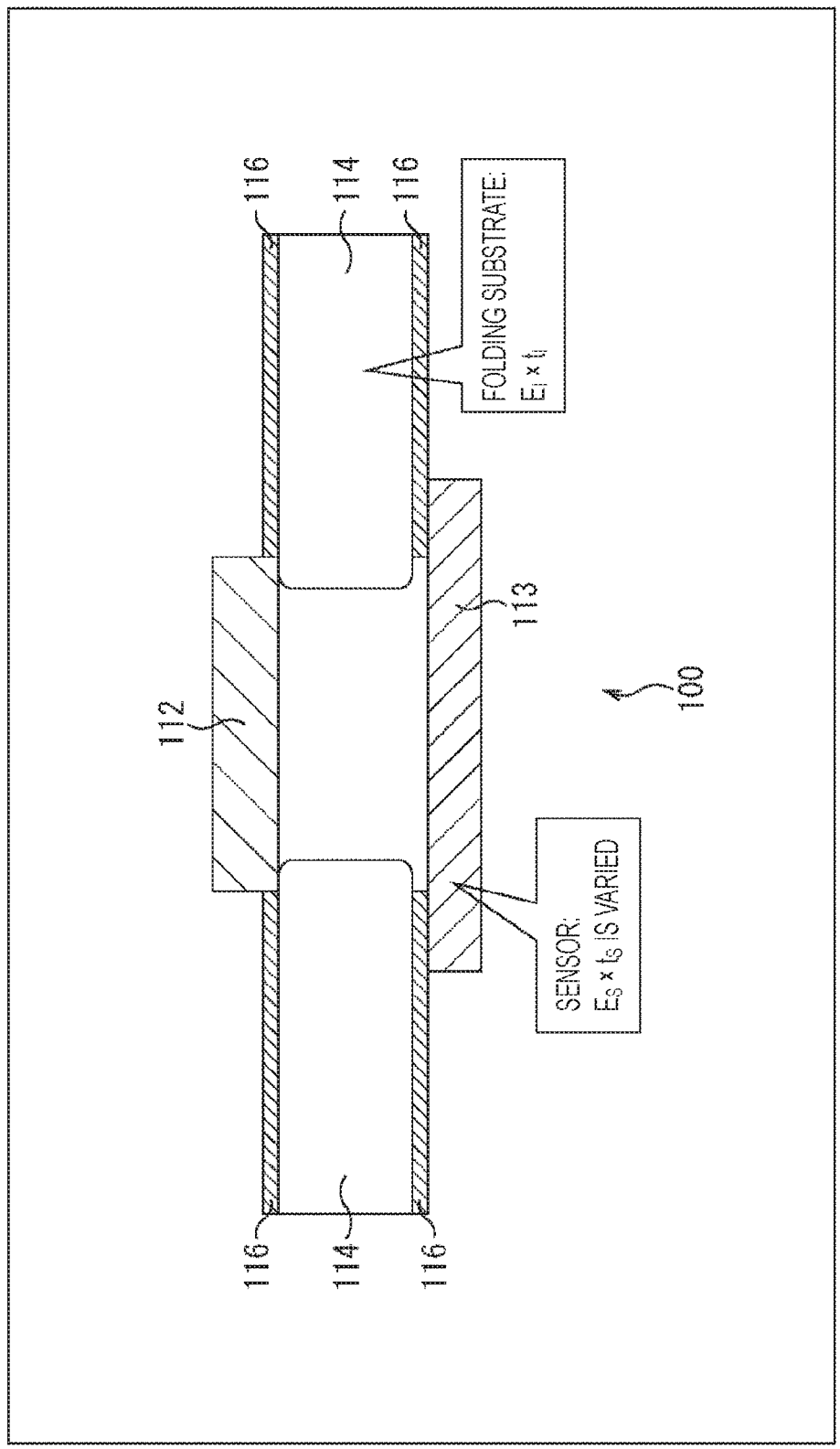
FIG. 9 is a diagram showing conditions (ES×tS, EI×tI: varied) for the first simulation.

FIGS. 8A, 8B, and 9 are diagrams showing the conditions for a first simulation.

FIG. 8A shows a structure in a case where the curvature radius of the sensor 113 held by the holding substrate 114 having an opening formed therein is designed (optically designed) to be 100 mm or smaller in the semiconductor package 100 shown in FIG. 4. That is, in the semiconductor package 100 shown in FIG. 8A, the sensor 113 is a curved sensor having a curvature radius of 100 mm or smaller.

Here, a wide-angle lens may be greatly affected by decrease in the peripheral illumination. However, as shown in FIG. 8A, it is possible to solve the problem of the decrease in the peripheral illumination, by curving the light receiving surface of the sensor 113 to form a concave surface on the side of the lens. Particularly, it is known that a greater improvement effect can be obtained by designing the curvature radius of the sensor 113 to be 100 mm or smaller as the amount of curvature.

Note that the wide-angle lens herein is a lens having a wider angle of view than a standard lens, and is an ultrawide lens whose angle of view is 120° to 180°, for example.

Meanwhile, FIG. 8B shows a structure in a case where the curvature radius of the sensor 113 held by the holding substrate 214 in the form of a flat plate is designed to be 100 mm or smaller in the semiconductor package 100 shown in FIG. 5. It is known that a greater improvement effect can also be obtained with respect to the problem of the decrease in the peripheral illumination in this case.

FIG. 9 shows the conditions for the first simulation in which $E_I \times t_I$ is varied with respect to the holding substrate 114 having an opening formed therein, and the amount of warpage of the sensor 113 is calculated at each degree of temperature when $E_S \times T_S$ is varied with respect to the sensor 113 held by the holding substrate 114, so that ($E_I \times t_I$)+($E_S \times t_S$) can be adjusted in the semiconductor package 100 shown in FIG. 4.

Note that, as described above, $E_I$ (GPa) and $t_I$ (mm) represent the Young's modulus and the thickness of the holding substrate 114, and $E_S$ (GPa) and $t_S$ (mm) represent the Young's modulus and the thickness of the sensor 113.

Figure 10:
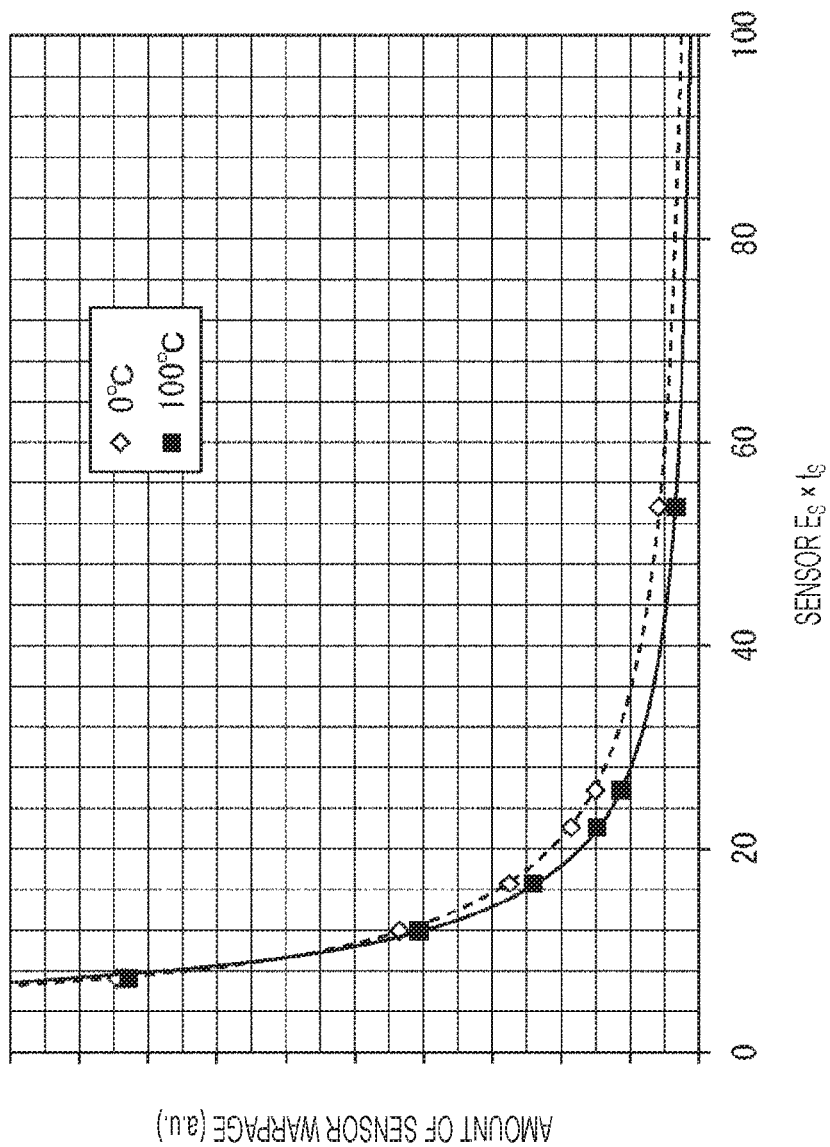
FIG. 10 is a chart showing the relationship between ES×tS and the amount of sensor warpage in a case where EI×tI=32, as a result of the first simulation.

FIG. 10 shows, as a result of the first simulation herein, the relationship between the sensor $E_S \times t_S$ and the amount of sensor warpage in a case where $E_I \times t_I$ of the holding substrate 114 (the holding substrate $E_I \times t_I$) was set at $E_I \times t_I = 32$.

Note that, in FIG. 10, the ordinate axis indicates the amount of warpage of the sensor 113 (the amount of sensor warpage), and the abscissa axis indicates $E_S \times t_S$ of the sensor 113 (the sensor $E_S \times t_S$). FIG. 10 also shows the result of a case where the temperature is 0° C., and the result of a case where the temperature is 100° C.

In FIG. 10, with attention being paid to the result of the case where the temperature is 0° C., the smaller the value of the sensor $E_S \times t_S$, the larger the value of the amount of sensor warpage, while the larger the value of the sensor $E_S \times t_S$, the smaller the value of the amount of sensor warpage. Further, in FIG. 10, with attention being paid to the result of the case where the temperature is 100° C., the value of the amount of sensor warpage is slightly smaller than the result of the case where the temperature is 0° C., but the amount of sensor warpage becomes smaller as the value of the sensor $E_S \times t_S$ becomes larger. That is, in a case where the value of the sensor $E_S \times t_S$ is varied while $E_I \times t_I = 32$, the difference between the amounts of sensor warpage at 0° C. and 100° C. is not very large.

For example, in FIG. 10, while the region where the value of the sensor ES×tS is small corresponds to the structures of the semiconductor packages 100 (the structures with the curved sensor 113) shown in FIG. 8A and FIG. 8B, the region where the value of ESxtS is large corresponds to the structure of the semiconductor package 100 shown in FIG. 9 (the structure with the flat sensor 113).

Further, as shown in FIG. 10, in a case where the value of the holding substrate $E_I \times t_I$ is a relatively large value such as $E_I \times t_I = 32$, the amount of temperature-dependent change in warpage caused by change in temperature such as 0° C. and 100° C. can be made small even when the value of the sensor $E_S \times t_S$ is small.

Figure 11:
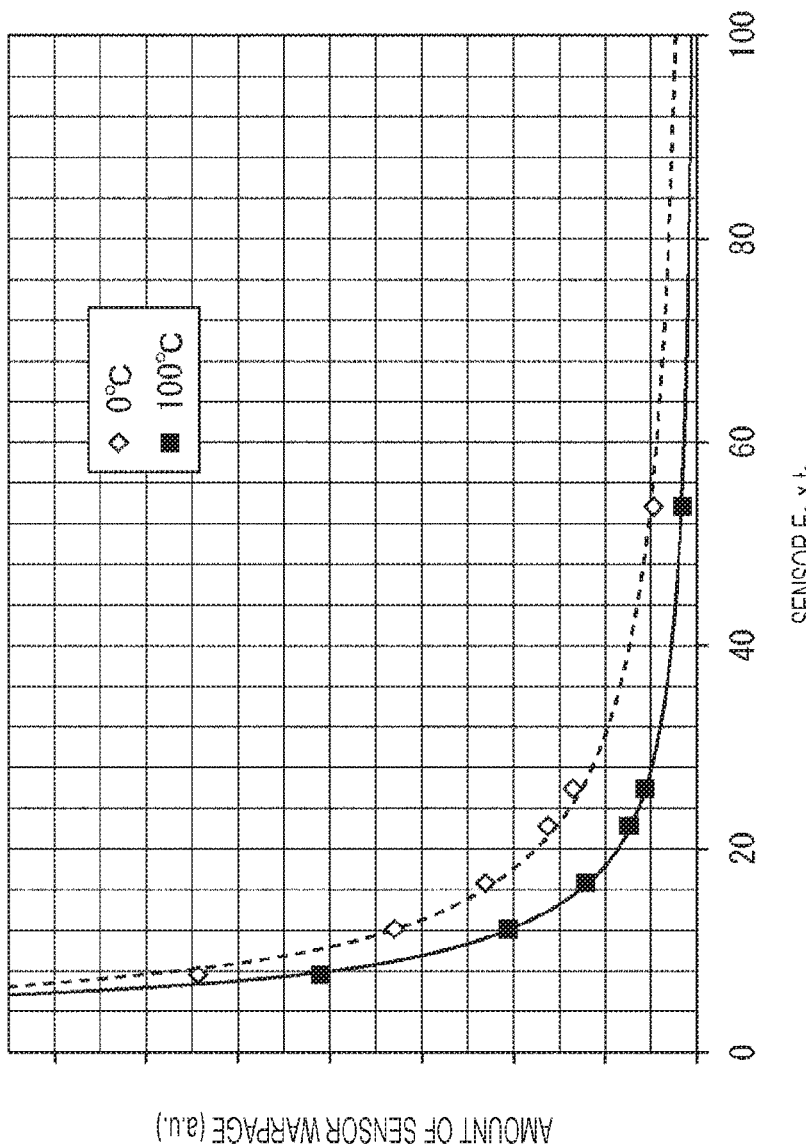
FIG. 11 is a chart showing the relationship between ES×tS and the amount of sensor warpage in a case where EI×tI=8, as a result of the first simulation.

Further, FIG. 11 shows, as a result of the first simulation, the relationship between $E_S \times t_S$ and the amount of sensor warpage in a case where the holding substrate $E_I \times t_I$ was set at $E_I \times t_I = 8$. Note that, in FIG. 11, the types of ordinate and abscissa axes and the graph are similar to those in FIG. 10.

In FIG. 11, with attention being paid to the result of the case where the temperature is 0° C., a curved line in a shape similar to that in the result of the case where the holding substrate $E_I \times t_I = 32$, and the temperature was 0° C. as shown in FIG. 10 is obtained, and the amount of sensor warpage becomes smaller as the value of the sensor $E_S \times t_S$ becomes larger. Further, in FIG. 11, with attention being paid to the result of the case where the temperature is 100° C., a curved line that is steeper than that in the result of the case where the holding substrate $E_I \times t_I = 32$, and the temperature was 100° C. as shown in FIG. 10 is obtained, and the amount of sensor warpage becomes smaller as the value of the sensor $E_S \times t_S$ becomes larger. That is, in a case where the value of the sensor $E_S \times t_S$ is varied while $E_I \times t_I = 8$, there is a certain difference between the amounts of sensor warpage at 0° C. and 100° C.

For example, in FIG. 11, while the region where the value of the sensor ESxtS is small corresponds to the structures of the semiconductor packages 100 (the structures with the curved sensor 113) shown in FIG. 8A and FIG. 8B, the region where the value of ESxtS is large also corresponds to the structure of the semiconductor package 100 shown in FIG. 9 (the structure with the flat sensor 113).

Further, as shown in FIG. 11, in a case where the value of the holding substrate $E_I \times t_I$ is a relatively small value such as $E_I \times t_I = 8$, the amount of temperature-dependent change in warpage caused by change in temperature such as 0° C. and 100° C. cannot be made small, unless the value of the sensor $E_S \times t_S$ is adjusted to a large value.

As described above, even when the value of $E_S \times t_S$ of the sensor 113 is small, the amount of temperature-dependent change in warpage is small, as long as the value of $E_I \times t_I$ of the holding substrate 114 is large. Even when the value of $E_I \times t_I$ of the holding substrate 114 is small, the amount of temperature-dependent change in warpage is also small, as long as the value of $E_S \times t_S$ of the sensor 113 is large. Further, in a case where the $E_I \times t_I$ of the holding substrate 114 is varied, there is a relationship similar to the above. That is, when the sum of the rigidity of the sensor 113 and the rigidity of the holding substrate 114 is large, the stability of the amount of temperature-dependent change in warpage of the sensor 113 can be maintained. In other words, the sensor $E_S \times t_S$ and/or the holding substrate $E_I \times t_I$ needs to have a large value.

Note that, on the basis of the tendency shown by the results of the first simulation shown in FIG. 10, the amount of temperature-dependent change in warpage can be made small, as long as the holding substrate $E_I \times t_I$ is large, even in the region where the sensor $E_S \times t_S$ is particularly small (where the amount of warpage is 100 mm or smaller in curvature radius).

The inventor then analyzed the results of the first simulation, to discover that the stability of the amount of temperature-dependent change in warpage of the sensor 113 is maintained when the relationship shown in the expression (1) below is satisfied, where $E_S$ (GPa) represents the Young's modulus of the sensor 113, $t_S$ (mm) represents the thickness of the sensor 113, $E_I$ (GPa) represents the Young's modulus of the holding substrate 114, and $T_I$ (mm) represents the thickness of the holding substrate 114.

$$(E_I \times t_I) + (E_S \times t_S) > 30 \qquad (1)$$

Note that, in the relationship shown in the expression (1), as described later with reference to FIG. 43, the sensor $E_S \times t_S$ is designed to satisfy the relationship, $E_S \times t_S < 10$, so that the sensor 113 can be curved to match the curvature of field, and be mounted on the holding substrate 114.

As described above, the results of the first simulation show that the physical property values of the sensor 113 and the holding substrate 114 are designed (adjusted) to satisfy the relationship, $(E_I \times t_I) + (E_S \times t_S) > 30$, which is shown in the expression (1), where $E_S$ (GPa) and $t_S$ (mm) represent the Young's modulus and the thickness of the sensor 113, and $E_I$ (GPa) and $t_I$ (mm) represent the Young's modulus and the thickness of the holding substrate 114 in the semiconductor package 100. In this manner, the stability of the amount of temperature-dependent change in warpage of the sensor 113 is maintained. Note that, in the first simulation, the linear expansion coefficient ($CTE_I$) of the holding substrate 114 is set at about 3 ppm/K ($CTE_I = 3$ ppm/K).

(2) Second Simulation

Figure 12:
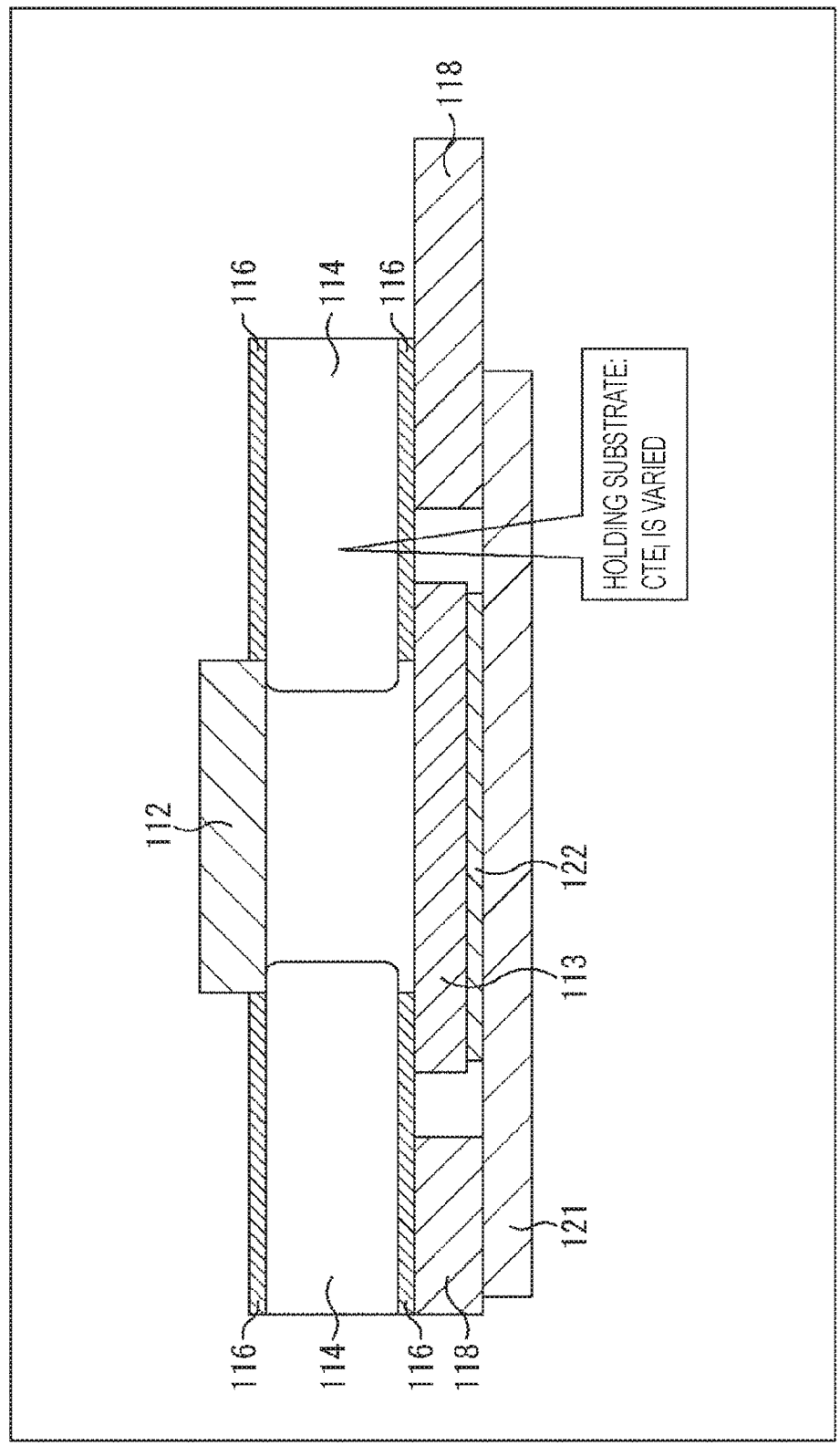
FIG. 12 is a diagram showing a condition (CTEI: varied) for a second simulation.

FIG. 12 is a diagram showing the conditions for a second simulation.

FIG. 12 shows the conditions for the second simulation in which, for the holding substrate 114 that holds the sensor 113 in the semiconductor package 100 shown in FIG. 4, the amount of warpage of the sensor 113 is measured at each degree of temperature when the linear expansion coefficient ($CTE_I$) of the holding substrate 114 is varied, so that the linear expansion coefficient ($CTE_I$) of the holding substrate 114 can be adjusted.

Figure 13:
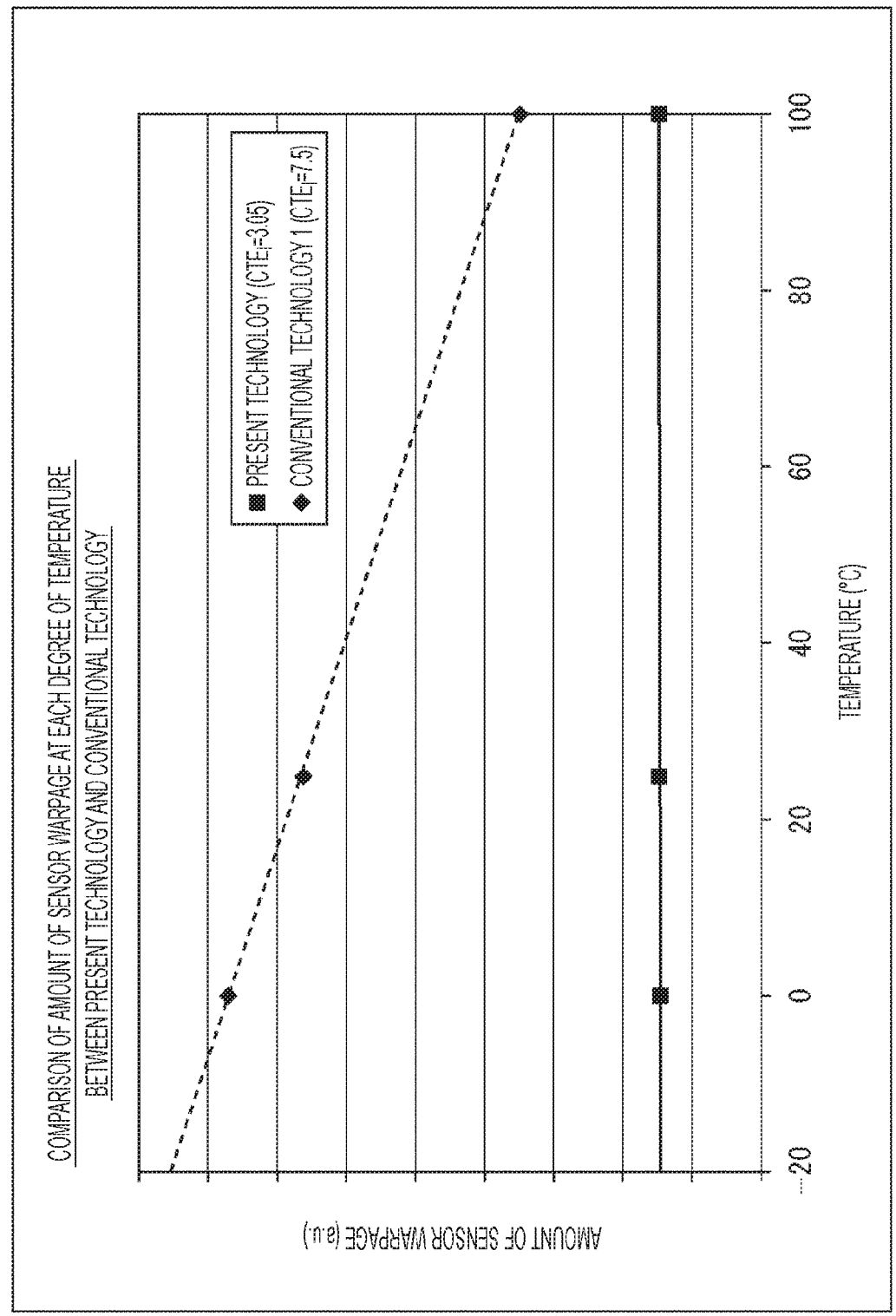
FIG. 13 is a chart showing a comparison of the amount of sensor warpage at each degree of temperature between the present technology (CTEI=3.05) and a conventional technology (CTEI=7.5), as a result of the second simulation.

Here, in FIG. 13, comparisons of the amount of sensor warpage at the respective degrees of temperature between the present technology and a conventional technology are shown as the results of the second simulation.

Note that, in FIG. 13, the ordinate axis indicates the amount of sensor warpage, and the abscissa axis indicates temperature (° C.). FIG. 13 also shows the result of the present technology and the result of the conventional technology.

That is, the result of the present technology shows the relationship between temperature and the amount of sensor warpage in a case where the value of the linear expansion coefficient ($CTE_I$) of the holding substrate 114 is set at 3.05 ppm/K ($CTE_I = 3.05$ ppm/K) in the semiconductor package 100 shown in FIG. 12 (FIG. 4). On the other hand, the result of the conventional technology shows the relationship between temperature and the amount of sensor warpage in a case where the value of the linear expansion coefficient ($CTE_I$) of the holding substrate is set at 7.5 ppm/K ($CTE_I = 7.5$ ppm/K) in the solid-state imaging device (a semiconductor device) of Conventional Technology 1.

In FIG. 13, with attention being paid to the result of the present technology, the value of the amount of sensor warpage is substantially constant in the temperature range of −20° C. to 100° C. On the other hand, when attention is paid to the result of the conventional technology, a downward-sloping straight line represents the amount of sensor warpage, which is larger at lower temperature.

As described above, in a case where the linear expansion coefficient ($CTE_f$) of the holding substrate 114 is varied and set at 3.05 ppm/K ($CTE_f$=3.05 ppm/K), for example, the amount of warpage of the sensor 113 can be made substantially constant with temperature.

The inventor then analyzed the results of the second simulation, to discover that the amount of warpage of the sensor 113 hardly changes with temperature when the relationship shown in the expression (2) below is satisfied, where $CTE_I$ (ppm/K) represents the linear expansion coefficient of the holding substrate 114.

$$1.5 < CTE_f < 4.5 \tag{2}$$

As described above, the results obtained in the second simulation show that the physical property value of the holding substrate 114 is designed (adjusted) to satisfy the relationship, $1.5 < CTE_f < 4.5$, which is shown in the expression (2), where $CTE_I$ (ppm/K) represents the linear expansion coefficient of the holding substrate 114 in the semiconductor package 100, and thus, the stability of the amount of temperature-dependent change in warpage of the sensor 113 is maintained.

(5) Third Simulation

Figure 14:
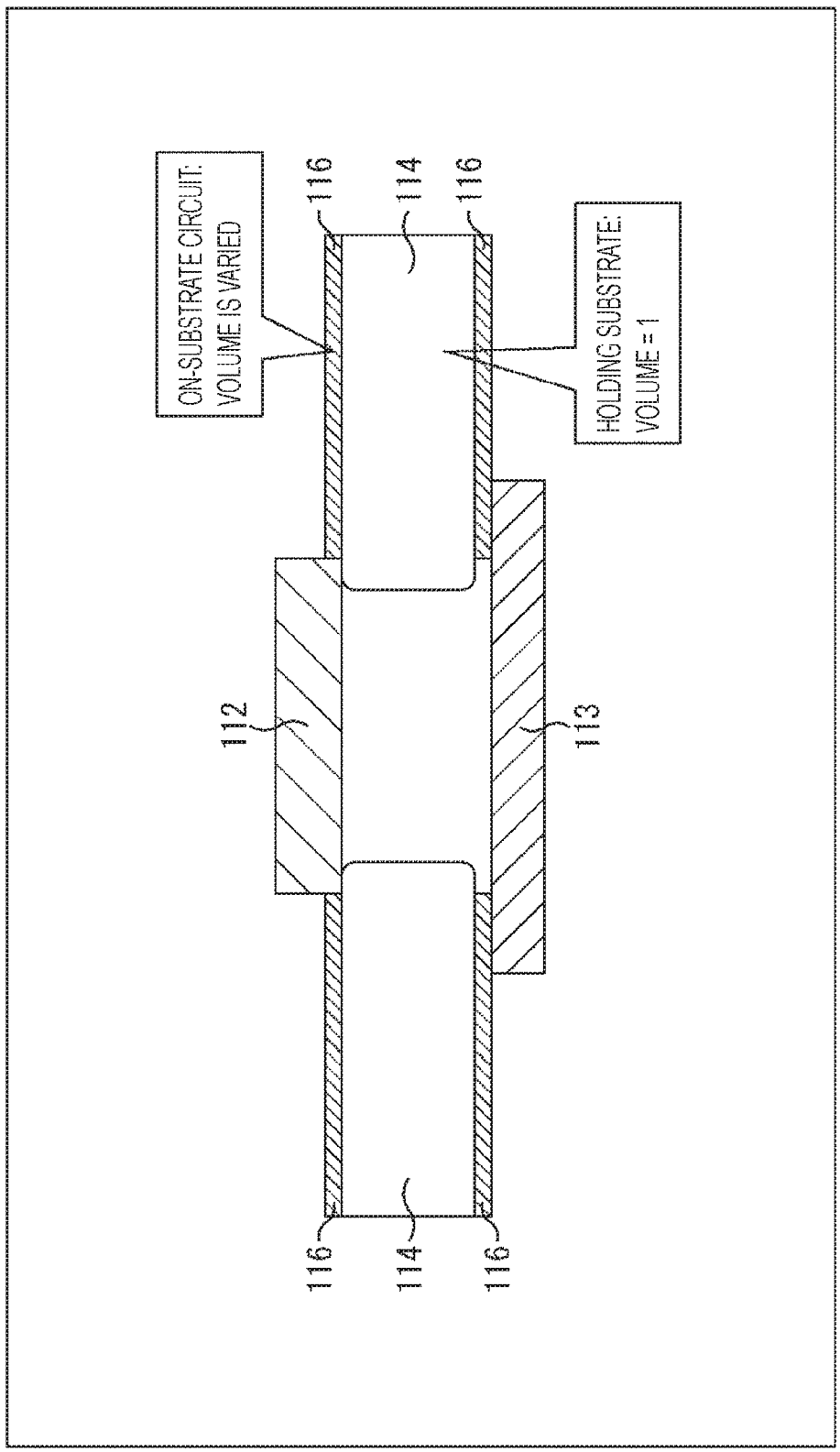
FIG. 14 is a diagram showing a condition (the circuit volume: varied) for a third simulation.

FIG. 14 is a diagram showing the conditions for a third simulation.

FIG. 14 shows the conditions for the third simulation in which the amount of warpage of the sensor 113 is measured when the volume of the wiring members constituting the on-substrate circuits 116 formed on the upper surface (the surface on the light entering side) and the lower surface (the surface on the opposite side from the light entering side) of the holding substrate 114 that holds the sensor 113 is varied in the semiconductor package 100 shown in FIG. 4. This enables adjustment of the volume of the wiring members constituting the on-substrate circuits 116, relative to the volume of the holding substrate 114.

Note that, in this simulation, the ratio of the volume of the wiring members constituting the on-substrate circuits 116 to the volume of the holding substrate 114 is varied, where the volume of the holding substrate 114=1.

Figure 15:
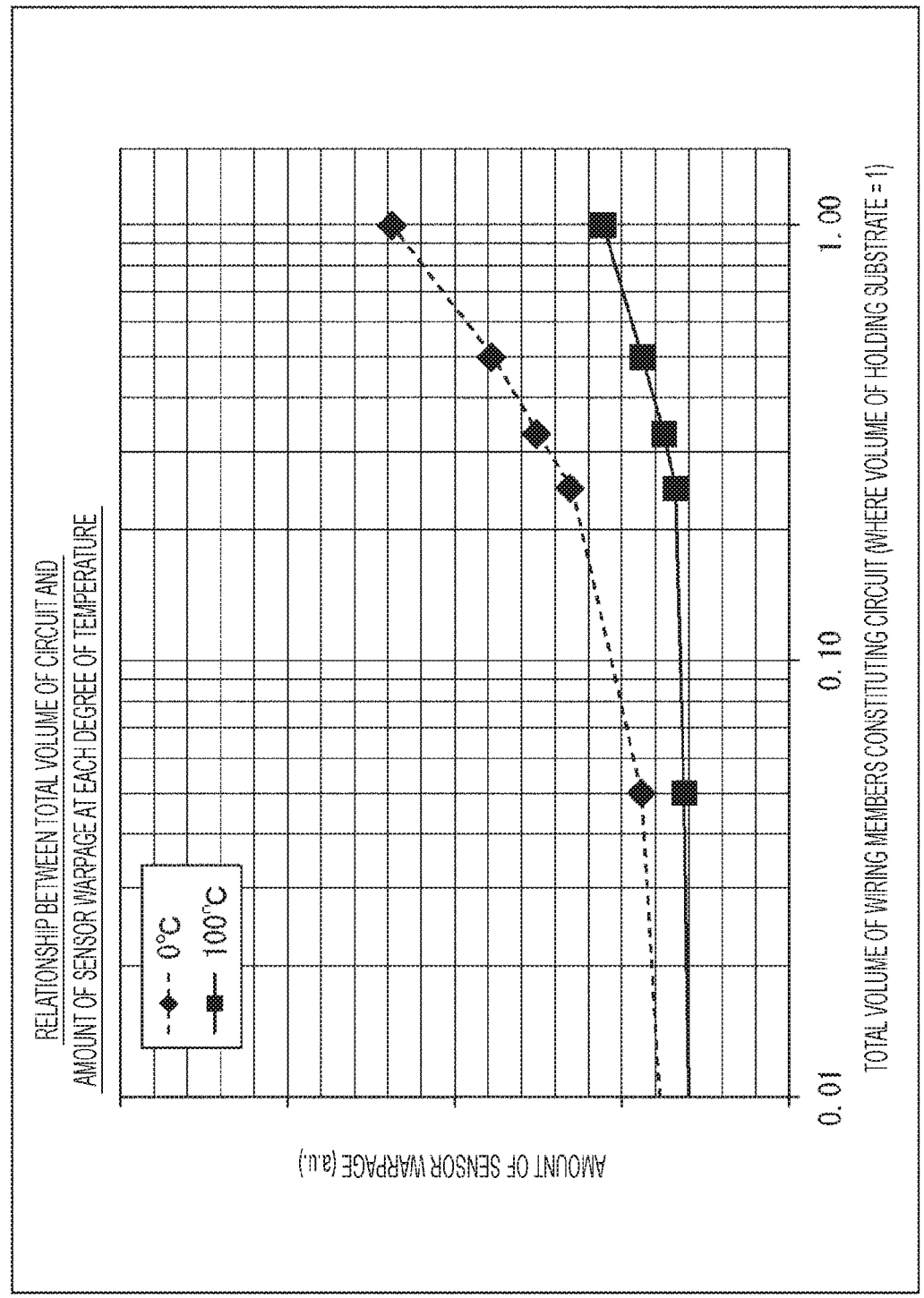
FIG. 15 is a chart showing the relationship between the total volume of the circuits and the amount of sensor warpage at each degree of temperature, as a result of the third simulation.

Here, in FIG. 15, the relationship between the total volume of the wiring members constituting the circuits and the amount of sensor warpage at the respective degrees of temperature is shown as the results of the third simulation.

Note that, in FIG. 15, the ordinate axis indicates the amount of warpage of the sensor 113 (the amount of sensor warpage), and the abscissa axis indicates the total volume of the wiring members constituting the circuits. The total volume of the circuits is expressed by the ratio of the volume of the wiring members constituting the on-substrate circuits 116 to the volume of the holding substrate 114, where the volume of the holding substrate 114=1. FIG. 15 also shows the result of a case where the temperature is 0° C., and the result of a case where the temperature is 100° C.

In FIG. 15, with attention being paid to the result of the case where the temperature is 0° C., the value of the amount of sensor warpage becomes larger, as the ratio of the total volume of the wiring members constituting the circuits (the volume of the wiring members constituting the on-substrate circuits 116 to the volume of the holding substrate 114) becomes higher. On the other hand, the value of the amount of sensor warpage becomes smaller, as the ratio of the total volume of the wiring members constituting the circuits (the volume of the wiring members constituting the on-substrate circuits 116 to the volume of the holding substrate 114) becomes lower. When the ratio reaches a certain value, the value of the amount of sensor warpage becomes substantially constant.

Further, in FIG. 15, with attention being paid to the result of the case where the temperature is 100° C., the overall value of the amount of sensor warpage is smaller than that in the case where the temperature is 0° C. However, the value of the amount of sensor warpage becomes smaller, as the ratio of the total volume of the wiring members constituting the circuits (the volume of the wiring members constituting the on-substrate circuits 116 to the volume of the holding substrate 114) becomes lower. When the ratio reaches a certain value, the value of the amount of sensor warpage becomes substantially constant.

As described above, in a case where the ratio of the volume of the wiring members constituting the on-substrate circuits 116 to the volume of the holding substrate 114 is varied, the amount of sensor warpage becomes smaller as the ratio becomes lower, and thus, the amount of warpage of the sensor 113 can be made substantially constant.

The inventor then analyzed the results of the third simulation, to discover that the amount of warpage of the sensor 113 can be greatly reduced with respect to temperature change, when the relationship shown in the expression (3) below is satisfied.

$$\text{The volume of the wiring members constituting the on-substrate circuits 116} \leq \text{the volume of the holding substrate 114} \times \frac{1}{10} \tag{3}$$

Note that, in the relationship shown in the expression (3), the volume of the wiring members constituting the on-substrate circuits 116 indicates the total volume of the on-substrate circuits 116 as the conductive wiring members (excluding the lead-out circuits 118) provided on the upper surface and the lower surface of the holding substrate 114. Further, in the on-substrate circuits 116, a structure in which wiring members (a metal such as copper (Cu), for example) and insulating members (resin such as polyimide, for example) are alternatively stacked can be adopted as the circuits As described above, the results obtained in the third simulation show that the physical property value of the on-substrate circuits 116 is designed (adjusted) to satisfy the relationship, the volume of the wiring members constituting the on-substrate circuits 116 ≤ the volume of the holding substrate 114×1/10, which is shown in the expression (3). Thus, the stability of the amount of temperature-dependent change in warpage of the sensor 113 is maintained.

(6) Fourth Simulation

Figure 16:
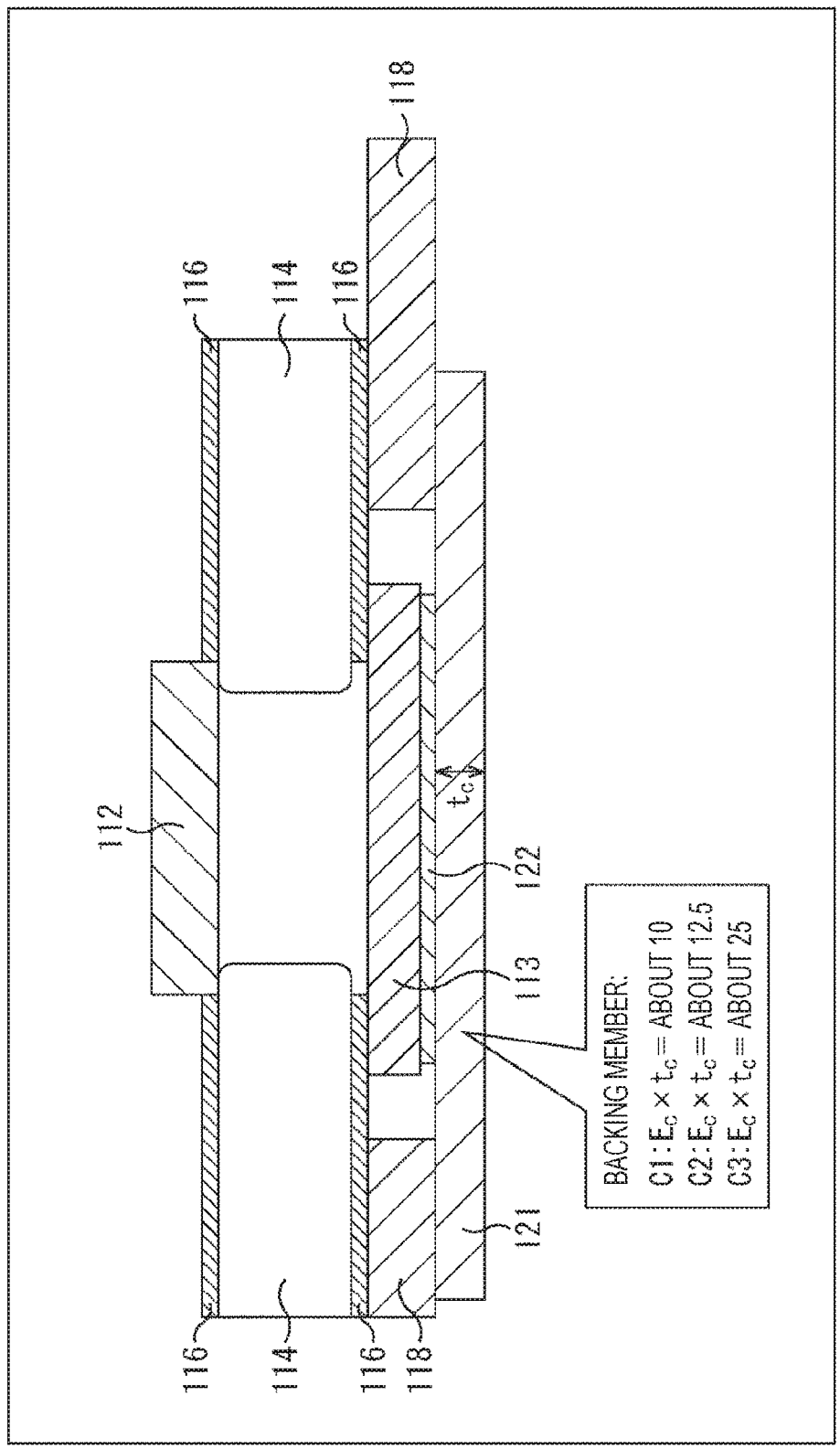
FIG. 16 is a diagram showing conditions (EC×tC=about 10, about 12.5, and about 25) for a fourth simulation.

FIG. 16 is a diagram showing the conditions for a fourth simulation.

FIG. 16 shows the conditions for the fourth simulation in which, when $E_C \times t_C$ of the backing member 121 that backs the sensor 113 is varied in the semiconductor package 100 shown in FIG. 4, the amount of warpage of the sensor 113 is measured at each degree of temperature, so that $E_C \times t_C$ can be adjusted.

Note that, as described above, $E_C$ (GPa) and $t_C$ (mm) represent the Young's modulus and the thickness of the backing member 121. Further, in the fourth simulation, $E_C \times t_C$ of the backing member 121 is varied to $E_C \times t_C$=about 10, about 12.5, and about 25, which are conditions C1 through C3.

Figure 17:
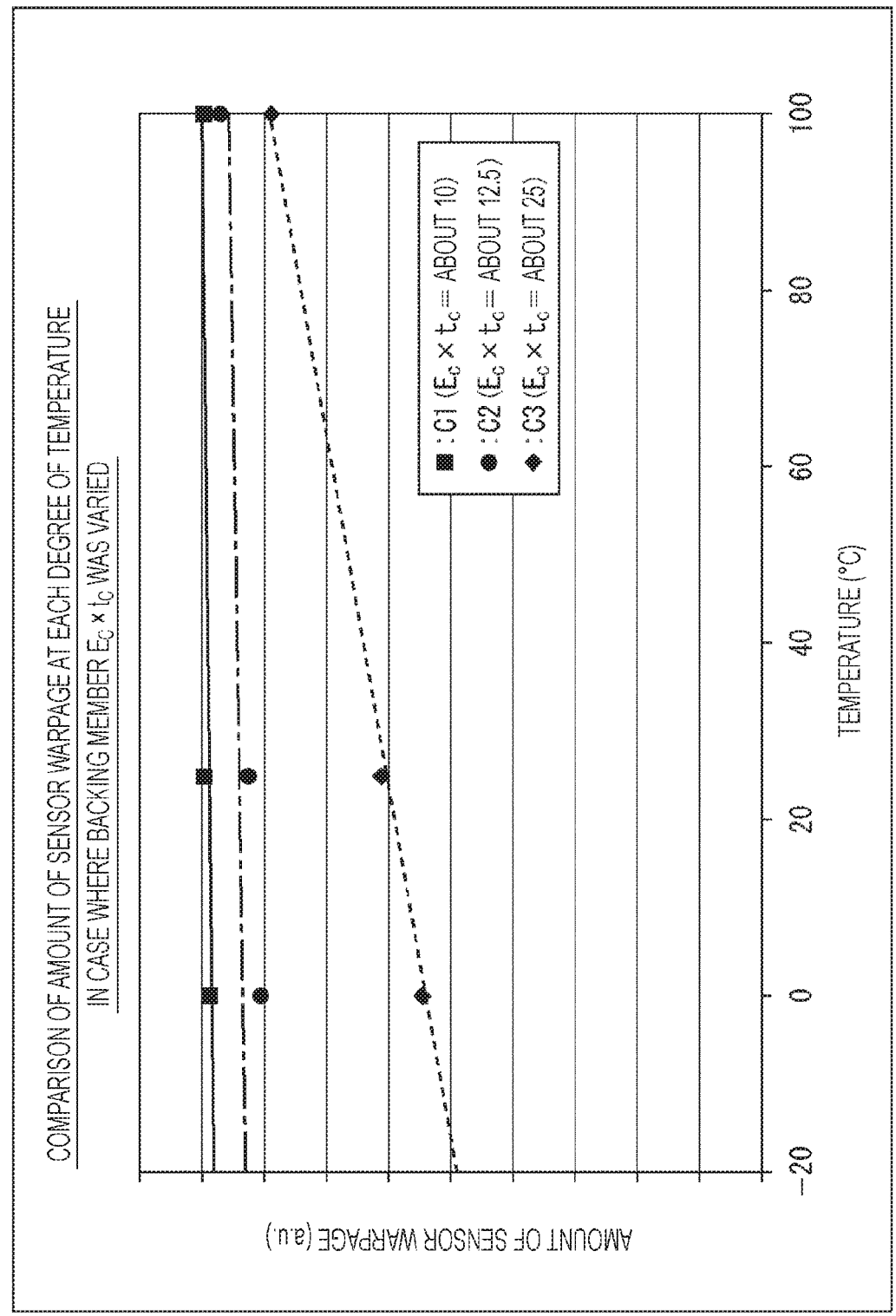
FIG. 17 is a chart showing comparisons of the amount of sensor warpage at each degree of temperature in a case where EC×tC was varied, as a result of the fourth simulation.

Here, in FIG. 17, comparisons of the amount of sensor warpage at the respective degrees of temperature in a case where $E_C \times t_C$ of the backing member 121 (the backing member $E_C \times t_C$) is varied are shown as the results of the fourth simulation.

Note that, in FIG. 17, the ordinate axis indicates the amount of warpage of the sensor 113 (the amount of sensor warpage), and the abscissa axis indicates temperature (° C.). FIG. 17 also shows the results of respective simulations in the case of the condition C1 ($E_C \times t_C$=about 10), in the case of the condition C2 ($E_C \times t_C$=about 12.5), and in the case of the condition C3 ($E_C \times t_C$=about 25).

Here, in FIG. 17, with attention being paid to the results of the simulations under the conditions C1 and C2, the value of the amount of sensor warpage is substantially constant in the temperature range of −20° C. to 100° C. Further, with attention being paid to the result of the simulation under the condition C3, a gently upward-sloping straight line is obtained, and the amount of sensor warpage is smaller at lower temperature.

Although the optimum backing member 121 differs depending on the size or the like of the sensor 113, the results obtained in the fourth simulation under the conditions C1 through C3 show that a sufficient effect to reduce warpage of the sensor 113 can be achieved in the case of the condition C1 ($E_C \times t_C$=about 10) and in the case of the condition C2 ($E_C \times t_C$=about 12.5), and a certain warpage reduction effect can be achieved in the case of the condition C3 ($E_C \times t_C$=about 25), as described above. However, in a case where $(E_I \times t_I)+(E_S \times t_S)$ is greater than the present calculation model, for example, it is assumed that $E_C \times t_C$ has a margin for adjustment up to about 40.

(7) Simulation

Figure 18:
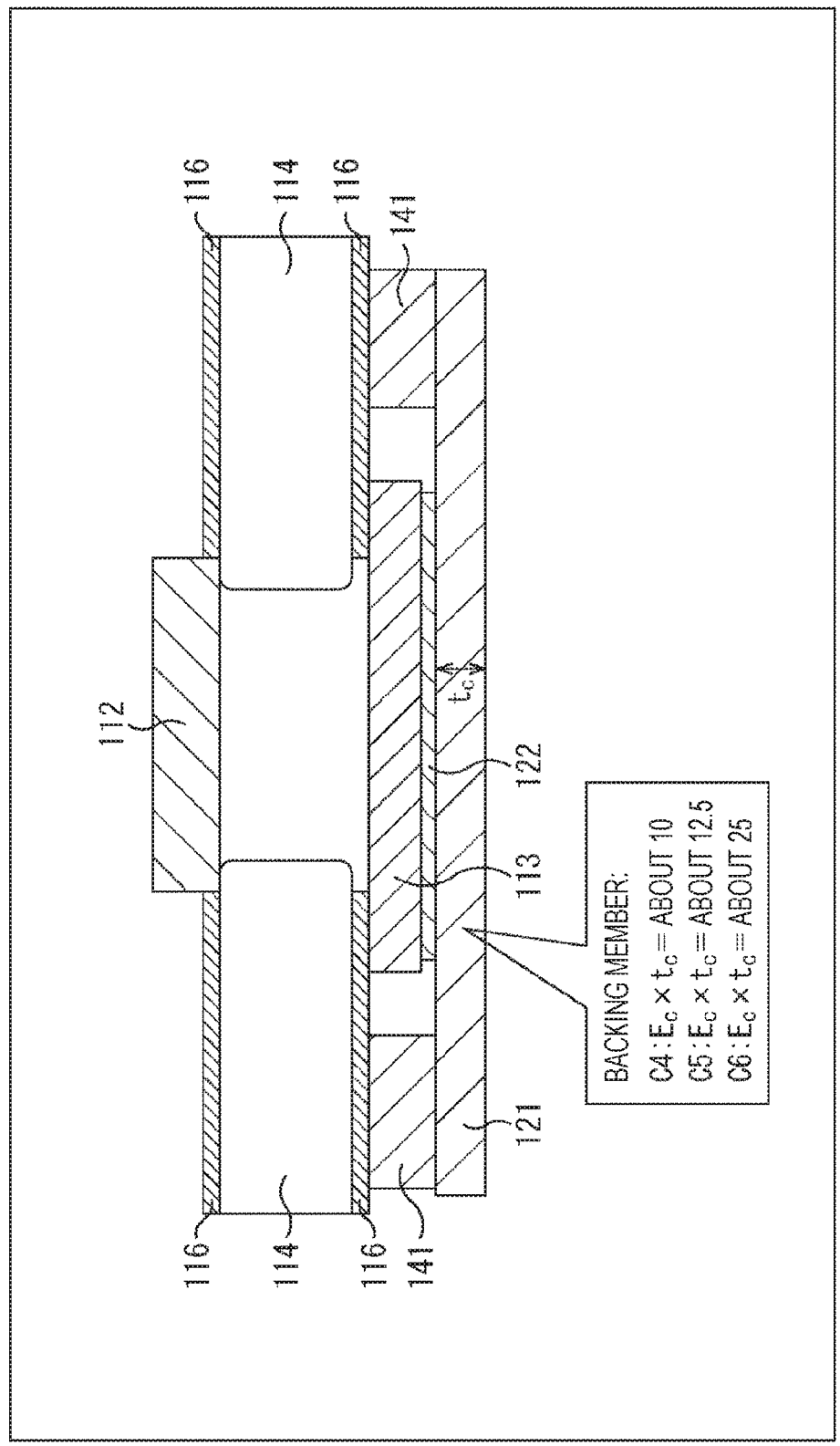
FIG. 18 is a diagram showing conditions (EC×tC=about 10, about 12.5, and about 25) for a fifth simulation.

FIG. 18 is a diagram showing the conditions for a fifth simulation.

FIG. 18 shows the conditions for the fifth simulation in which, when $E_C \times t_C$ of the backing member 121 is varied, the amount of warpage of the sensor 113 is measured at each degree of temperature, so that $E_C \times t_C$ can be adjusted, like the conditions for the fourth simulation shown in FIG. 16.

Note that, in the fifth simulation shown in FIG. 18 compared with the fourth simulation shown in FIG. 16, the lead-out circuits 118 provided on the upper surface (the surface on the light entering side) of the backing member 121 are removed, and adjustment members 141 adjusted to the height are provided in the semiconductor package 100.

Further, in the fifth simulation, $E_C \times t_C$ of the backing member 121 is varied to $E_C \times t_C$=about 10, about 12.5, and about 25, which are conditions C4 through C6. Note that, as described above, $E_C$ (GPa) and $t_C$ (mm) represent the Young's modulus and the thickness of the backing member 121.

Figure 19:
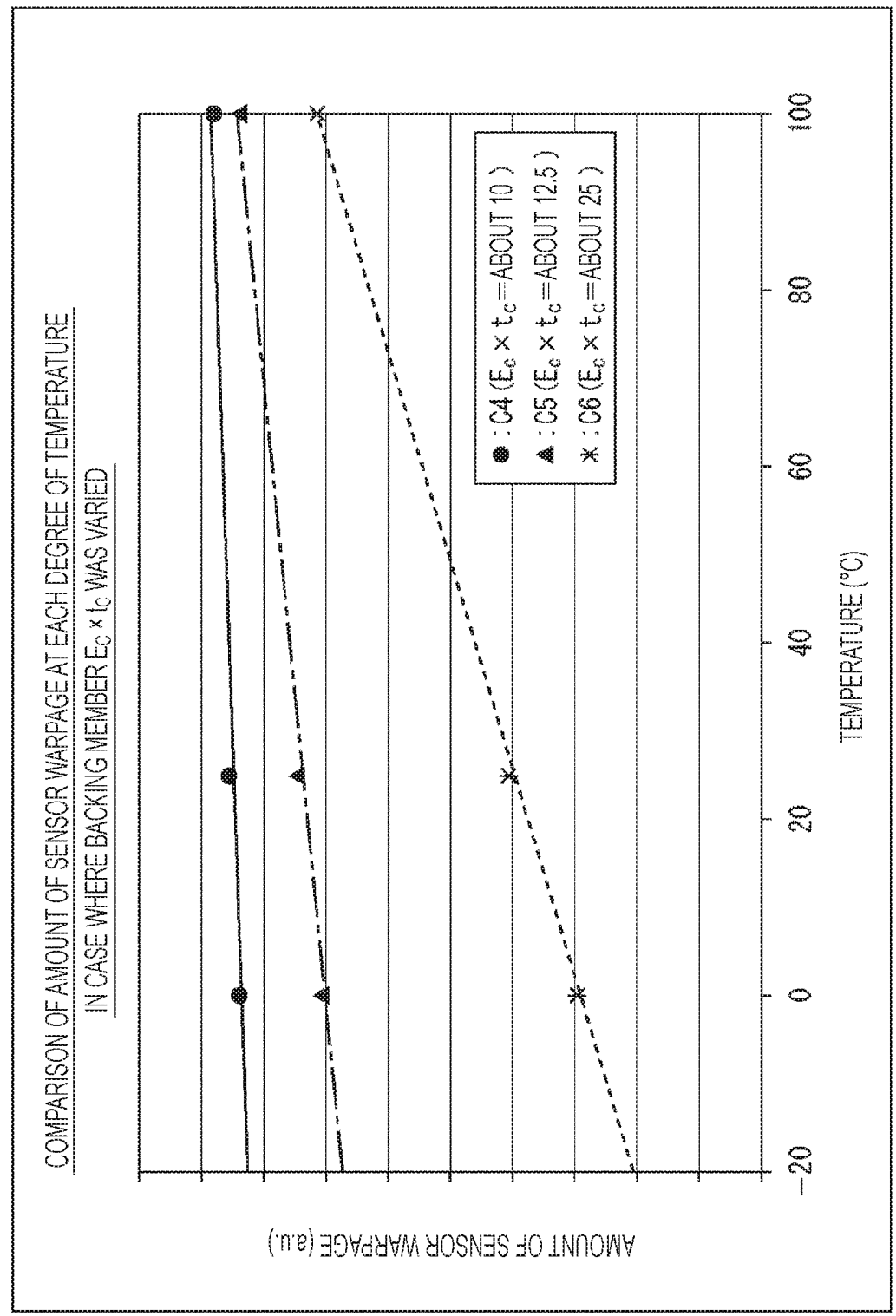
FIG. 19 is a chart showing comparisons of the amount of sensor warpage at each degree of temperature in a case where EC×tC was varied, as a result of the fifth simulation.

Here, in FIG. 19, comparisons of the amount of sensor warpage at the respective degrees of temperature in a case where $E_C \times t_C$ of the backing member 121 (the backing member $E_C \times t_C$) is varied are shown as the results of the fifth simulation.

Note that, in FIG. 19, the ordinate axis is similar to that shown in FIG. 17. FIG. 19 also shows the results of respective simulations in the case of the condition C4 ($E_C \times t_C$=about 10), in the case of the condition C5 ($E_C \times t_C$=about 12.5), and in the case of the condition C6 ($E_C \times t_C$=about 25).

Here, in FIG. 19, with attention being paid to the result of the simulation under the condition C4, the value of the amount of sensor warpage is substantially constant in the temperature range of −20° C. to 100° C. Further, with attention being paid to the results of the simulations under the conditions C5 and C6, a gently upward-sloping straight line is obtained, and the amount of sensor warpage is smaller at lower temperature.

Although the optimum backing member 121 differs depending on the size or the like of the sensor 113, the results obtained in the fifth simulation under the conditions C4 through C6 show that a sufficient effect to reduce warpage of the sensor 113 can be achieved in the case of the condition C4 ($E_C \times t_C$=about 10) and in the case of the condition C5 ($E_C \times t_C$=about 12.5), and a certain warpage reduction effect can be achieved in the case of the condition C6 ($E_C \times t_C$=about 25), as described above. However, in a case where $(E_I \times t_I)+(E_S \times t_S)$ is greater than the present calculation model, for example, it is assumed that $E_C \times t_C$ has a margin for adjustment up to about 40.

The inventor then analyzed the results of the fourth and fifth simulations, to discover that an effect to reduce warpage of the sensor 113 caused by temperature change is achieved, when the relationship shown in the expression (4) below is satisfied, where $E_C$ (GPa) represents the Young's modulus of the backing member 121, and $t_C$ (mm) represents the thickness of the backing member 121.

$$(E_C \times t_C) < 40 \tag{4}$$

As described above, the results obtained in the fourth and fifth simulations show that the physical property value of the backing member 121 is designed (adjusted) to satisfy the relationship, $(E_C \times t_C) < 40$, which is shown in the expression (4), where $E_C$ (GPa) and $t_C$ (mm) represent the Young's modulus and the thickness of the backing member 121. Thus, the stability of the amount of temperature-dependent change in warpage of the sensor 113 is maintained.

Note that, in each of the simulations described above, the structure of the semiconductor package 100 shown in FIG. 4 is mainly described. However, simulation results similar to the above can be obtained in the case of the structure of the semiconductor package 100 shown in FIG. 5.

Further, as the pixel miniaturization of the sensor 113 progresses, there is a tendency to use a lens group 111 with a small f-number to increase the light quantity of pixels 113P as described above, though not mentioned in the above simulations. In addition, in a case where the lens group 11 having a small f-number is used, the focal depth of the lens becomes smaller as shown in FIG. 2. However, to increase the light quantity of the pixels 113P in the present technology, it is preferable to use the lens group 111 including a plurality of lenses, and form an optical system in which the f-number at the time of opening of the aperture is 2.8 or smaller.

Next, the structures of semiconductor devices of the present technology that include components having physical property values obtained as a result of the respective simulations described above are described. In the description below, structures according to first through sixth embodiments capable of reducing temperature-dependent change in warpage of the sensor 113 will be described as the structures of semiconductor devices to which the present technology is applied.

3. First Embodiment

First, structures of semiconductor devices according to a first embodiment are described, with reference to FIGS. 20 through 23.

(Example of a First Structure)

Figure 20:
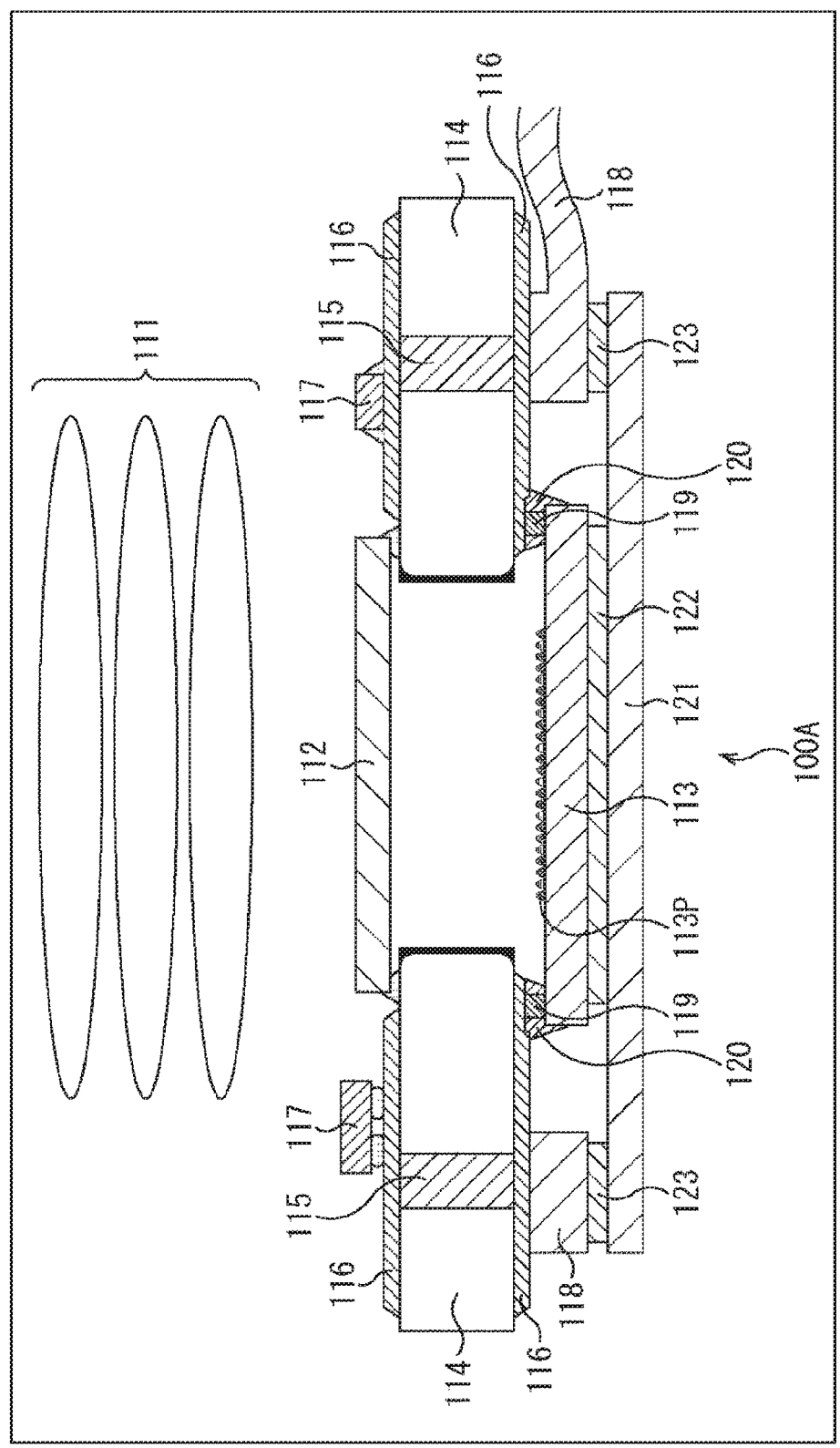
FIG. 20 is a cross-sectional view of an example of a first structure of a semiconductor device according to a first embodiment.

FIG. 20 is a cross-sectional view of an example of a first structure of a semiconductor device according to the first embodiment.

In FIG. 20, a semiconductor package 100A is a semiconductor device (an imaging device) that houses and packages a sensor 113 as a semiconductor chip, according to the present technology.

The semiconductor package 100A includes a lens group 111, a sealing member 112, the sensor 113, a holding substrate 114, through electrodes 115, on-substrate circuits 116, components 117, lead-out circuits 118, electrodes 119, an electrode protection member 120, and a backing member 121.

The lens group 111 includes a plurality of lenses. The lens group 111 causes light from an object to enter the light receiving surface of the sensor 113 via the sealing member 112 such as glass.

The sensor 113 is a solid-state imaging element (a semiconductor image sensor) such as a CCD image sensor or a CMOS image sensor. The sensor 113 photoelectrically converts light entering through the lens group 111, and outputs the resultant electrical signal.

The sensor 113 includes a pixel array unit (a pixel unit) in which a plurality of pixels 113P having photoelectric conversion elements (photodiodes, for example) is two-dimensionally arranged in a matrix fashion, and a peripheral circuit unit (a logic unit) that performs driving of the pixels 113P and the like.

For example, in a back-illuminated CMOS image sensor (BI-CIS), the pixel unit and the logic unit are separated from each other. In this description, however, the pixel unit and the logic unit that are complicated components are not explained, and only the material of the bulk portion of the sensor 113 is explained. For example, silicon (Si) is used as the material of (the bulk portion of) the sensor 113.

In this case, the linear expansion coefficient (CTE) of (the bulk portion of) the sensor 113 is about 2.8 ppm/K, for example. Meanwhile, the Young's modulus of (the bulk portion of) the sensor 113 is about 190 GPa, for example. Further, the thickness of (the bulk portion of) the sensor 113 may be any appropriate thickness such as 150 μm or 700 μm or smaller, for example.

The holding substrate 114 is a core substrate for holding the sensor 113. The holding substrate 114 has a structure as a sensor holding mode in which the peripheral portion of the sensor 113 is held by the electrodes 119 from the light receiving surface side. Further, an opening having a rectangular shape is formed in the central portion of the holding substrate 114, and light that has passed through the opening enters the sensor 113 from the light receiving surface.

The material of the holding substrate 114 may be alkali-free glass, for example. At this stage, in the holding substrate 114, the linear expansion coefficient (CTE) is about 3 ppm/K, for example, the Young's modulus is about 80 GPa, for example, and the thickness is 400 μm, in the range of 100 to 500 μm, or the like, for example. Note that these physical property values vary with glass compositions, and therefore, are used as mere reference values.

The through electrodes 115 are electrodes formed through the holding substrate 114, and are electrically connected to the on-substrate circuits 116 formed on the upper surface (the surface on the light entering side) and the lower surface (the surface on the opposite side from the light entering side) of the holding substrate 114. The material of the through electrodes 115 may be copper (Cu), for example.

The on-substrate circuits 116 are conductive wiring members, and are formed with thin-film lamination of copper (Cu) and polyimide, for example. Note that, other than polyimide, polybenzoxazole (PBC)), epoxy resin, phenol resin, or the like may be used as the insulating layer, for example. The various components 117 are provided on the on-substrate circuit 116 provided on the upper surface of the holding substrate 114.

The lead-out circuits 118 are formed with flexible printed circuits (FPC), for example, and are electrically connected to the on-substrate circuits 116 by an anisotropic conductive film (ACF), for example.

The electrodes 119 electrically connect the on-substrate circuit 116 provided on the lower surface of the holding substrate 114 to the sensor 113. The material of the electrodes 119 may be gold (Au), for example. At this stage, in the electrodes 119, the linear expansion coefficient (CTE) is about 14.2 ppm/K, for example, and the Young's modulus is about 79 GPa, for example.

Further, the electrodes 119 are protected by the electrode protection member 120. The material of the electrode protection member 120 may be a resin material, for example. At this stage, in the electrode protection member 120, the linear expansion coefficient (CTE) is about several tens to several hundreds of ppm/K, for example, and the Young's modulus is about 2 to 12 GPa, for example. Note that the Young's modulus of the electrode protection member 120 is preferably closer to the Young's modulus of the electrodes 119.

The backing member 121 is a member that backs the sensor 113. The backing member 121 is secured to the lower surface (the surface on the opposite side from the light entering side) of the sensor 113 by an adhesive 122, and is secured to the lead-out circuits 118 by an adhesive 123. As the thickness or the like of the backing member 121 is adjusted, the amount of warpage of the sensor 113 (the amount of sensor warpage) can be adjusted.

The material of the backing member 121 may be copper (Cu), for example. At this stage, in the backing member 121, the linear expansion coefficient (CTE) is about 16.8 ppm/K, for example, the Young's modulus is about 125 GPa, for example, and the thickness is 100 μm, in the range of 50 to 300 μm, or the like, for example.

Note that the material of the adhesive 122 may be a high-heat-dissipation resin material (TIM: Thermal Interface Material), for example. At this stage, in the adhesive 122, the linear expansion coefficient (CTE) is about several tens to several hundreds of ppm/K, for example, the Young's modulus is about 0.01 to 10 MPa or about 0.01 to 1 MPa, for example, and the thickness is smaller than 50 μm or the like, for example.

Further, the material of the adhesive 123 may be a resin material, for example. At this stage, in the adhesive 123, the linear expansion coefficient (CTE) is about several tens to several hundreds of ppm/K, for example, the Young's modulus is about 10 MPa, for example, and the thickness is smaller than 50 μm or the like, for example.

In the semiconductor package 100A designed as described above, the respective components are formed with materials having physical property values obtained as a result of the respective simulations described above. Thus, it is possible to reduce temperature-dependent change in warpage of the sensor 113 that is held by the holding substrate 114 and is backed by the backing member 121.

For example, in the first embodiment, the relationship shown in the above expression (2) ($CTE_I$ is about 3, for example) is satisfied. Accordingly, adjustments are made to satisfy the relationships shown in the above expressions (1), (3), and (4), so that the amount of change in warpage can be reduced. In that case, a desired amount of change in warpage might be obtained only from the relationship shown in the expression (1). If the desired amount of change in warpage cannot be obtained, adjustments should be made to satisfy the relationships shown in the expressions (3) and (4) in this order, for example.

Note that, in the semiconductor package 100A shown in FIG. 20, the physical property values of the respective materials are examples, and optimum physical property values can be used depending on the adopted structure and the like. Further, the physical property value of each member is a value at 0° C.

(Example of a Second Structure)

Figure 21:
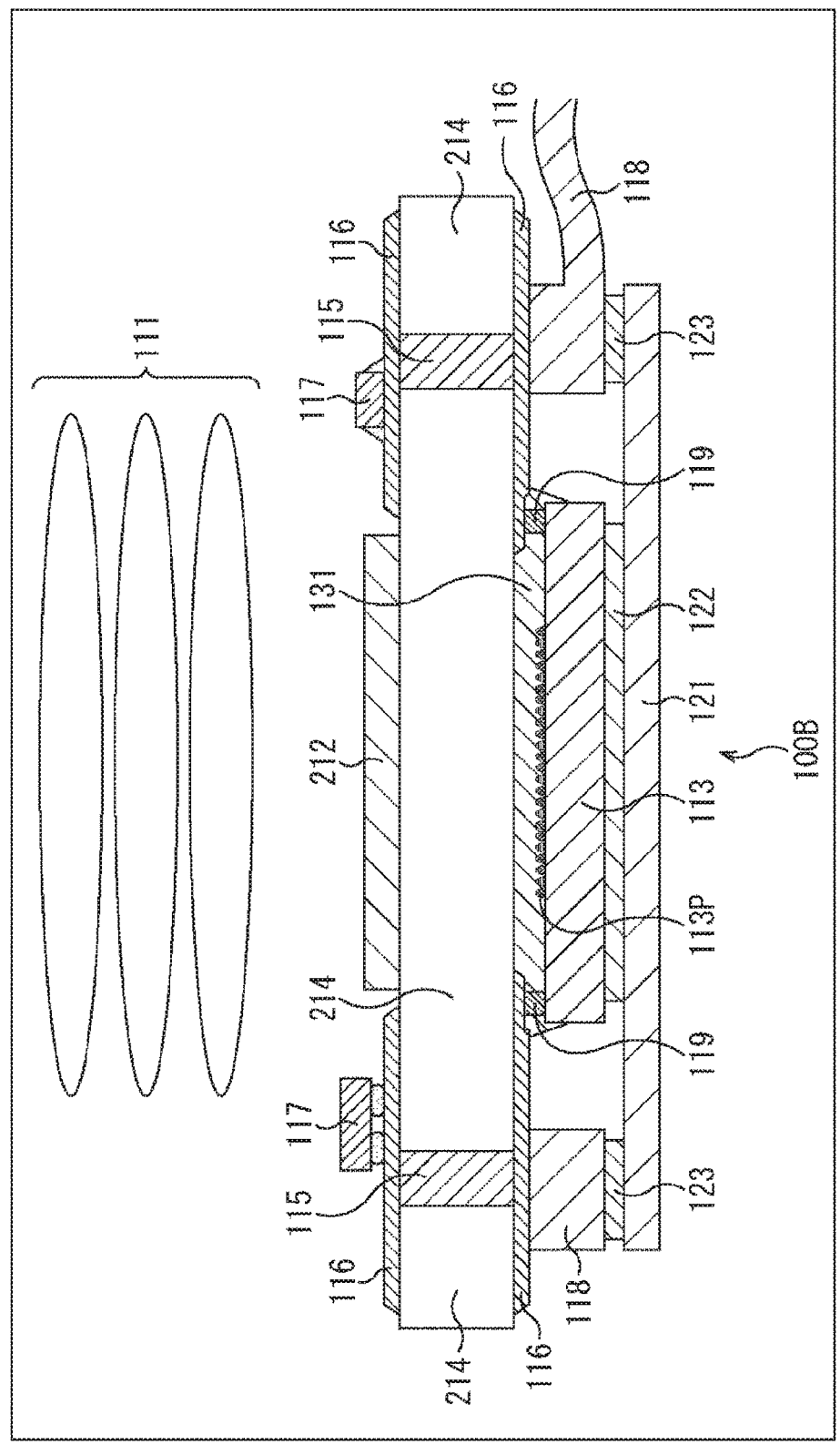
FIG. 21 is a cross-sectional view of an example of a second structure of a semiconductor device according to the first embodiment.

FIG. 21 is a cross-sectional view of an example of a second structure of a semiconductor device according to the first embodiment.

In FIG. 21, a semiconductor package 100B houses and packages the sensor 113, like the semiconductor package 100A shown in FIG. 20. However, the semiconductor package 100B shown in FIG. 21 differs from the semiconductor package 100A shown in FIG. 20 in that a filter member 212 and a holding substrate 214 are provided in place of the sealing member 112 and the holding substrate 114.

That is, in the semiconductor package 100B shown in FIG. 21, any opening is not formed in the holding substrate 214, and a pixel protection member 131 is formed between the upper surface (the surface on the light entering side) of the sensor 113 and the lower surface (the surface on the opposite side from the light entering side) of the holding substrate 214.

Like the holding substrate 114, the holding substrate 214 has a structure as a sensor holding mode in which the peripheral portion of the sensor 113 is held by the electrodes 119 from the light receiving surface side. Further, the material of the holding substrate 214 may be alkali-free glass, for example, as in the holding substrate 114. At this stage, in the holding substrate 214, the linear expansion coefficient (CTE) is about 3 ppm/K, for example, the Young's modulus is about 80 GPa, for example, and the thickness is 400 μm, in the range of 100 to 500 μm, or the like, for example.

The pixel protection member 131 is a member for protecting a plurality of pixels 113P provided on the light receiving surface of the sensor 113. The material of the pixel protection member 131 may be a resin material, for example. At this stage, in the pixel protection member 131, the linear expansion coefficient (CTE) is about several tens to several hundreds of ppm/K, for example, and the Young's modulus is about 2 to 12 GPa, for example.

Note that, in the semiconductor package 100B in FIG. 21, materials and physical property values that are similar to the materials and their physical property values described above with reference to FIG. 20 may be used as the materials to be used at the other components such as the sensor 113 and the backing member 121, and as the physical property values of those materials.

In the semiconductor package 100B designed as described above, the respective components are formed with materials having physical property values obtained as a result of the respective simulations described above (for example, on the assumption that the relationship shown in the above expression (2) is satisfied, adjustments are made to further satisfy the relationships shown in the above expressions (1), (3), and (4)). Thus, it is possible to reduce temperature-dependent change in warpage of the sensor 113 that is held by the holding substrate 214 and is backed by the backing member 121.

(Example of a Third Structure)

Figure 22:
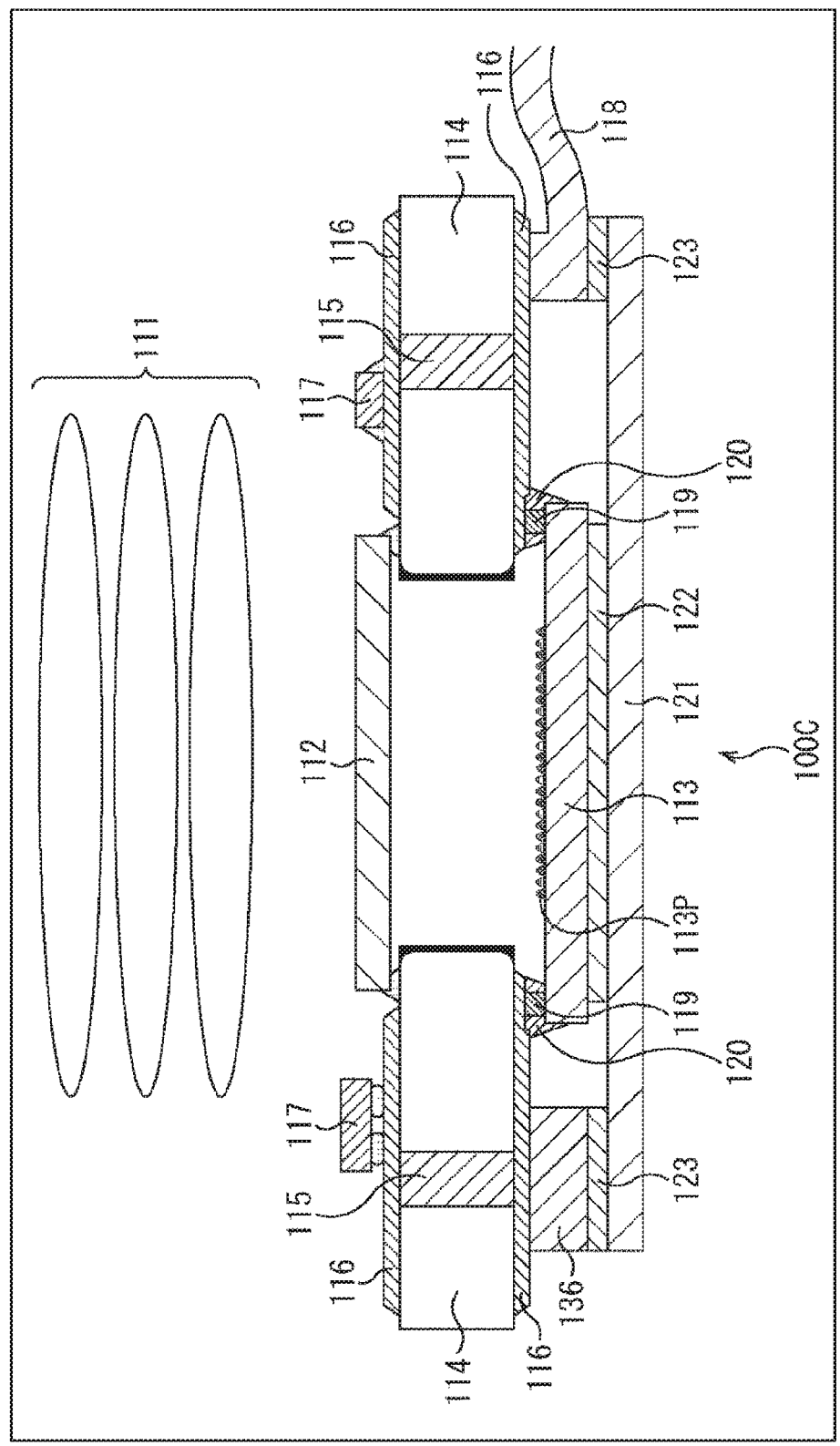
FIG. 22 is a cross-sectional view of an example of a third structure of a semiconductor device according to the first embodiment.

FIG. 22 is a cross-sectional view of an example of a third structure of a semiconductor device according to the first embodiment.

In FIG. 22, a semiconductor package 100C houses and packages the sensor 113, like the semiconductor package 100A shown in FIG. 20. However, the semiconductor package 100C in FIG. 22 differs from the semiconductor package 100A in FIG. 20 in that one of the lead-out circuits 118 (the lead-out circuit 118 on the left side in the drawing) is replaced with an adjustment member 136 having its height adjusted.

The material of the adjustment member 136 may be a resin material, for example. At this stage, in the adjustment member 136, the linear expansion coefficient (CTE) is about several tens of ppm/K, for example, and the Young's modulus is about 10 GPa, for example.

In the semiconductor package 100C in FIG. 22, materials and physical property values that are similar to the materials and their physical property values described above with reference to FIG. 20 may be used as the materials to be used at the other components such as the sensor 113, the holding substrate 114, and the backing member 121, and as the physical property values of those materials.

In the semiconductor package 100C designed as described above, the respective components are formed with materials having physical property values obtained as a result of the respective simulations described above (for example, on the assumption that the relationship shown in the above expression (2) is satisfied, adjustments are made to further satisfy the relationships shown in the above expressions (1), (3), and (4)). Thus, it is possible to reduce temperature-dependent change in warpage of the sensor 113.

(Example of a Fourth Structure)

Figure 23:
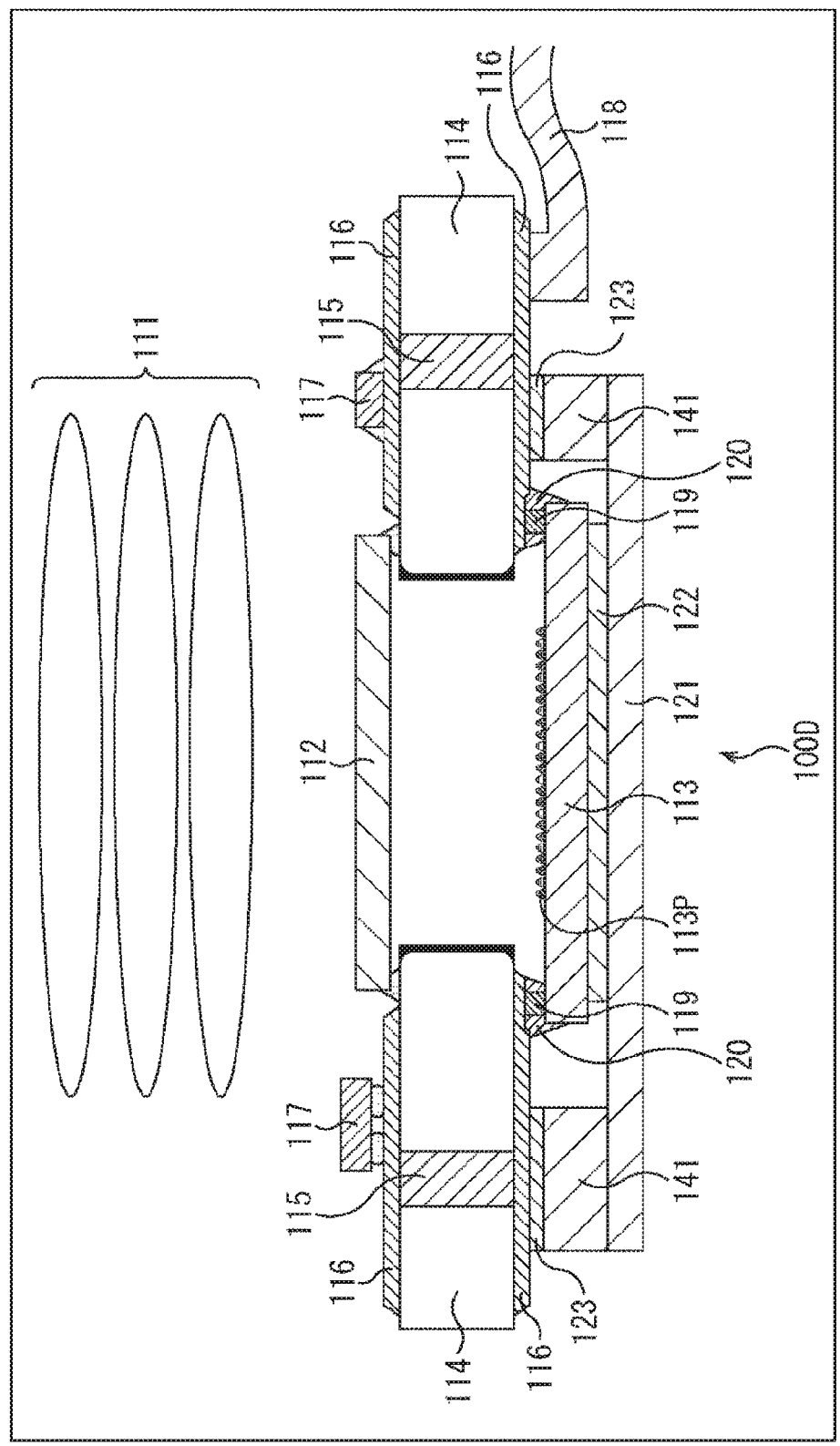
FIG. 23 is a cross-sectional view of an example of a fourth structure of a semiconductor device according to the first embodiment.

FIG. 23 is a cross-sectional view of an example of a fourth structure of a semiconductor device according to the first embodiment.

In FIG. 23, a semiconductor package 100D houses and packages the sensor 113, like the semiconductor package 100A shown in FIG. 20. However, the semiconductor package 100D in FIG. 23 differs from the semiconductor package 100A in FIG. 20 in that the lead-out circuits 118 on the right side and the left side in the drawing are replaced with adjustment members 141 each having its height adjusted.

The adjusting members 141 are formed integrally with the backing member 121, and copper (Cu), for example, may be used as the material of the adjustment members 141. At this stage, in the backing member 121 formed integrally with the adjustment members 141, the linear expansion coefficient (CTE) is about 16.8 ppm/K, for example, the Young's modulus is about 125 GPa, for example, and the thickness is 100 μm, in the range of 50 to 300 μm, or the like, for example.

Note that, in the semiconductor package 100D, the lead-out circuits 118 are disposed at appropriate positions on the lower surface of the holding substrate 114, and are electrically connected to the on-substrate circuits 116. Further, in the semiconductor package 100D in FIG. 22, materials and physical property values that are similar to the materials and their physical property values described above with reference to FIG. 20 may be used as the materials to be used at the other components such as the sensor 113, the holding substrate 114, and the backing member 121, and as the physical property values of those materials.

In the semiconductor package 100D designed as described above, the respective components are formed with materials having physical property values obtained as a result of the respective simulations described above (for example, on the assumption that the relationship shown in the above expression (2) is satisfied, adjustments are made to further satisfy the relationships shown in the above expressions (1), (3), and (4)). Thus, it is possible to reduce temperature-dependent change in warpage of the sensor 113.

The above are the structures of semiconductor devices according to the first embodiment.

4. Second Embodiment

Next, the structure of a semiconductor device according to a second embodiment is described. Note that the cross-section structure of a semiconductor device according to the second embodiment is similar to the cross-section structure of a semiconductor device according to the first embodiment described above, and therefore, is not shown in the drawings.

In a semiconductor device according to the second embodiment, in a case where a structure in which the peripheral portion of the sensor 113 is held by the electrodes 119 as substrate electrodes from the light receiving surface side is adopted as a mode for holding the sensor 113, the electrodes 119 are protected by a filler-containing resin material or the like having a Young's modulus of 4 GPa or higher. As the electrodes 119 are protected in this manner, the force for keeping the sensor 113 to the substrate can be secondarily increased, and thus, a higher thermal stability can be achieved for warpage of the sensor 113.

That is, in the semiconductor package 100A in FIG. 20, the semiconductor package 100C in FIG. 22, and the semiconductor package 100D in FIG. 23, the holding substrate 114 holds the peripheral portion of the sensor 113 with the electrodes 119 from the light receiving surface side. The electrodes 119 are protected by a filler-containing resin material or the like having a Young's modulus of 4 GPa or higher.

Further, in the semiconductor package 100B in FIG. 21, the holding substrate 214 holds the peripheral portion of the sensor 113 with the electrodes 119. The electrodes 119 can be protected by a filler-containing resin material or the like having a Young's modulus of 4 GPa or higher.

Note that, in the semiconductor packages 100A, 100B, 100C, and 100D as semiconductor devices according to the second embodiment, materials and physical property values that are similar to the materials and their physical property values explained in the first embodiment described above may be used as the materials to be used at the other components such as the sensor 113, the holding substrate 114 (the holding substrate 214), and the backing member 121, and as the physical property values of those materials.

The above are the structures of semiconductor devices according to the second embodiment.

5. Third Embodiment

Next, structures of semiconductor devices according to a third embodiment are described, with reference to FIGS. 24 through 27.

(Example of a First Structure)

Figure 24:
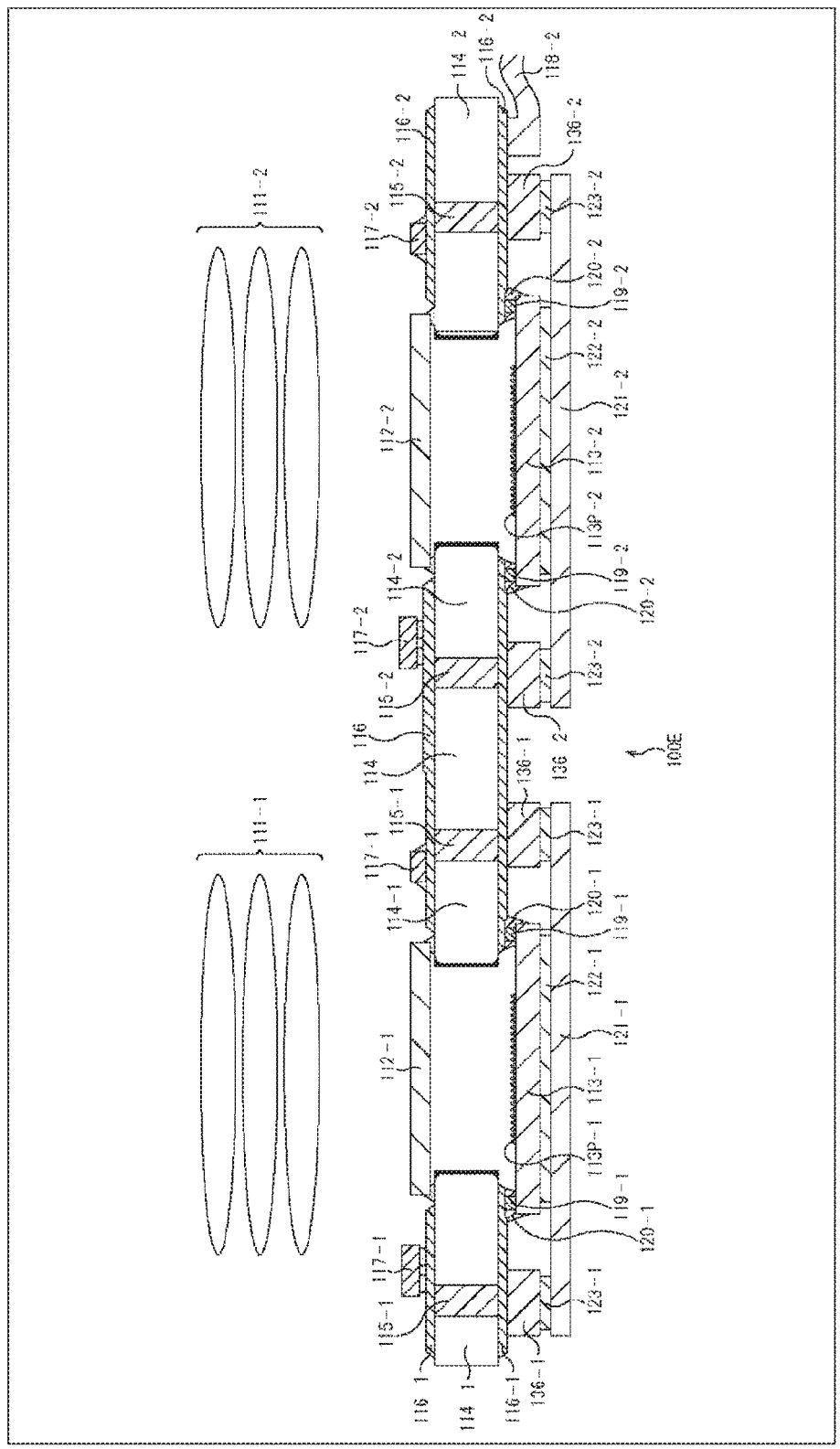
FIG. 24 is a cross-sectional view of an example of a first structure of a semiconductor device according to a third embodiment.

FIG. 24 is a cross-sectional view of an example of a first structure of a semiconductor device according to the third embodiment.

In FIG. 24, a semiconductor package 100E has a structure in which two semiconductor packages 100C (FIG. 22) including adjustment members 136 for adjusting height are arranged side by side and connected (joined) to each other. The semiconductor package 100E includes two images sensors that are a sensor 113-1 and a sensor 113-2 (a so-called twin-lens image sensor).

In the semiconductor package 100E in FIG. 24, adjustment members 136-1 are formed on the lower surface of a holding substrate 114-1 on the left side in the drawing, and adjustment members 136-2 are formed on the lower surface of a holding substrate 114-2 on the right side in the drawing. Further, a lead-out circuit 118-2 is provided only on the lower surface of the holding substrate 114-2 on the right side in the drawing.

Note that, in the semiconductor package 100E in FIG. 24, materials and physical property values that are similar to the materials and their physical property values described above with reference to FIGS. 20 and 22 may be used as the materials to be used at the respective components such as the sensors 113-1 and 113-2, the holding substrates 114-1 and 114-2, the backing member 121, and the adjustment members 136-1 and 136-2, and as the physical property values of those materials.

Here, in the semiconductor package 100E, components 117-1 and components 117-2 as heating elements other than the sensor 113-1 and the sensor 113-2 are mounted on the holding substrate constituted by the holding substrate 114-1 and the holding substrate 114-2, or in the vicinity of those holding substrates.

In the semiconductor package 100E designed as described above, the materials to be used at the respective components described above and the physical property values thereof are adjusted (for example, adjustments are made to satisfy the relationship shown in one of the above expressions (1) through (4)), so that the amount of sensor warpage can be made substantially constant with temperature, though a larger number of heating elements are mounted therein. Thus, a greater benefit to the thermal stability of sensor warpage is obtained.

(Example of a Second Structure)

Figure 25:
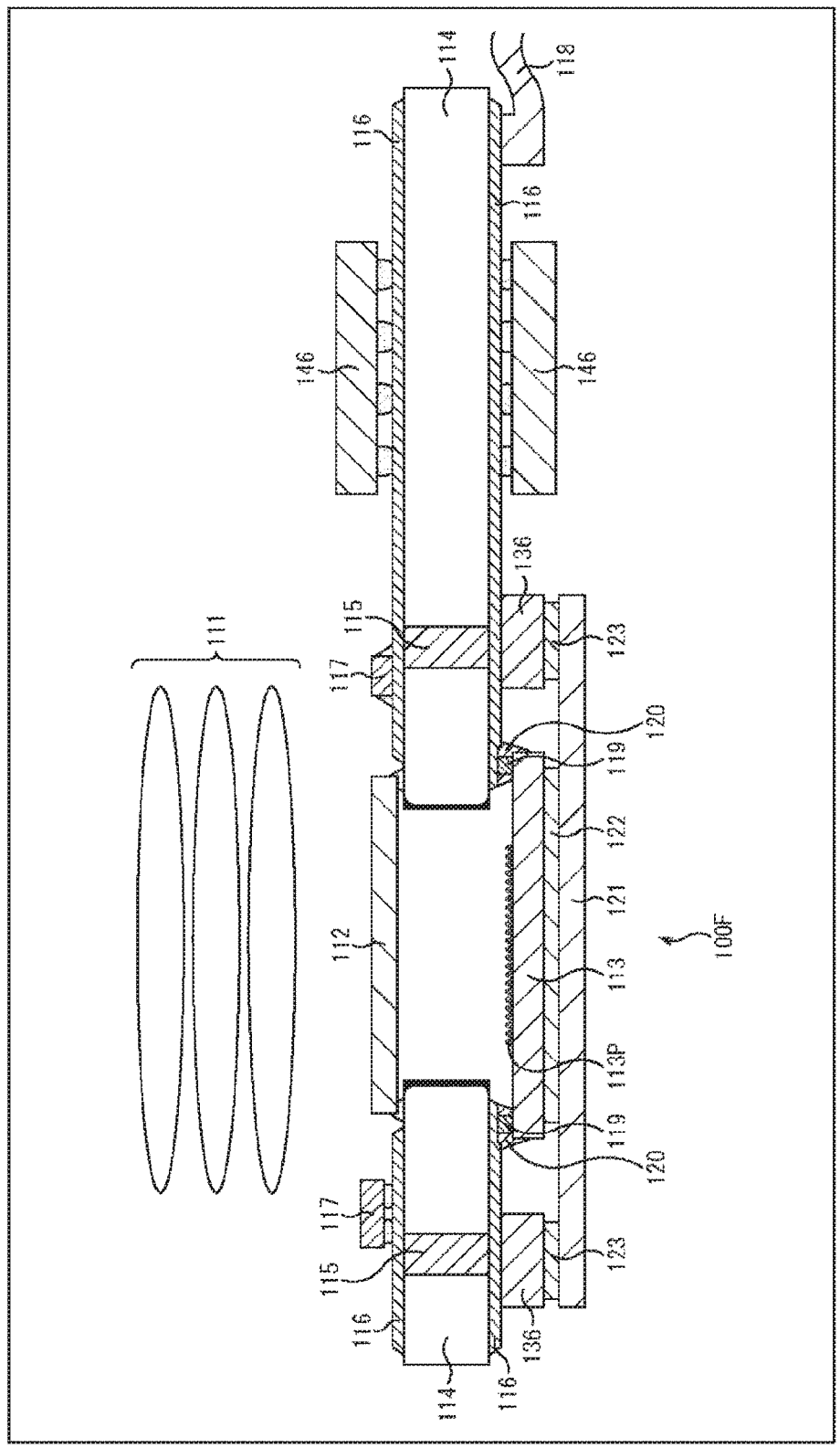
FIG. 25 is a cross-sectional view of an example of a second structure of a semiconductor device according to the third embodiment.

FIG. 25 is a cross-sectional view of an example of a second structure of a semiconductor device according to the third embodiment.

In FIG. 25, a semiconductor package 100F has a structure in which the holding substrate 114 of the semiconductor package 100C (FIG. 22) is extended (stretched) on the right side in the drawing, and components 146 are provided on the upper and lower surfaces of the extended holding substrate 114. The components 146 may be inertial sensors, processors, lasers, regulators, or the like, for example.

Note that, in the semiconductor package 100F in FIG. 25, materials and physical property values that are similar to the materials and their physical property values described above with reference to FIGS. 20 and 22 may be used as the materials to be used at the respective components such as the sensor 113, the holding substrate 114, the backing member 121, and the adjustment members 136, and as the physical property values of those materials.

Here, in the semiconductor package 100F, the components 146 are mounted, as heating elements other than the sensor 113, on the upper and lower surfaces of the extended holding substrate 114.

In the semiconductor package 100F designed as described above, the materials to be used at the respective components described above and the physical property values thereof are adjusted (for example, adjustments are made to satisfy the relationship shown in one of the above expressions (1) through (4)), so that the amount of sensor warpage can be made substantially constant with temperature, though a larger number of heating elements are mounted therein. Thus, a greater benefit to the thermal stability of sensor warpage is obtained.

(Example of a Third Structure)

Figure 26:
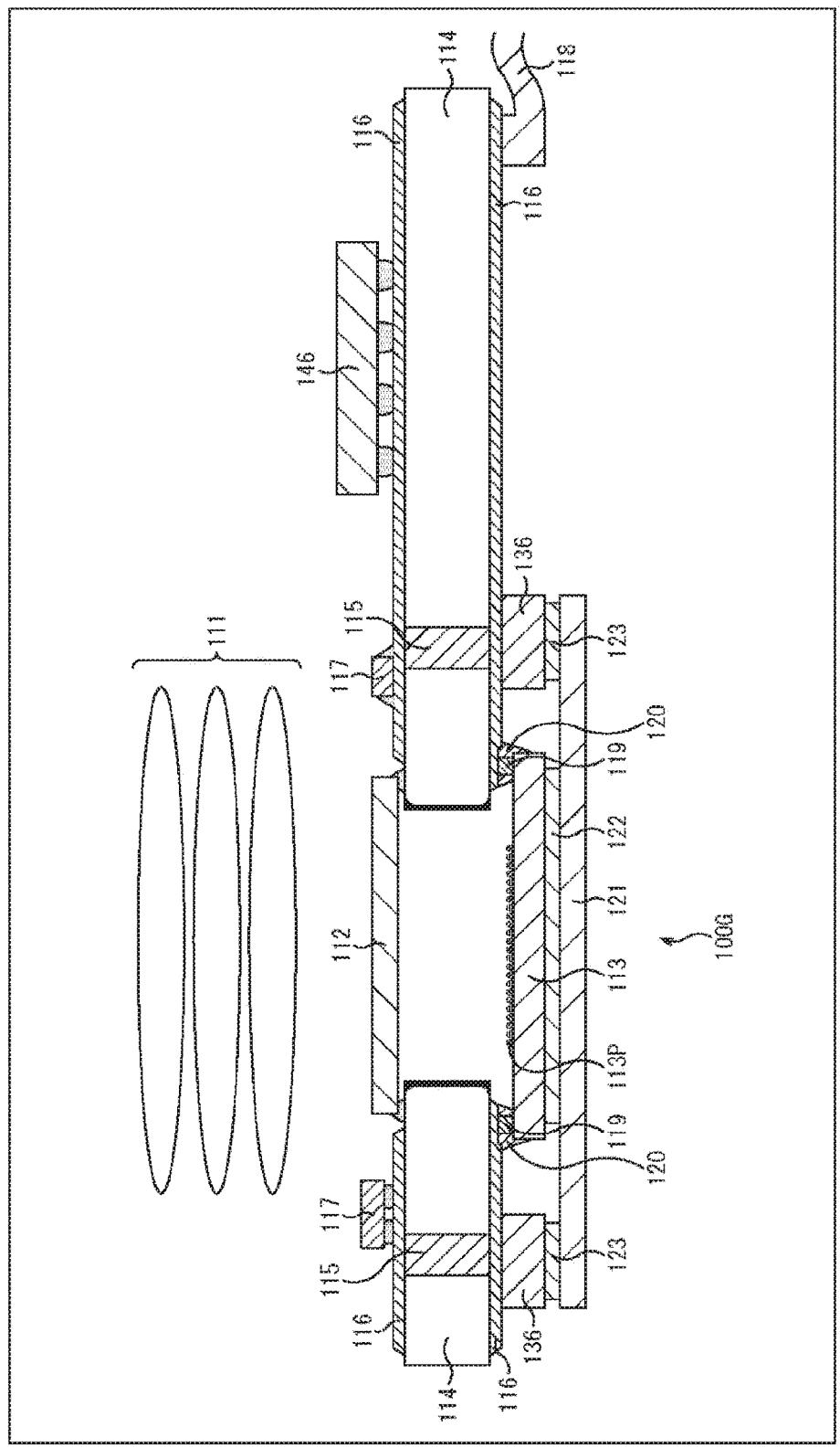
FIG. 26 is a cross-sectional view of an example of a third structure of a semiconductor device according to the third embodiment.

FIG. 26 is a cross-sectional view of an example of a third structure of a semiconductor device according to the third embodiment.

In FIG. 26, a semiconductor package 100G has an extended holding substrate 114, like the semiconductor package 100F shown in FIG. 25. However, a component 146 such as an inertial sensor is provided only on the upper surface of the extended holding substrate 114.

Note that, in the semiconductor package 100G in FIG. 26, materials and physical property values that are similar to the materials and their physical property values described above with reference to FIGS. 20 and 22 may be used as the materials to be used at the respective components such as the sensor 113, the holding substrate 114, the backing member 121, and the adjustment members 136, and as the physical property values of those materials.

In the semiconductor package 100G designed as described above, the component 146 as a heating element other than the sensor 113 is mounted only on the upper surface of the extended holding substrate 114, but the materials to be used at the respective components described above and the physical property values thereof are adjusted (for example, adjustments are made to satisfy the relationship shown in one of the above expressions (1) through (4)), so that a greater benefit to the thermal stability of sensor warpage is obtained.

(Example of a Fourth Structure)

Figure 27:
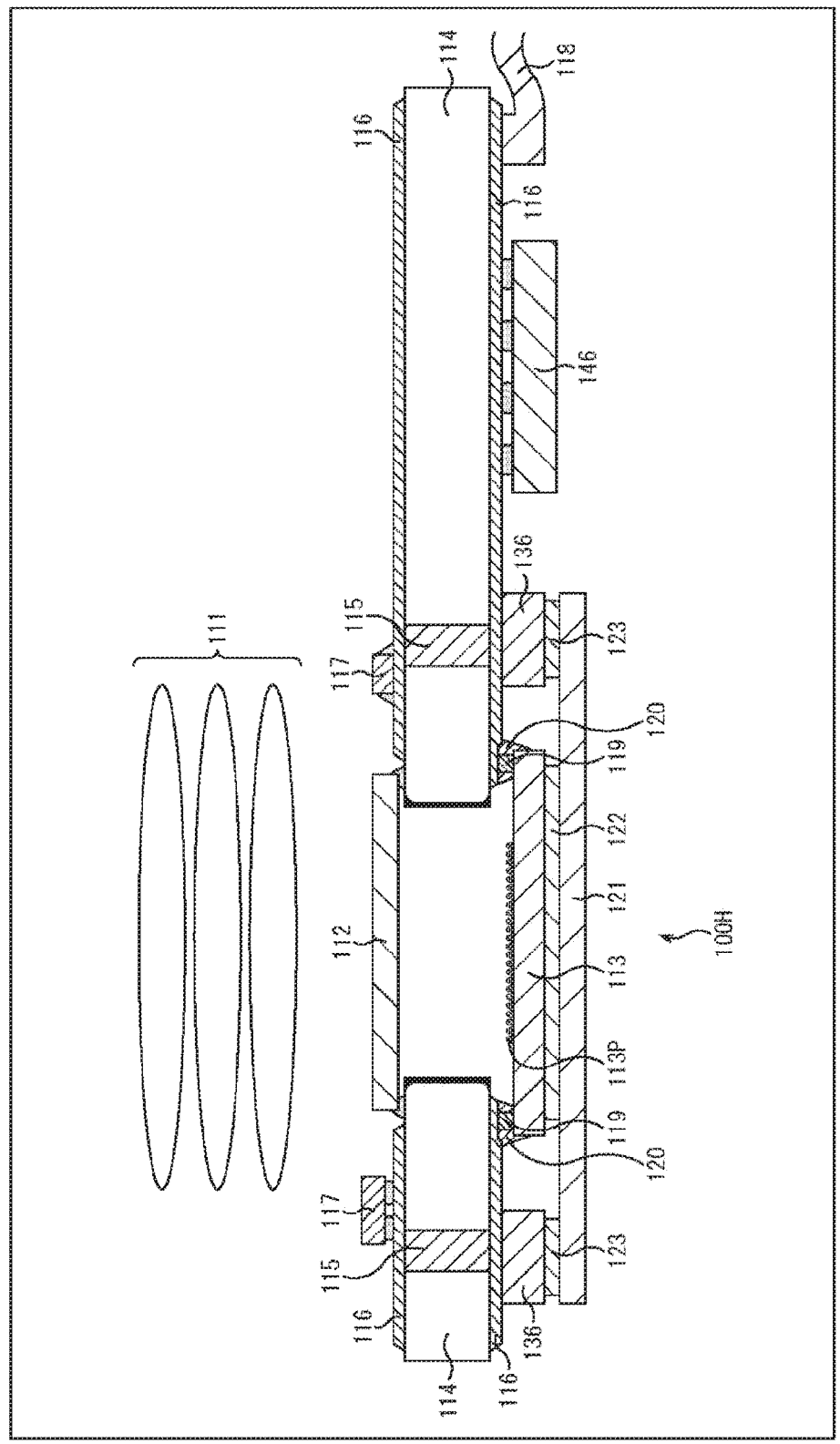
FIG. 27 is a cross-sectional view of an example of a fourth structure of a semiconductor device according to the third embodiment.

FIG. 27 is a cross-sectional view of an example of a fourth structure of a semiconductor device according to the third embodiment.

In FIG. 27, a semiconductor package 100H has an extended holding substrate 114, like the semiconductor package 100F shown in FIG. 25. However, a component 146 such as an inertial sensor is provided only on the lower surface of the extended holding substrate 114.

Note that, in the semiconductor package 100H in FIG. 27, materials and physical property values that are similar to the materials and their physical property values described above with reference to FIGS. 20 and 22 may be used as the materials to be used at the respective components such as the sensor 113, the holding substrate 114, the backing member 121, and the adjustment members 136, and as the physical property values of those materials.

In the semiconductor package 100H designed as described above, the component 146 as a heating element other than the sensor 113 is mounted only on the lower surface of the extended holding substrate 114, but the materials to be used at the respective components described above and the physical property values thereof are adjusted (for example, adjustments are made to satisfy the relationship shown in one of the above expressions (1) through (4)), so that a greater benefit to the thermal stability of sensor warpage is obtained.

The above are the structures of semiconductor devices according to the third embodiment.

6. Fourth Embodiment

Figure 28:
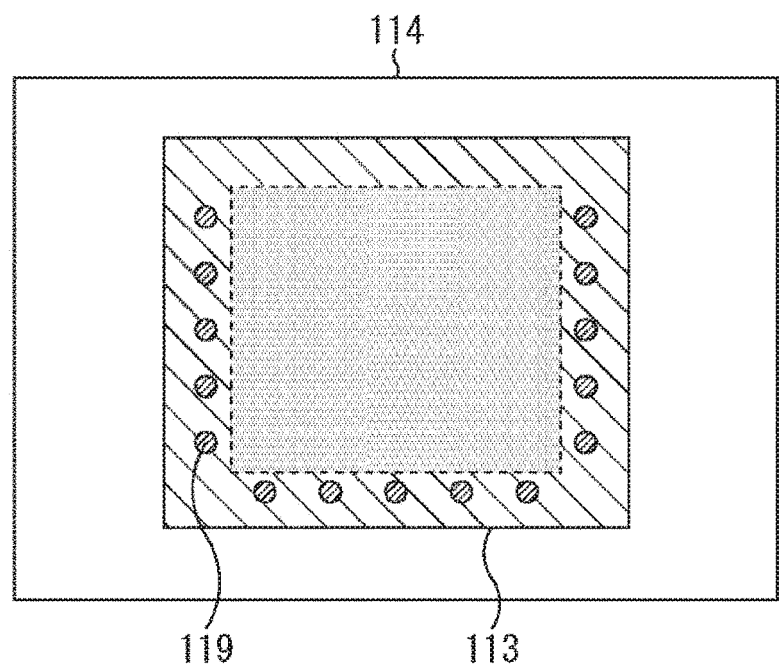
FIG. 28 is a top view of an example of a structure of a semiconductor device according to a fourth embodiment.

Next, a structure of a semiconductor device according to a fourth embodiment is described, with reference to FIG. 28.

(Example of a Structure)

FIG. 28 is a top view of an example of a structure of a semiconductor device according to the fourth embodiment.

In FIG. 28, a semiconductor package 100I has a cross-section structure similar to that of the semiconductor package 100A in FIG. 20 or the like, and adopts a structure in which the peripheral portion of the sensor 113 is held by the electrodes 119 as substrate electrodes from the light receiving surface side.

Note that, in the semiconductor package 100I in FIG. 28, materials and physical property values that are similar to the materials and their physical property values described above with reference to FIG. 20 and the like may be used as the materials to be used at the respective components such as the sensor 113, the holding substrate 114, and the electrodes 119, and as the physical property values of those materials.

Here, in the semiconductor package 100I, five electrodes 119 are provided as substrate electrodes on the lower surface side of the holding substrate 114, and are arranged along each of three sides (the bottom side, the left side, and the right side in the drawing) of the sensor 113 (an opening formed in the holding substrate 114) having a rectangular shape (a total of 15 electrodes 119 along the three sides). The peripheral portion of the sensor 113 (the portion corresponding to the three sides of the opening of the holding substrate 114) is then held by those electrodes 119 (a total of 15 electrodes 119 along the three sides) from the light receiving surface side.

That is, in the semiconductor package 100I, there is a bias in the electrode arrangement on the respective sides of the sensor 113 (the opening of the holding substrate 114). Note that, in the case described with reference to FIG. 28, the electrodes 119 are provided along three sides of the sensor 113. However, the electrodes 119 are not necessarily provided along the above three sides, and may be provided along two sides (the left side and the right side in the drawing, for example) of the sensor 113, for example. In the case of such two-side arrangement, the structure has a bias in the electrode arrangement along the respective sides of the sensor 113.

In other words, in the semiconductor package 100I, the light receiving surface of the sensor 113 is concavely curved on the side of the lens group 111, and there is a bias in the arrangement of the electrodes 119 along the respective sides of the sensor 113, in a structure in which the peripheral portion of the sensor 113 is held by the substrate electrodes from the light receiving side in a mode for holding the sensor 113.

In the semiconductor package 100I designed as described above, the light receiving surface of the sensor 113 is concavely curved on the side of the lens group 111, and there is a bias in the arrangement of the electrodes 119 along the respective sides of the sensor 113. However, where the relationships shown in the above expressions (1) through (4) are satisfied, the holding of the sensor 113 by the holding substrate 114 is stabilized. Thus, eccentricity at the sensor 113 curved in a concave form can be reduced.

The above is the structure of a semiconductor device according to the fourth embodiment.

7. Fifth Embodiment

Figure 29:
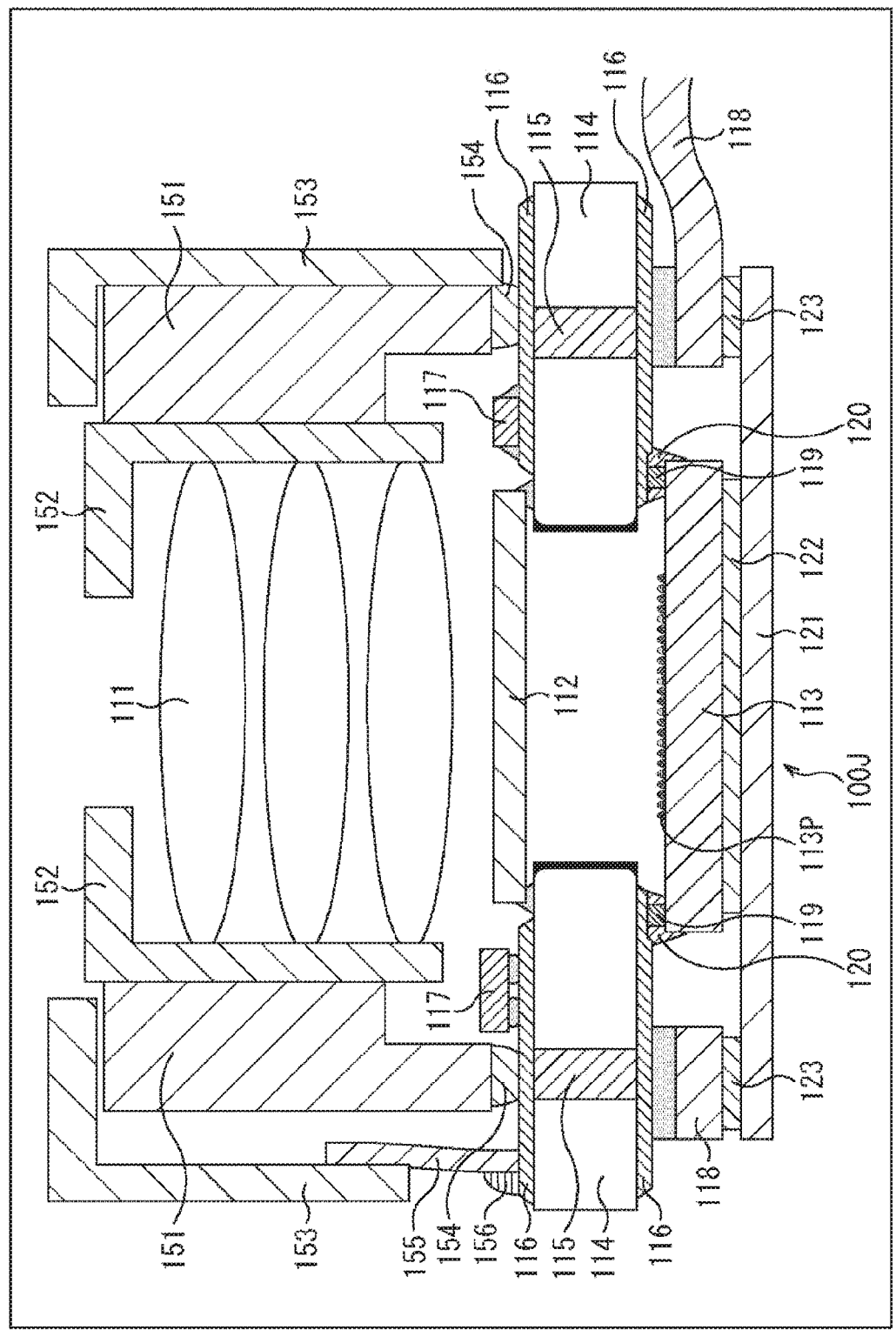
FIG. 29 is a cross-sectional view of an example a structure of a semiconductor device according to a fifth embodiment.

Next, a structure of a semiconductor device according to a fifth embodiment is described, with reference to FIG. 29.

(Example of a Structure)

FIG. 29 is a cross-sectional view of an example of a structure of a semiconductor device according to the fifth embodiment.

In FIG. 29, a semiconductor package 100J has a cross-section structure similar to that of the semiconductor package 100A or the like in FIG. 20, and a mechanism for driving the lens group 111 is further provided on the upper surface side of the holding substrate 114. This drive mechanism has a lens structure that is formed with a first member 151, a second member 152, and a third member 153. The second member 152 housed in the first member 151 is driven in the optical axis direction by a motor or the like, so that the lens group 111 held in the second member 152 can be driven.

In the semiconductor package 100J, the first member 151 is secured, with an adhesive 154, to the on-substrate circuit 116 provided on the upper surface of the holding substrate 114, and the third member 153 is secured by a solder 156 via a securing member 155 Thus, the lens structure is mounted on the holding substrate 114.

Note that, although not shown in FIG. 29, a mechanism for image stabilization may be provided for performing driving of the semiconductor package 100J, a combination of driving of the semiconductor package 100J and driving of the lens group 111, collective driving of the semiconductor package 100J and the lens group 111, or the like, instead of driving of the above lens group 111.

In the semiconductor package 100J in FIG. 29, materials and physical property values that are similar to the materials and their physical property values described above with reference to FIG. 20 or the like may be used as the materials to be used at the respective components such as the sensor 113, the holding substrate 114, and the electrodes 119, and as the physical property values of those materials.

In the semiconductor package 100J designed as described above, the lens group 111 and the image stabilizing drive mechanism can be mounted on the holding substrate 114, but the materials to be used at the respective components described above and the physical property values thereof are adjusted (for example, adjustments are made to satisfy the relationship shown in one of the above expressions (1) through (4)), so that the accuracy in mounting of the lenses and the mechanism can be increased, while the thermal stability of sensor warpage is maintained.

The above is the structure of a semiconductor device according to the fifth embodiment.

8. Sixth Embodiment

Next, structures of semiconductor devices according to a sixth embodiment are described, with reference to FIGS. 30 through 33.

(Example of a First Structure)

Figure 30:
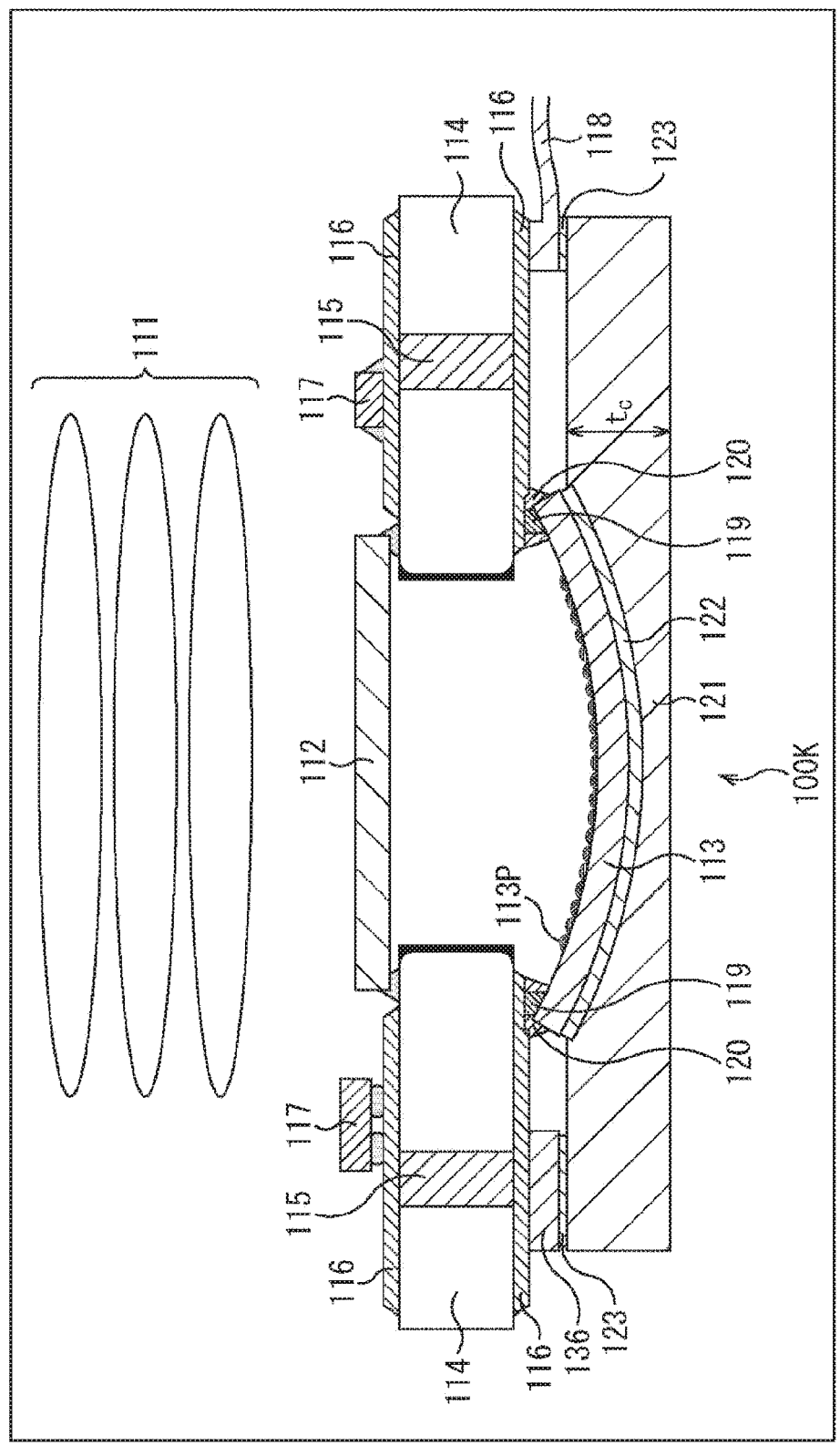
FIG. 30 is a cross-sectional view of an example of a first structure of a semiconductor device according to a sixth embodiment.

FIG. 30 is a cross-sectional view of an example of a first structure of a semiconductor device according to the sixth embodiment.

In FIG. 30, a semiconductor package 100K has a cross-section structure similar to that of the semiconductor package 100C (FIG. 22) or the like including the adjustment member 136 for adjusting height. However, the semiconductor package 100K differs from the semiconductor package 100C in that the light receiving surface of the sensor 113 is concavely curved on the side of the lens group 111.

In the semiconductor package 100K in FIG. 30, materials and physical property values that are similar to the materials and their physical property values described above with reference to FIG. 22 or the like may be used as the materials of the sensor 113, the holding substrate 114, the electrodes 119, the adjustment member 136, and the like, and as the physical property values of those materials.

However, as is apparent from the results of the first simulation (FIGS. 8A and 8B), the curvature radius of the sensor 113 is designed (optically designed) to be 100 mm or smaller, so that the problem of decrease in peripheral illumination is solved, as described above.

Also, as is apparent from the results of the fourth simulation (FIGS. 16 and 17) and the fifth simulation (FIGS. 18 and 19), $E_C \times t_C$ of the backing member 121 is adjusted to satisfy the relationship, $(E_C \times t_C) < 40$ (expression (4)), so that an effect to reduce warpage of the sensor 113 is obtained, as described above. Note that the backing member 121 has a shape corresponding to the concavely curved sensor 113. In this example, the thickness of the portion (the thickest portion) to which the sensor 113 is not secured, or the distance between horizontal portions not including the adjustment member 136 may be set as the thickness $t_C$, for example.

In the semiconductor package 100K designed as described above, the light receiving surface of the sensor 113 is concavely curved on the side of the lens group 111. For example, the curvature radius of the sensor 113 is designed to be 100 mm or smaller, or the physical property value of the material of the backing member 121 is adjusted to satisfy the relationship, $(E_C \times t_C) < 40$, where $E_C$ (GPa) and $t_C$ (mm) represent the Young's modulus and the thickness of the backing member 121. In this manner, temperature-dependent change in warpage of the sensor 113 can be reduced, while the problem of peripheral illumination is solved.

(Example of a Second Structure)

Figure 31:
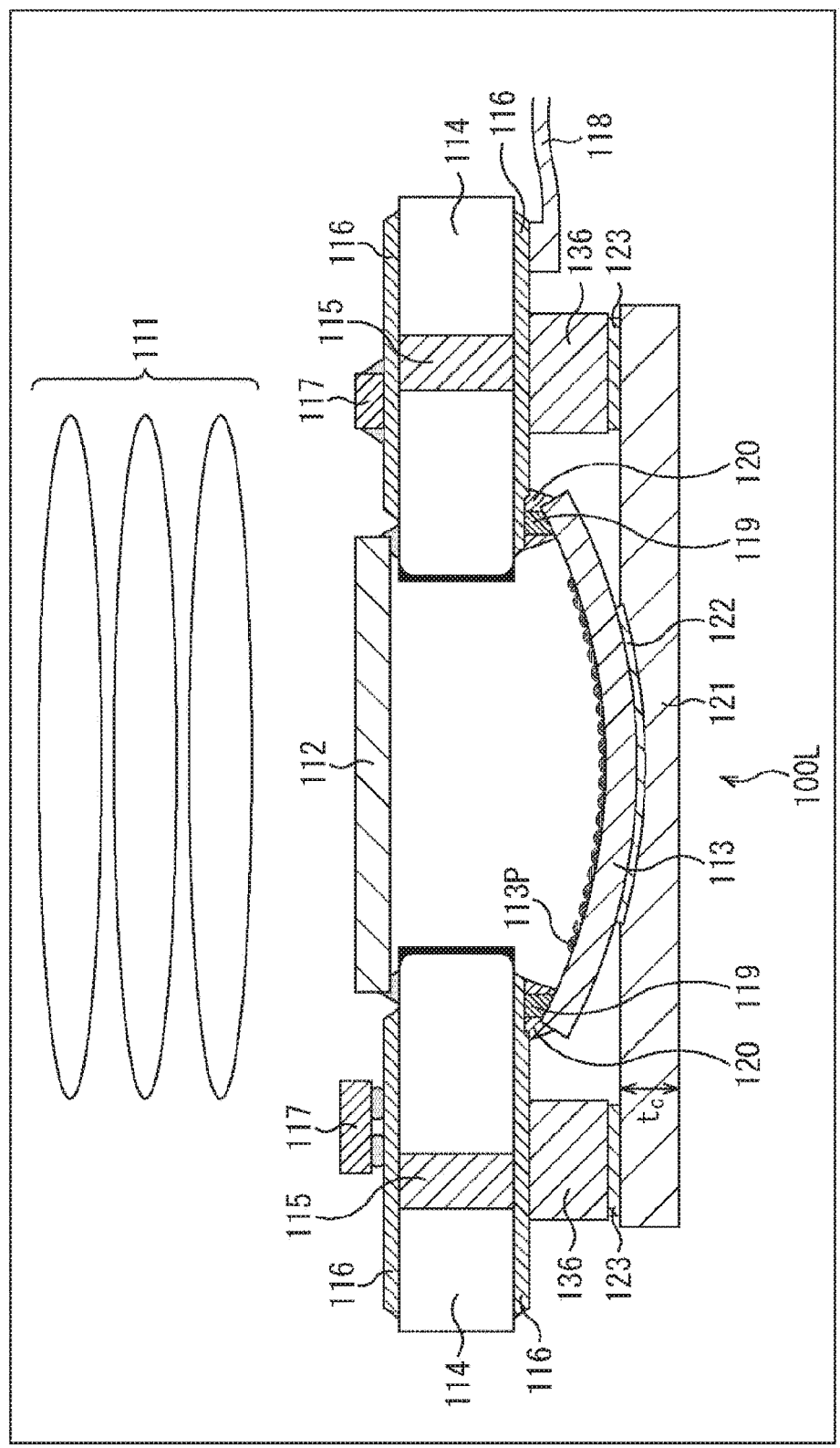
FIG. 31 is a cross-sectional view of an example of a second structure of a semiconductor device according to the sixth embodiment.

FIG. 31 is a cross-sectional view of an example of a second structure of a semiconductor device according to the sixth embodiment.

In FIG. 31, a semiconductor package 100L has a structure in which the light receiving surface of the sensor 113 is curved as in the semiconductor package 100K in FIG. 30, but the thickness of the backing member 121 backing the sensor 113 is thinner.

Therefore, while the entire lower surface of the sensor 113 is secured to the backing member 121 in the semiconductor package 100K (FIG. 30), only part of the lower surface of the sensor 113 is secured to the backing member 121 in the semiconductor package 100L (FIG. 31). Further, on the backing member 121, an adjustment member 136 is provided not only on the left side in the drawing but also on the right side in the drawing.

In the semiconductor package 100L in FIG. 31, materials and physical property values that are similar to the materials and their physical property values described above with reference to FIG. 22 or the like may be used as the materials of the sensor 113, the holding substrate 114, the electrodes 119, the adjustment members 136, and the like, and as the physical property values of those materials. Note that the thickness of the portion (the thickest portion) to which the sensor 113 is not secured may be adopted as the thickness $t_C$ in the adjustment of $E_C \times t_C$ of the backing member 121, for example.

In the semiconductor package 100L designed as described above, the light receiving surface of the sensor 113 is concavely curved on the side of the lens group 111. For example, the curvature radius of the sensor 113 is designed to be 100 mm or smaller, or the physical property value of the material of the backing member 121 is adjusted to satisfy the relationship, $(E_C \times t_C) < 40$, where $E_C$ (GPa) and $t_C$ (mm) represent the Young's modulus and the thickness of the backing member 121. In this manner, temperature-dependent change in warpage of the sensor 113 can be reduced, while the problem of peripheral illumination is solved.

(Example of a Third Structure)

Figure 32:
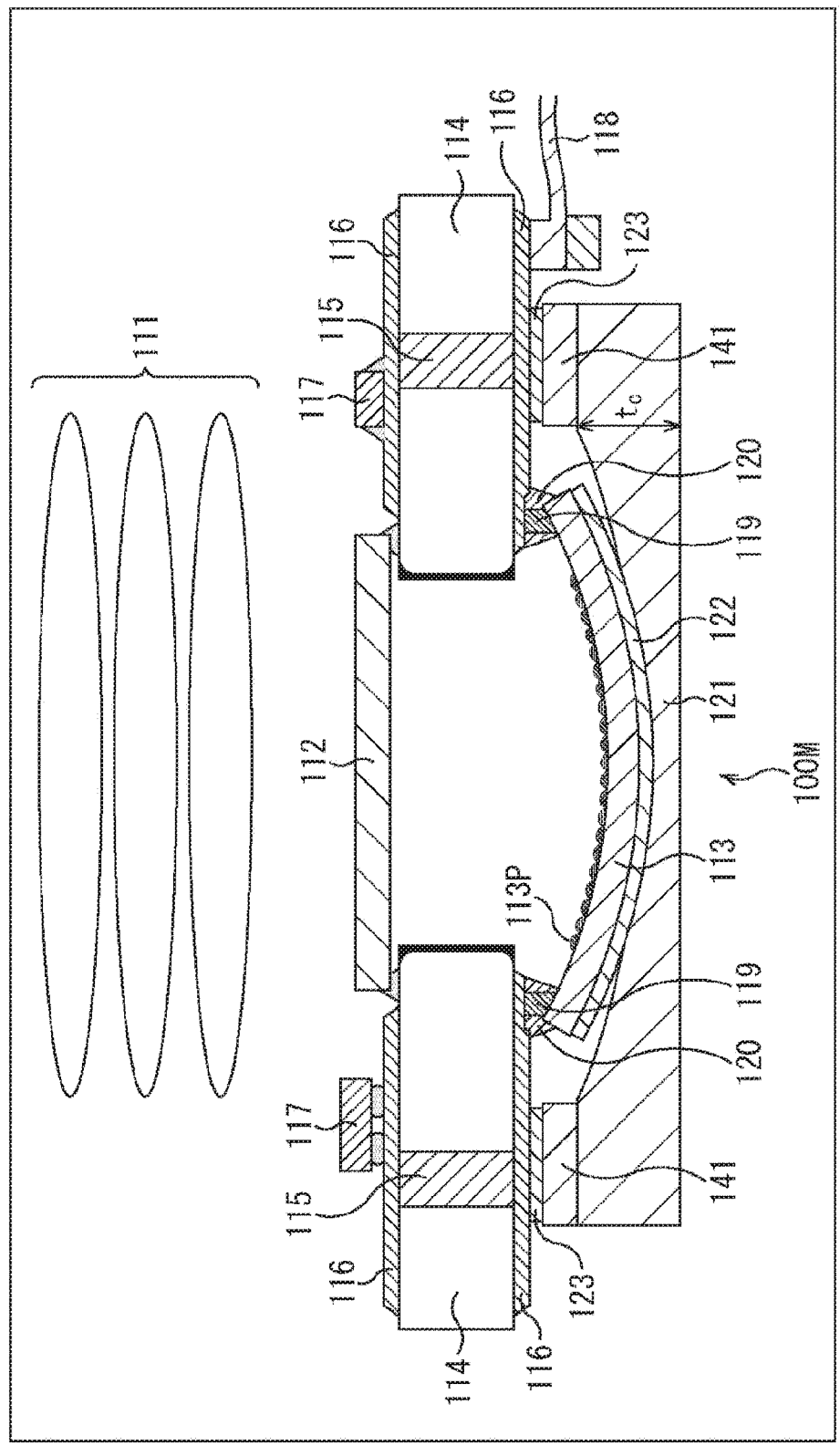
FIG. 32 is a cross-sectional view of an example of a third structure of a semiconductor device according to the sixth embodiment.

FIG. 32 is a cross-sectional view of an example of a third structure of a semiconductor device according to the sixth embodiment.

In FIG. 32, a semiconductor package 100M has a structure in which the light receiving surface of the sensor 113 is curved as in the semiconductor package 100K in FIG. 30, but the lower surface of the sensor 113 is partially detached from a groove portion formed in the backing member 121. Further, the semiconductor package 100M in FIG. 32 differs from the semiconductor package 100L in FIG. 31 in that the adjustment members 136 on the right and left sides in the drawing are replaced with adjustment members 141 formed integrally with the backing member 121.

In the semiconductor package 100M in FIG. 32, materials and physical property values that are similar to the materials and their physical property values described above with reference to FIG. 23 or the like may be used as the materials of the sensor 113, the holding substrate 114, the electrodes 119, the adjustment members 141, and the like, and as the physical property values of those materials. Note that the thickness of the portion (the thickest portion) to which the sensor 113 is not secured may be adopted as the thickness $t_C$ in the adjustment of $E_C \times t_C$ of the backing member 121, for example.

In the semiconductor package 100M designed as described above, the light receiving surface of the sensor 113 is concavely curved on the side of the lens group 111. For example, the curvature radius of the sensor 113 is designed to be 100 mm or smaller, or the physical property value of the material of the backing member 121 is adjusted to satisfy the relationship, $(E_C \times t_C) < 40$, where $E_C$ (GPa) and $t_C$ (mm) represent the Young's modulus and the thickness of the backing member 121. In this manner, temperature-dependent change in warpage of the sensor 113 can be reduced, while the problem of peripheral illumination is solved.

(Example of a Fourth Structure)

Figure 33:
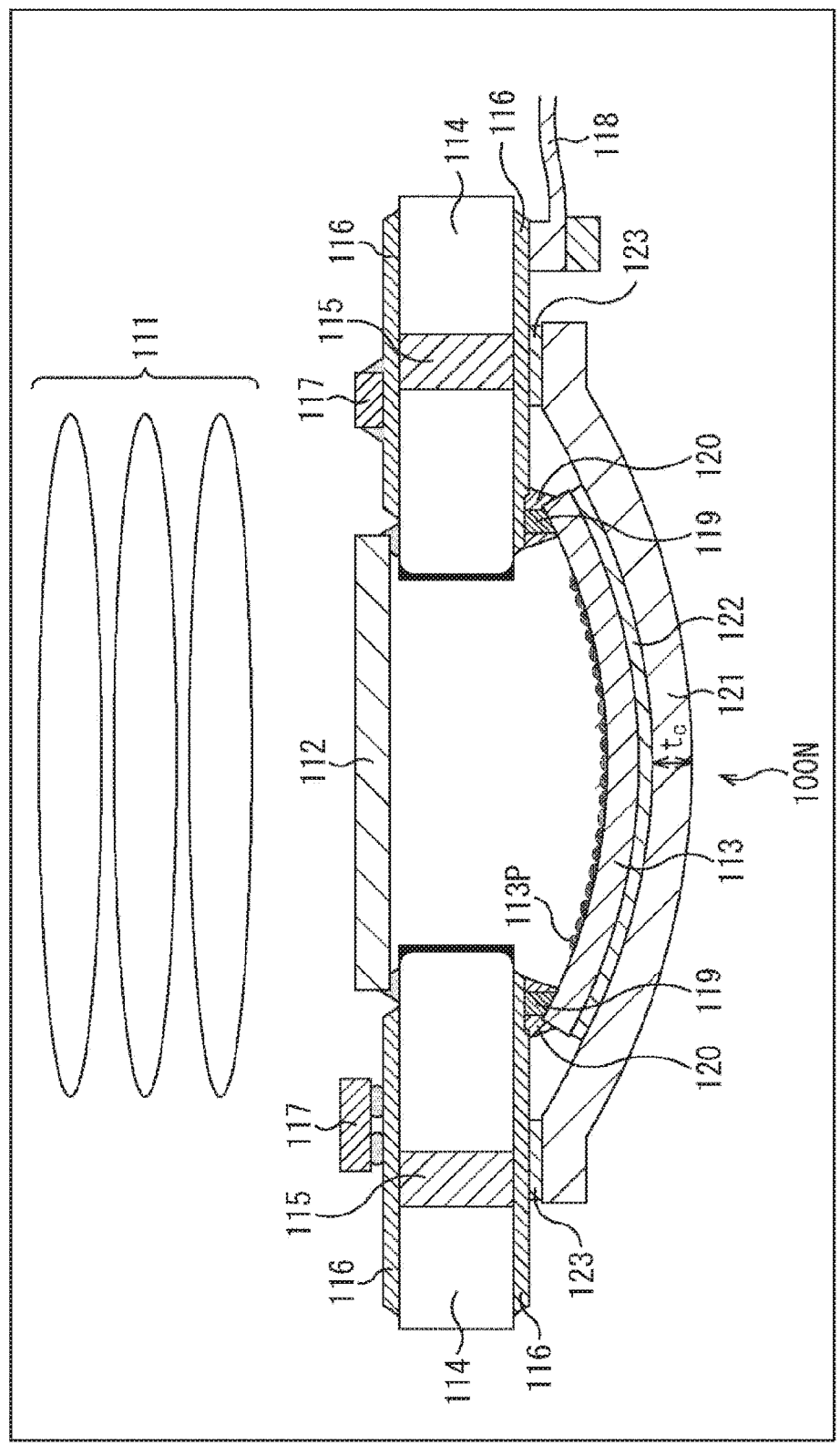
FIG. 33 is a cross-sectional view of an example of a fourth structure of a semiconductor device according to the sixth embodiment.

FIG. 33 is a cross-sectional view of an example of a fourth structure of a semiconductor device according to the sixth embodiment.

In FIG. 33, a semiconductor package 100N has a structure in which the light receiving surface of the sensor 113 is curved as in the semiconductor package 100K or the like in FIG. 30, but the thickness of the backing member 121 backing the sensor 113 is uniform. The sensor 113 is secured onto the upper surface of the backing member 121 with an adhesive 122. Further, unlike the semiconductor package 100K in FIG. 30, the semiconductor package 100N in FIG. 33 does not include any adjustment member such as an adjustment member 136.

In the semiconductor package 100N in FIG. 33, materials and physical property values that are similar to the materials and their physical property values described above with reference to FIG. 20 or the like may be used as the materials of the sensor 113, the holding substrate 114, the electrodes 119, and the like, and as the physical property values of those materials. Note that the thickness of the backing member 121 is uniform, and accordingly, the uniform thickness may be adopted as the thickness $t_C$ in the adjustment of $E_C \times t_C$ of the backing member 121, for example.

In the semiconductor package 100N designed as described above, the light receiving surface of the sensor 113 is concavely curved on the side of the lens group 111. For example, the curvature radius of the sensor 113 is designed to be 100 mm or smaller, or the physical property value of the material of the backing member 121 is adjusted to satisfy the relationship, $(E_C \times t_C) < 40$, where $E_C$ (GPa) and $t_C$ (mm) represent the Young's modulus and the thickness of the backing member 121. In this manner, temperature-dependent change in warpage of the sensor 113 can be reduced, while the problem of peripheral illumination is solved.

The above are the structures of semiconductor devices according to the sixth embodiment.

9. Modifications (1) Modifications of Semiconductor Devices According to the First Embodiment First, structures of modifications of semiconductor devices according to the first embodiment are described, with reference to FIGS. 34 through 37.

(Example of a First Structure)

Figure 34:
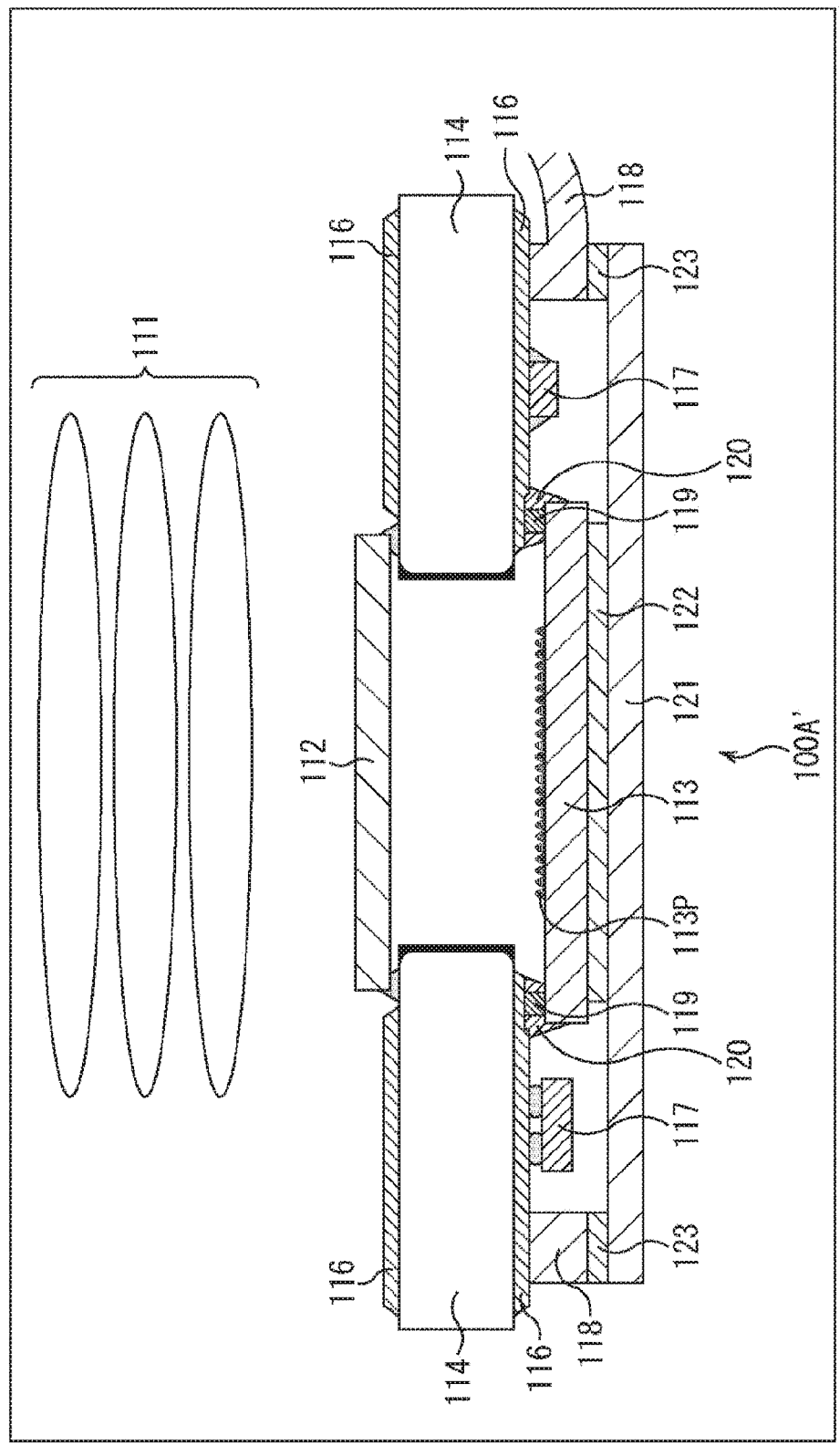
FIG. 34 is a cross-sectional view of an example of a first structure of a modification of a semiconductor device according to the first embodiment.

FIG. 34 is a cross-sectional view of an example of a first structure of a modification of a semiconductor device according to the first embodiment.

In FIG. 34, a semiconductor package 100A' has a structure similar to that of the semiconductor package 100A in FIG. 20, except that the through electrodes 115 are not formed in the holding substrate 114. Further, in the semiconductor package 100A', the components 117 are provided not on the upper surface of the holding substrate 114 but on the lower surface, and the positions and sizes of the components 117 are adjusted to avoid the lead-out circuits 118 provided on the same surface.

In the semiconductor package 100A' designed as described above, the respective components are formed with materials having physical property values obtained as a result of the respective simulations described above (for example, adjustments are made to satisfy the relationship shown in one of the above expressions (1) through (4)). Thus, it is possible to reduce temperature-dependent change in warpage of the sensor 113.

(Example of a Second Structure)

Figure 35:
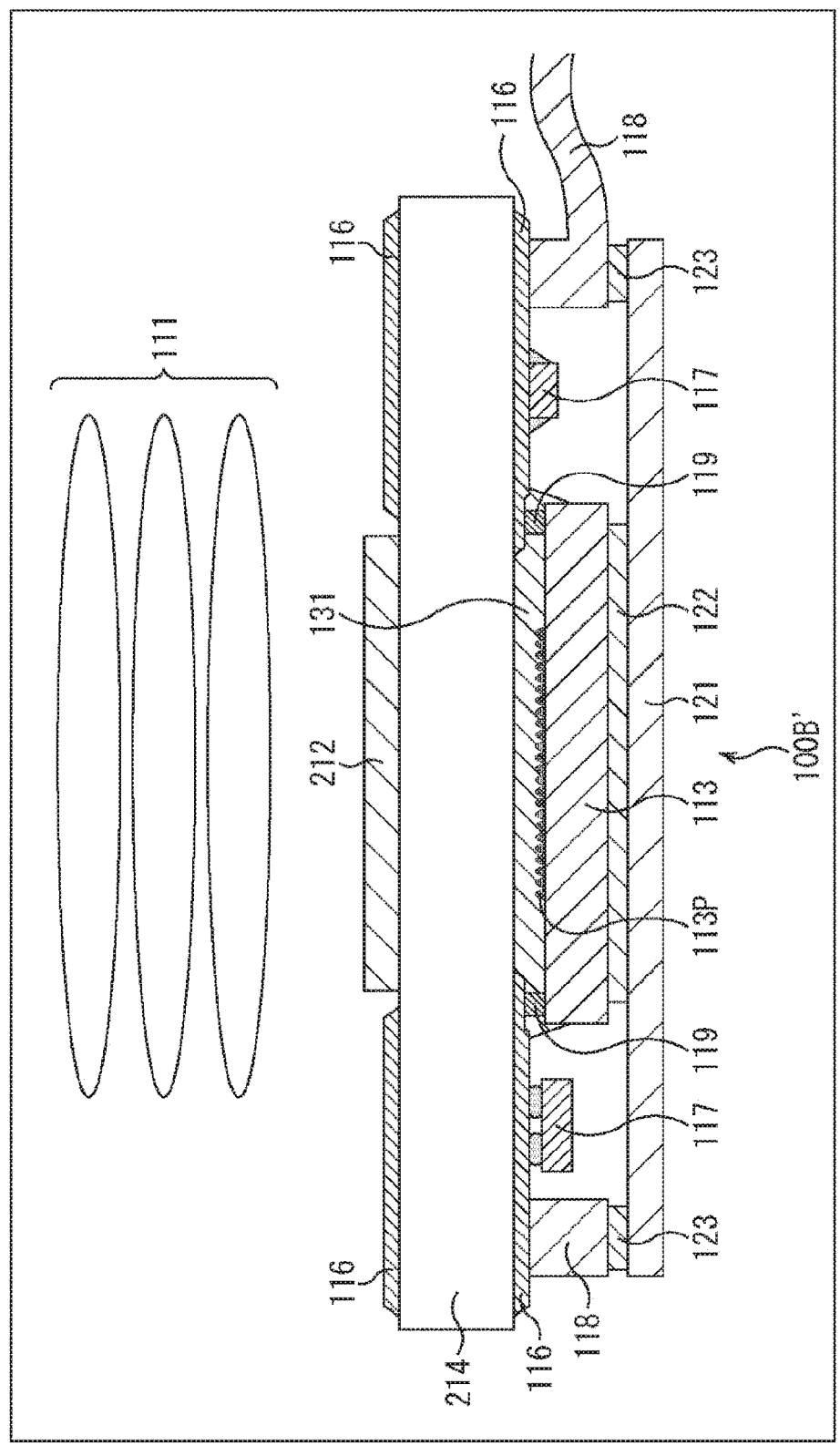
FIG. 35 is a cross-sectional view of an example of a second structure of a modification of a semiconductor device according to the first embodiment.

FIG. 35 is a cross-sectional view of an example of a second structure of a modification of a semiconductor device according to the first embodiment.

In FIG. 35, a semiconductor package 100B' has a structure similar to that of the semiconductor package 100B in FIG. 21, except that the through electrodes 115 are not formed in the holding substrate 214. Further, in the semiconductor package 100B', the components 117 are provided not on the upper surface of the holding substrate 214 but on the lower surface, and the positions and sizes of the components 117 are adjusted to avoid the lead-out circuits 118 provided on the same surface.

In the semiconductor package 100B' designed as described above, the respective components are formed with materials having physical property values obtained as a result of the respective simulations described above (for example, adjustments are made to satisfy the relationship shown in one of the above expressions (1) through (4)). Thus, it is possible to reduce temperature-dependent change in warpage of the sensor 113.

(Example of a Third Structure)

Figure 36:
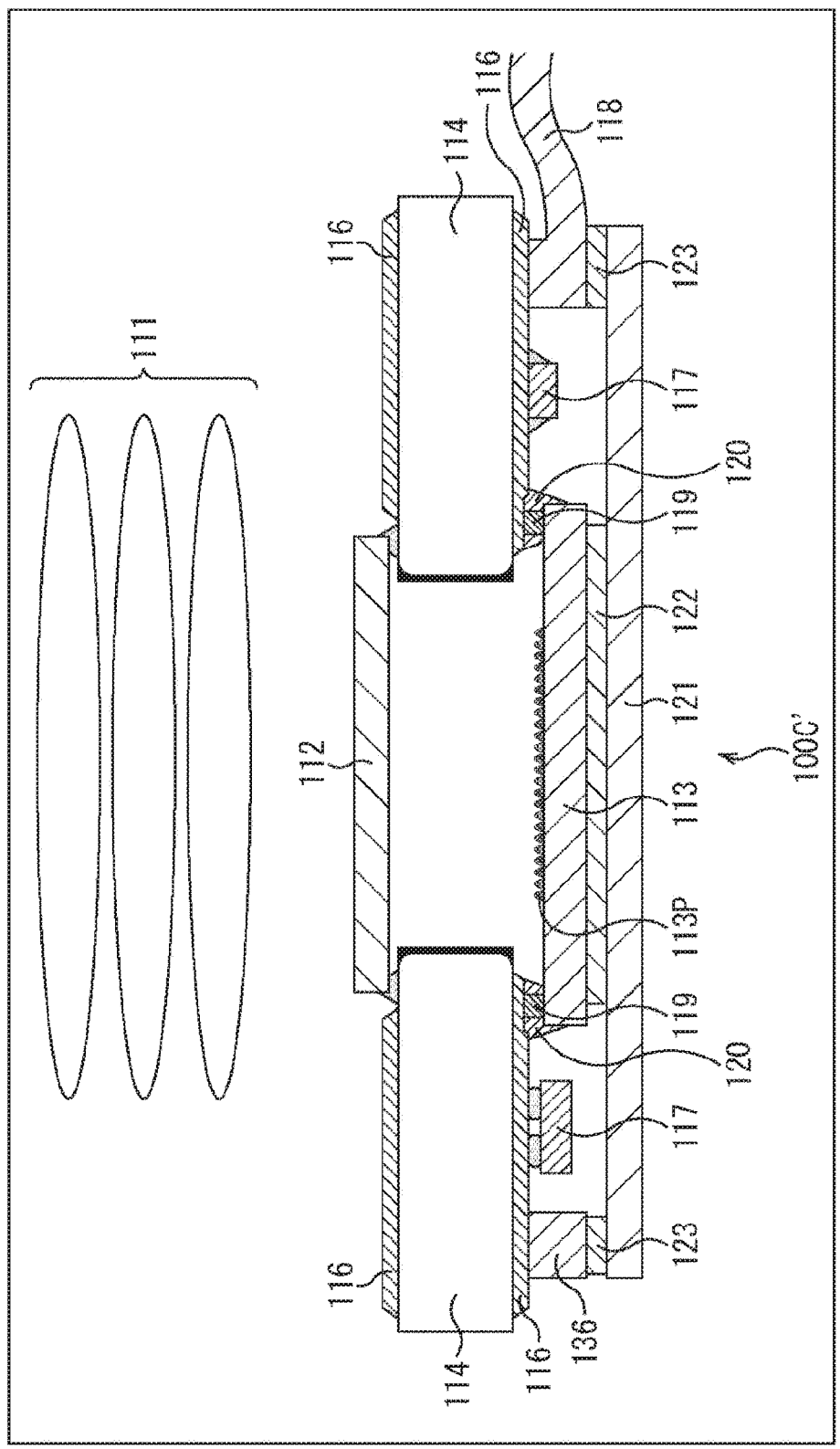
FIG. 36 is a cross-sectional view of an example of a third structure of a modification of a semiconductor device according to the first embodiment.

FIG. 36 is a cross-sectional view of an example of a third structure of a modification of a semiconductor device according to the first embodiment.

In FIG. 36, a semiconductor package 100C' has a structure similar to that of the semiconductor package 100C in FIG. 22, except that the through electrodes 115 are not formed in the holding substrate 114. Further, in the semiconductor package 100C', the components 117 are provided not on the upper surface of the holding substrate 114 but on the lower surface, and the positions and sizes of the components 117 are adjusted to avoid the lead-out circuits 118 and the adjustment member 136 provided on the same surface.

In the semiconductor package 100C' designed as described above, the respective components are formed with materials having physical property values obtained as a result of the respective simulations described above (for example, adjustments are made to satisfy the relationship shown in one of the above expressions (1) through (4)). Thus, it is possible to reduce temperature-dependent change in warpage of the sensor 113.

(Example of a Fourth Structure)

Figure 37:
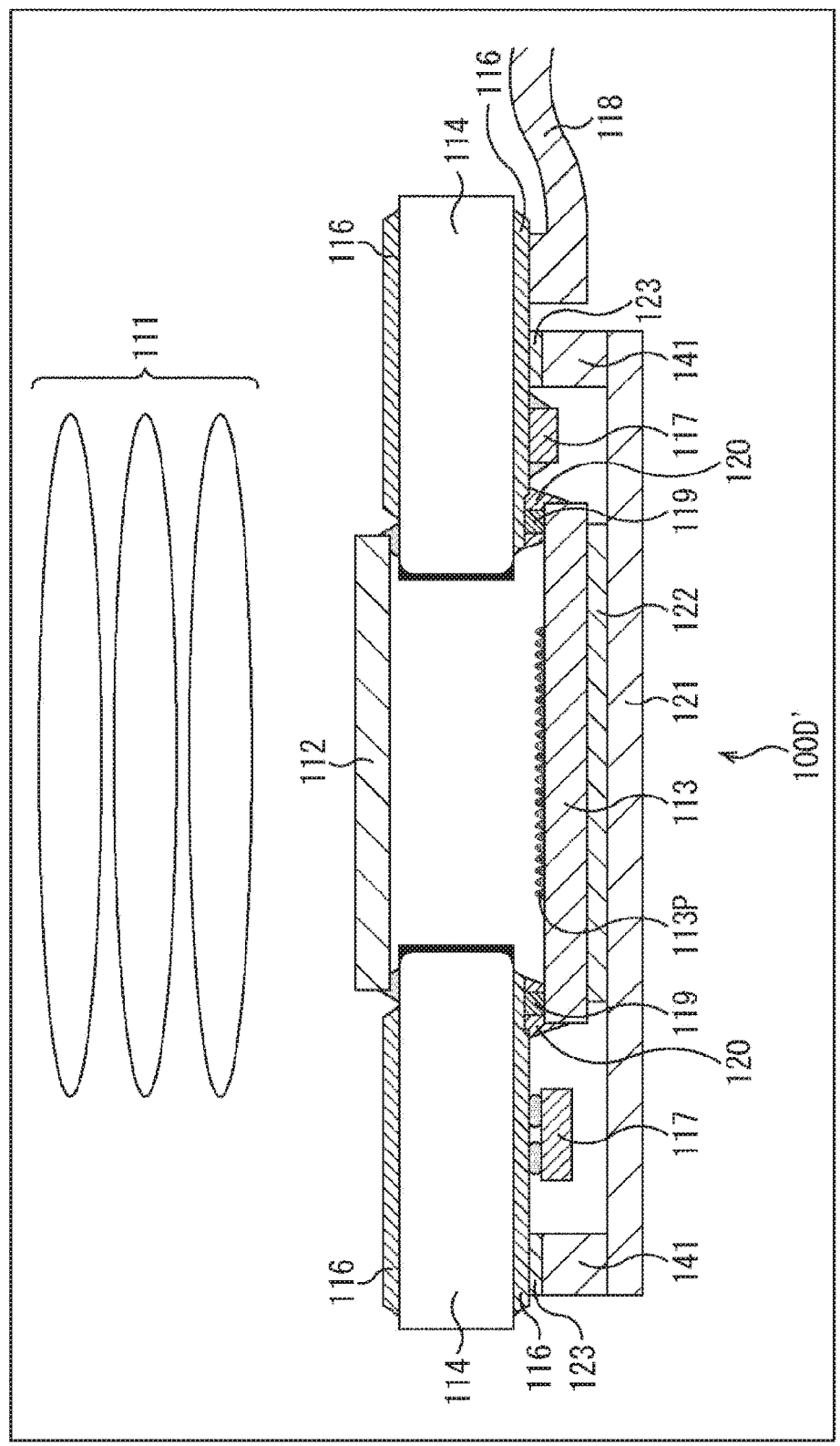
FIG. 37 is a cross-sectional view of an example of a fourth structure of a modification of a semiconductor device according to the first embodiment.

FIG. 37 is a cross-sectional view of an example of a fourth structure of a modification of a semiconductor device according to the first embodiment.

In FIG. 37, a semiconductor package 100D' has a structure similar to that of the semiconductor package 100D in FIG. 23, except that the through electrodes 115 are not formed in the holding substrate 114. Further, in the semiconductor package 100D', the components 117 are provided not on the upper surface of the holding substrate 114 but on the lower surface, and the positions and sizes of the components 117 are adjusted to avoid the adjustment members 141 provided on the same surface.

In the semiconductor package 100D' designed as described above, the respective components are formed with materials having physical property values obtained as a result of the respective simulations described above (for example, adjustments are made to satisfy the relationship shown in one of the above expressions (1) through (4)). Thus, it is possible to reduce temperature-dependent change in warpage of the sensor 113.

(2) Modifications of the Third Structure of a Semiconductor Device According to the First Embodiment Next, modifications of the third structure of a semiconductor device according to the first embodiment are described, with reference to FIGS. 38A, 38B, 38C, 39, and 40.

(Examples of First Through Third Structures)

Figure 38C:
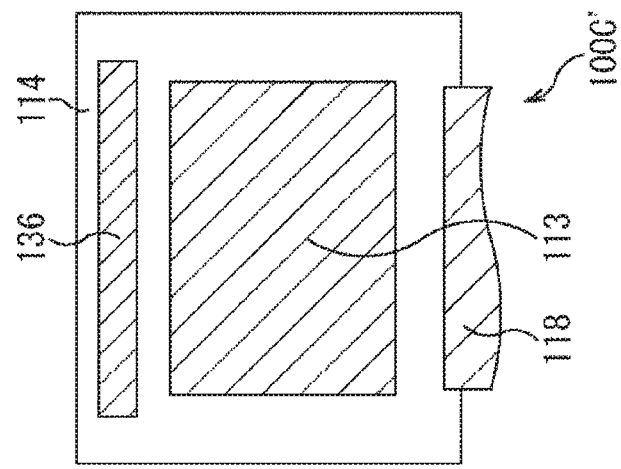
FIGS. 38A, 38B, and 38C are top views of a modification (first through third structures) of the third structure of a semiconductor device according to the first embodiment.
Figure 38B:
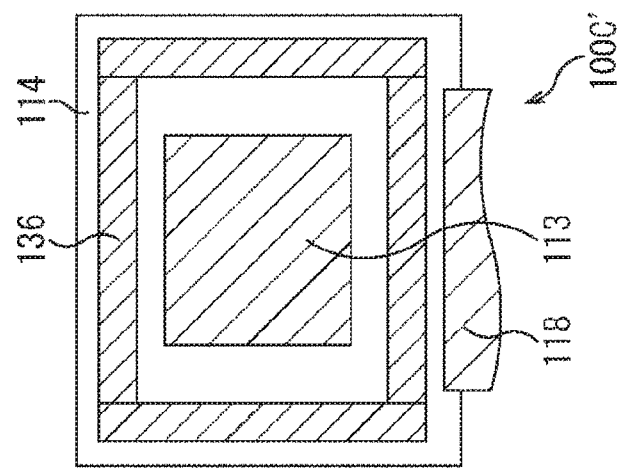
Figure 38A:
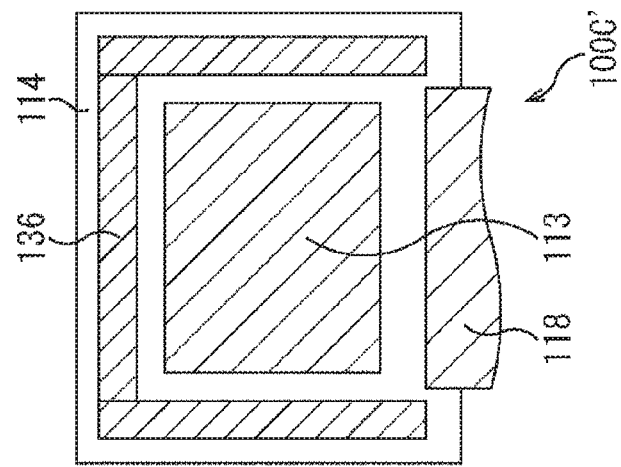

FIGS. 38A, 38B, and 38C show top views of modifications (first through third structures) of the third structure of a semiconductor device according to the first embodiment.

In FIGS. 38A, 38B, and 38C each semiconductor package 100C' is equivalent to the semiconductor package 100C in FIG. 22, but the shape of the adjustment member(s) 136 provided for the lead-out circuit 118 varies when viewed from above. Note that, in each semiconductor package 100C' in FIGS. 38A, 38B and 38C, the on-substrate circuits 116, the components 117, the backing member 121, and the like are not shown, to facilitate understanding of the structure.

(Example of a First Structure)

FIG. 38A is a top view showing an example of a first structure of a modification of the third structure of a semiconductor device according to the first embodiment.

FIG. 38A, the semiconductor package 100C' houses and packages the sensor 113. In the semiconductor package 100C' in FIG. 38A, the lead-out circuit 118 is formed along the lower side among the four sides surrounding the sensor 113 having a rectangular shape, and adjustment members 136 are formed along the other three sides. Note that the adjustment members 136 formed along the three sides are connected (joined).

(Example of a Second Structure)

FIG. 38B is a top view showing an example of a second structure of a modification of the third structure of a semiconductor device according to the first embodiment.

In FIG. 38B, the semiconductor package 100C' houses and packages the sensor 113. In the semiconductor package 100C' in FIG. 38B, the lead-out circuit 118 is formed along the lower side among the four sides surrounding the sensor 113. Further, adjustment members 136 are formed along the four sides including the lower side, to surround the sensor 113. Note that the adjustment members 136 formed along the four sides are connected (joined).

(Example of a Third Structure)

FIG. 38C is a top view showing an example of a third structure of a modification of the third structure of a semiconductor device according to the first embodiment.

In FIG. 38C, the semiconductor package 100C' houses and packages the sensor 113. In the semiconductor package 100C' in FIG. 38C, the lead-out circuit 118 is formed along the lower side among the four sides surrounding the sensor 113, and an adjustment member 136 is formed only along the upper side.

(Example of a Fourth Structure)

Figure 39:
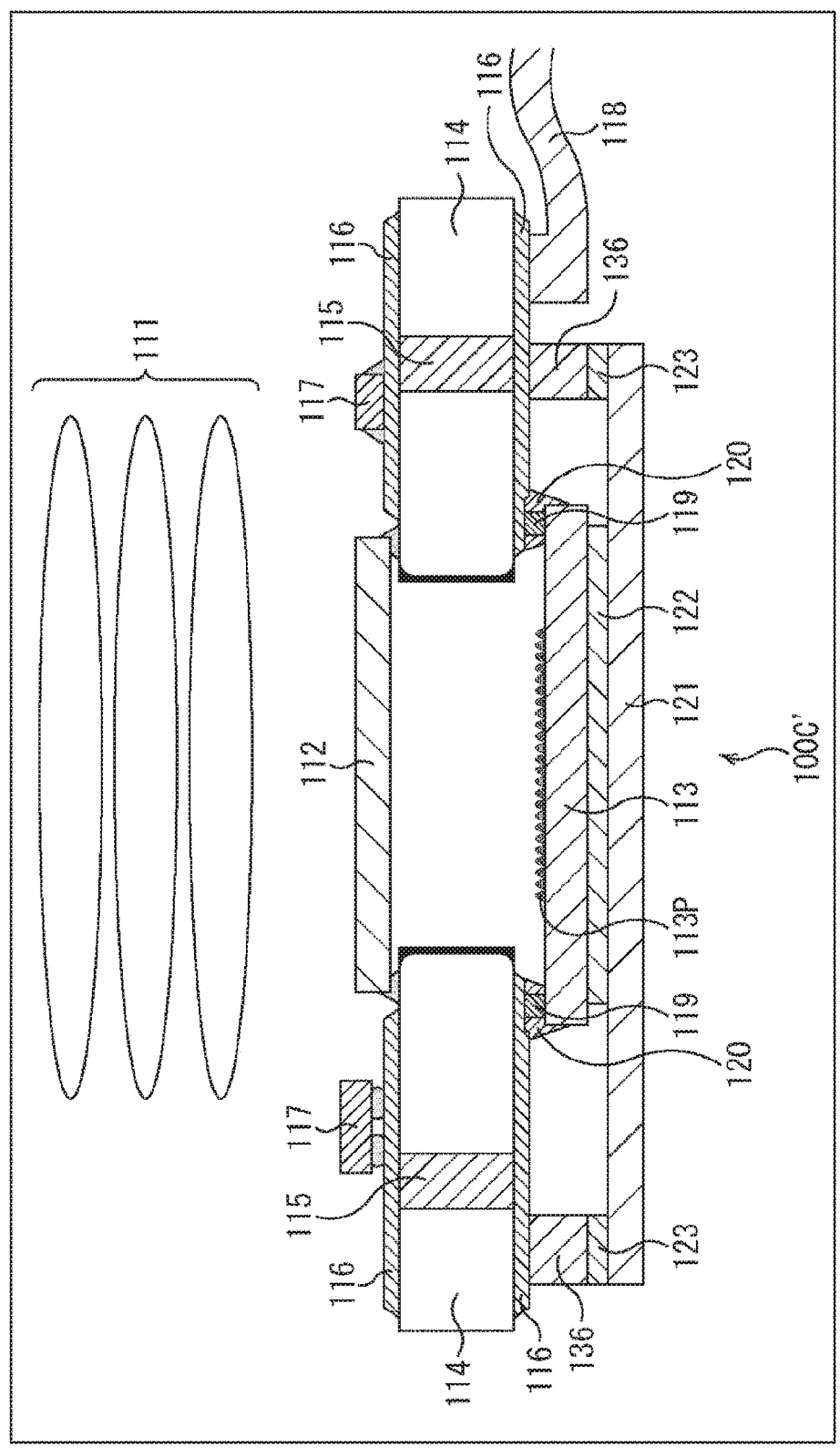
FIG. 39 is a cross-sectional view of a modification (an example of a fourth structure) of the third structure of a semiconductor device according to the first embodiment.

FIG. 39 is a cross-sectional view of a modification (an example of a fourth structure) of the third structure of a semiconductor device according to the first embodiment.

In FIG. 39, a semiconductor package 100C' has a structure similar to that of the semiconductor package 100C in FIG. 22, except that the adjustment member 136 on the backing member 121 is formed not only on the left side in the drawing but also on the right side in the drawing, with the width thereof being adjusted. Further, the lead-out circuit 118 is separated from the backing member 121.

(Example of a Fifth Structure)

Figure 40:
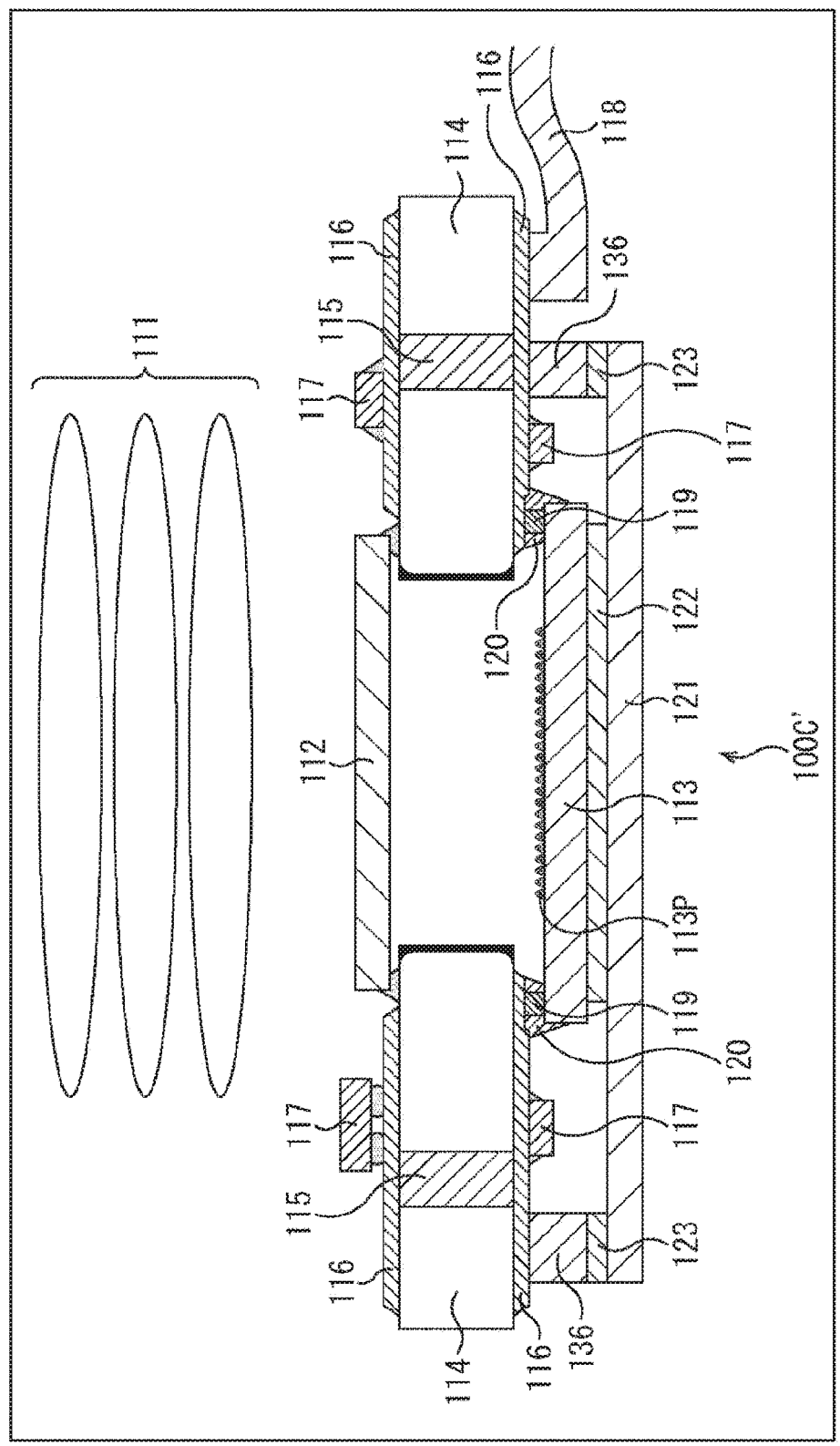
FIG. 40 is a cross-sectional view of a modification (an example of a fifth structure) of the third structure of a semiconductor device according to the first embodiment.

FIG. 40 is a cross-sectional view of a modification (an example of a fifth structure) of the third structure of a semiconductor device according to the first embodiment.

In FIG. 40, a semiconductor package 100C' has a structure similar to that of the semiconductor package 100C in FIG. 22, except that the adjustment member 136 on the backing member 121 is also formed on the right side in the drawing, and the lead-out circuit 118 is separated from the backing member 121. Further, the components 117 are provided not only on the upper surface of the holding substrate 114 but also on the lower surface.

As described above, the semiconductor package 100C shown in FIG. 22 can adopt variations of the structure as the semiconductor packages 100C' shown in FIGS. 38A, 38B, 38C, 39, and 40. Further, although the semiconductor package 100C has been described as an example herein, variations of the structures of the other semiconductor packages 100 may be adopted, as long as materials having physical property values obtained as a result of the above described respective simulations are used for the respective components.

(3) Modifications of Semiconductor Devices According to the First Through Sixth Embodiments Next, modifications of semiconductor devices according to the first through sixth embodiments are described, with reference to FIGS. 41A, 41B, 41C, 42A, 42B, and 42C.

(Examples of First through Third Structures)

Figure 41:
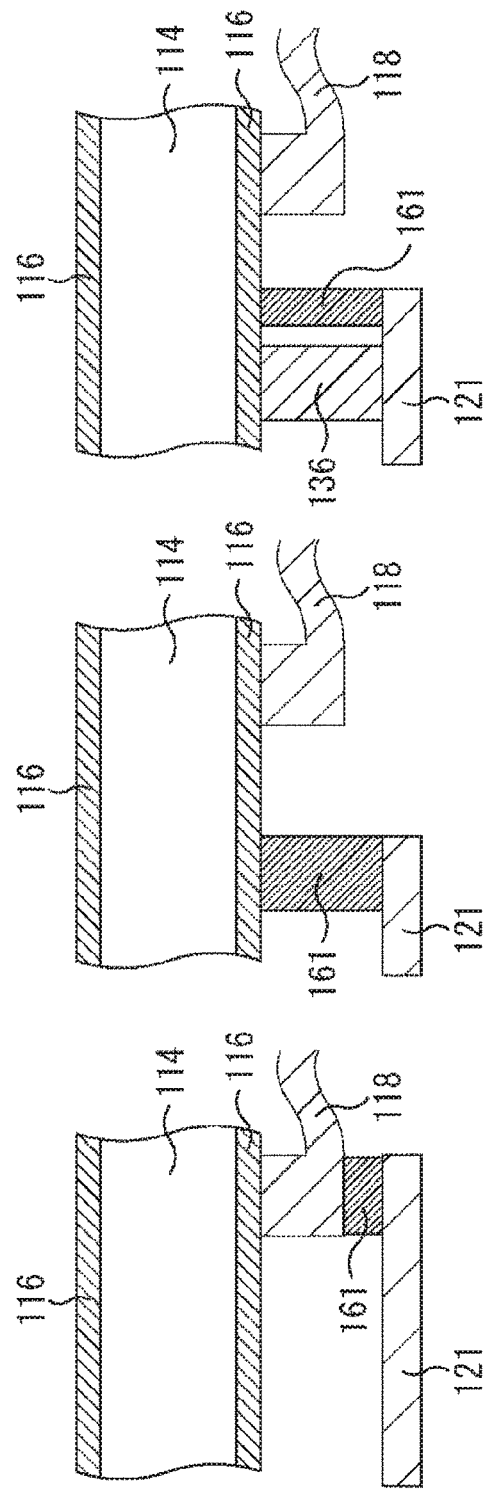
FIGS. 41A, 41B, and 41C show cross-sectional views of modifications (first through third structures) of the first through sixth embodiments.

FIGS. 41A, 41B, and 41C show cross-sectional views of modifications (first through third structures) of the first through sixth embodiments.

FIGS. 41A, 41B, and 41C show partial views of the semiconductor packages 100A through 100N (FIGS. 20 through 33), and the periphery of the lead-out circuit 118 provided between the holding substrate 114 (the holding substrate 214) and the backing member 121.

(First Structure)

FIG. 41A is a cross-sectional view of an example of a first structure of a modification of the first through sixth embodiments.

In FIG. 41A, the lead-out circuit 118 secured onto the upper surface of the backing member 121 is secured not with the above described adhesive 123 but with a conductive member 161. The material of the conductive member 161 may be a solder, a conductive paste, or the like, for example. As the conductive member 161 is used, the on-substrate circuits 116, the lead-out circuits 118, and the backing member 121 become continuous, and can be electrically connected.

(Second Structure)

FIG. 41B is a cross-sectional view of an example of a second structure of a modification of the first through sixth embodiments.

In FIG. 41B, a conductive member 161 adjusted to a predetermined height is provided in place of an adjustment member such as the adjustment member 136 or the adjustment member 141. That is, the conductive member 161 in FIG. 41B not only electrically connects the on-substrate circuits 116 and the backing member 121, but also plays a role in adjusting height.

(Third Structure)

FIG. 41C is a cross-sectional view of an example of a third structure of a modification of the first through sixth embodiments.

In FIG. 41C, a conductive member 161 is provided together with an adjustment member such as the adjustment member 136. That is, the conductive member 161 in FIG. 41C plays a role in electrically connecting the on-substrate circuits 116 and the backing member 121, while leaving the role in adjusting height to the adjustment member 136. Note that, in this case, the adjustment member 136 secured onto the upper surface of the backing member 121 may be secured with an adhesive 123, or may be secured with a conductive member 161 formed with a solder, a conductive paste, or the like.

(Examples of Fourth through Sixth Structures)

Figure 42:
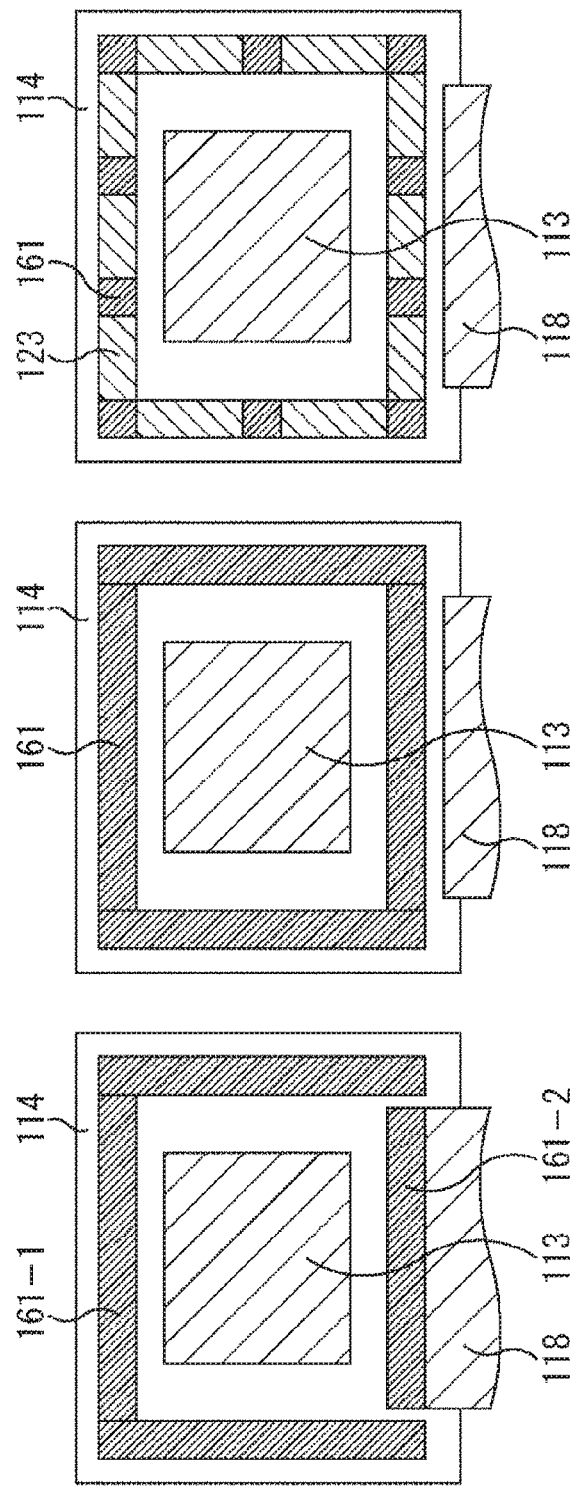
FIGS. 42A, 42B, and 42C show top views of modifications (fourth through sixth structures) of the first through sixth embodiments.

FIGS. 42A, 42B, and 42C show top views of modifications (fourth through sixth structures) of the first through sixth embodiments.

In FIGS. 42A, 42B, and 42C, a conductive member 161 provided for the lead-out circuit 118 in the semiconductor packages 100A through 100N (FIGS. 20, 21, 22, 23, 24, 25, 26, 27, 28, 29, 30, 31, 32, and 33) shown in FIGS. 41A, 41B, and 41C are shown as viewed from above, and its shape varies. Note that, in FIGS. 42A, 42B, and 42C, the on-substrate circuits 116, the components 117, the backing member 121, the adjustment member 136, and the like are not shown, to facilitate understanding of the structure.

(Fourth Structure)

FIG. 42A is a top view of an example of a fourth structure of a modification of the first through sixth embodiments.

In FIG. 42A, the lead-out circuit 118 is formed along the lower side among the four sides surrounding the sensor 113 having a rectangular shape. Further, conductive members 161 are formed along the four sides including the lower side, to surround the sensor 113.

Note that, in FIG. 42A, conductive members 161-1 formed along the three sides of the upper, left, and right sides among the four sides surrounding the sensor 113 are electrically connected. On the other hand, a conductive member 161-2 formed along the lower side among the four sides surrounding the sensor 113 is not connected to the other conductive members 161-1, but is electrically connected to the lead-out circuit 118.

(Fifth Structure)

FIG. 42B is a top view of an example of a fifth structure of a modification of the first through sixth embodiments.

In FIG. 42B, the lead-out circuit 118 is formed along the lower side among the four sides surrounding the sensor 113. Further, conductive members 161 are formed along the four sides including the lower side, to surround the sensor 113.

In FIG. 42B, however, conductive members 161 formed along all of the four sides surrounding the sensor 113 are electrically connected. Note that the conductive member 161 formed along the lower side among the four sides surrounding the sensor 113 is not connected to the lead-out circuit 118.

(Sixth Structure)

FIG. 42C is a top view of an example of a sixth structure of a modification of the first through sixth embodiments.

In FIG. 42C, the lead-out circuit 118 is formed along the lower side among the four sides surrounding the sensor 113. Further, conductive members 161 are formed along the four sides including the lower side, to surround the sensor 113.

In FIG. 42C, however, the conductive members 161 formed along all of the four sides surrounding the sensor 113 and adhesives 123 are alternately formed.

Specifically, a pattern of a conductive member 161, an adhesive 123, and a conductive member 161 is repeated three times along each of the upper and lower sides among the four sides surrounding the sensor 113. Meanwhile, a pattern of a conductive member 161, an adhesive 123, and a conductive member 161 is repeated twice along each of the right and left sides among the four sides surrounding the sensor 113. Note that these repeated patterns are an example, and some other patterns may be adopted.

As described above, in the semiconductor packages 100A through 100N (FIGS. 20 through 33), a structure including a conductive member 161 formed with a solder, a conductive paste, or the like may be adopted.

(4) Example of a Manufacturing Method

Figure 43:
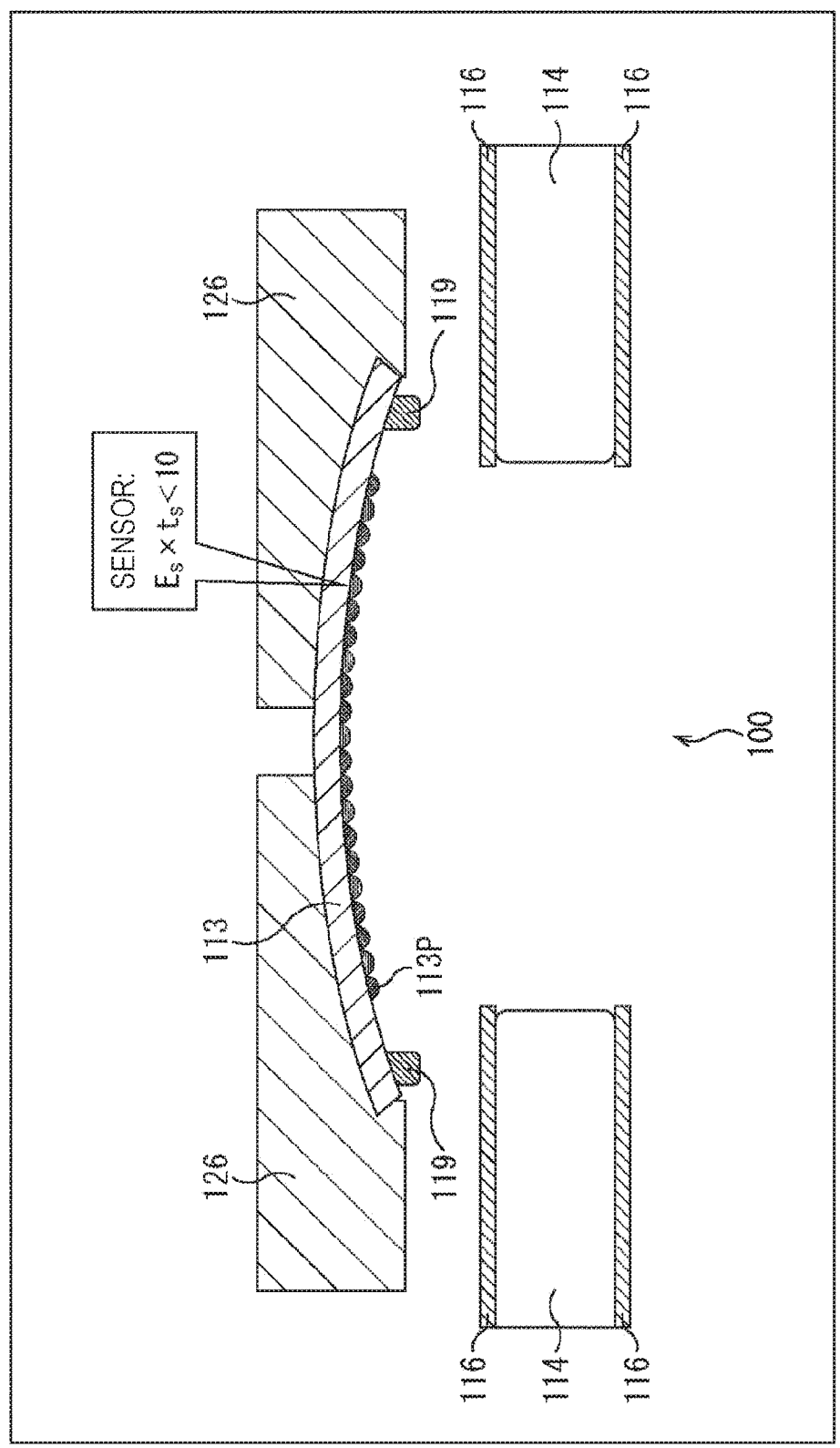

FIG. 43 is a diagram showing an example of a manufacturing method in a case where a curved sensor 113 is mounted on a holding substrate 114.

As the manufacturing method illustrated in FIG. 43 is used, it is possible to achieve a structure with a region in which $E_S \times t_S$ is particularly small (the amount of warpage of the sensor 113 is equal to or smaller than a curvature radius of 100 mm) in a semiconductor package 100 (FIG. 4 or the like), where $E_S$ (GPa) and $t_S$ (mm) represent the Young's modulus and the thickness of the sensor 113 mounted on a sensor mounting tool 126.

In FIG. 43, the electrodes 119 are electrically connected to the on-substrate circuit 116 provided on the lower surface of the holding substrate 114, so that the peripheral portion of the sensor 113 mounted on the sensor mounting tool 126 is held from the light receiving surface side. Note that a hole for vacuum suction is formed in the sensor mounting tool 126 on which the sensor 113 is mounted. As the sensor mounting tool 126 is used in this manner, the sensor 113 can be curved (with a curvature radius of 100 mm or smaller, for example), and be mounted on the holding substrate 114.

As described above, the manufacturing method illustrated in FIG. 43 is used, so that the sensor 113 can be forcibly curved to conform to the curvature of field. Even in a case where a structure is designed to satisfy the relationship, $E_S \times t_S < 10$, where $E_S$ (GPa) and $t_S$ (mm) represent the Young's modulus and the thickness of the sensor 113, the relationship shown in the above expression (1), or the relationship, $(E_I \times t_I) + (E_S \times t_S) > 30$, can be maintained, where $E_S$ (GPa) and $t_S$ (mm) represent the Young's modulus and the thickness of the sensor 113, and $E_I$ (GPa) and $t_I$ (mm) represent the Young's modulus and the thickness of the holding substrate 114. Thus, it is possible to maintain stability of the amount of temperature-dependent change in warpage of the sensor 113.

10. Configuration of an Electronic Apparatus

Figure 44:
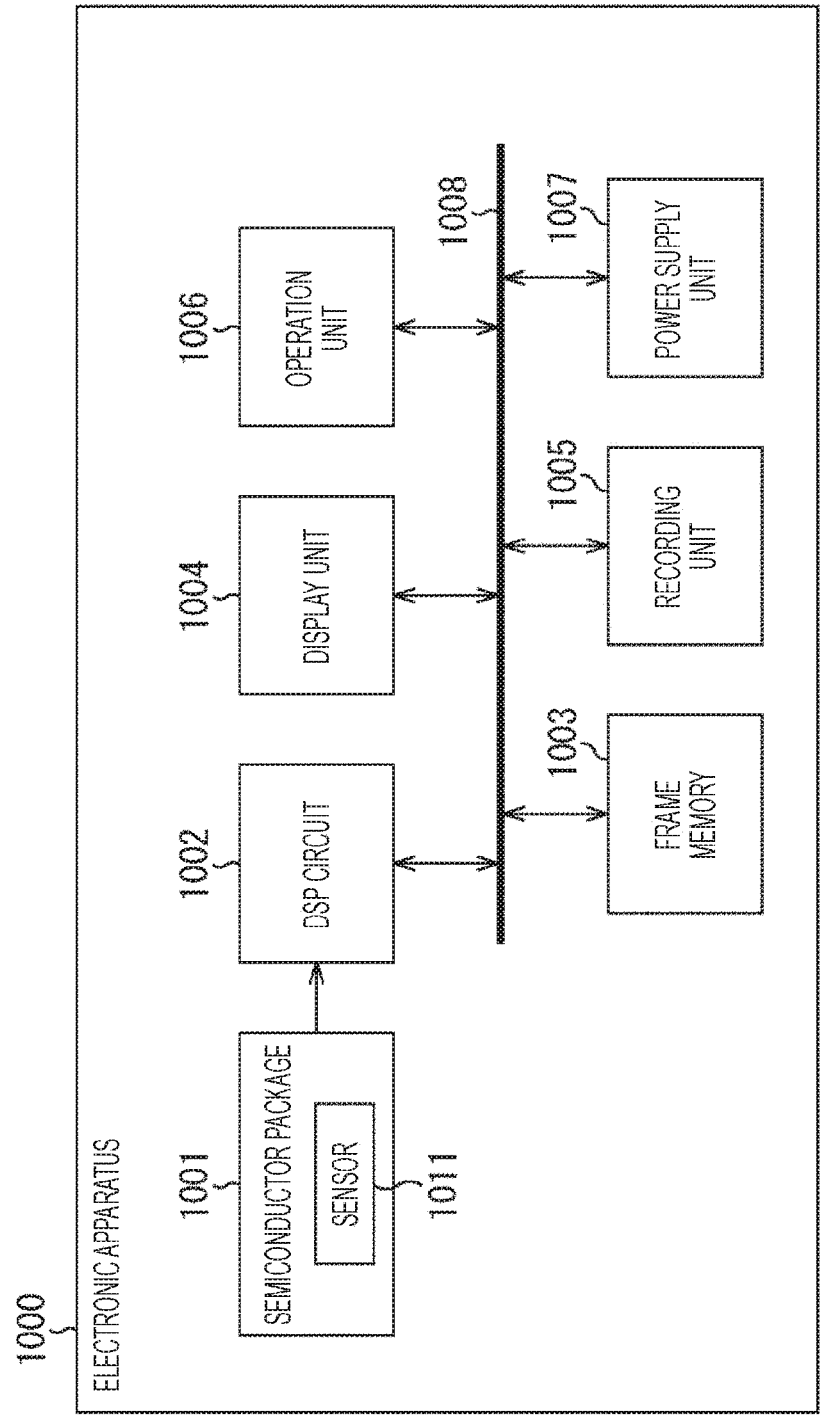

FIG. 44 is a block diagram showing an example configuration of an electronic apparatus including a semiconductor device to which the present technology is applied.

In FIG. 44, an electronic apparatus 1000 is an electronic apparatus, such as an imaging apparatus like a digital still camera or a video camera, or a mobile terminal device having an imaging function like a smartphone or a tablet, for example.

In FIG. 44, the electronic apparatus 1000 includes a semiconductor package 1001, a digital signal processor (DSP) circuit 1002, a frame memory 1003, a display unit 1004, a recording unit 1005, an operation unit 1006, and a power supply unit 1007. Also, in the electronic apparatus 1000, the DSP circuit 1002, the frame memory 1003, the display unit 1004, the recording unit 1005, the operation unit 1006, and the power supply unit 1007 are connected to one another via a bus line 1008.

The semiconductor package 1001 is equivalent to the semiconductor packages 100A through 100N shown in FIGS. 20 through 33, and has a structure corresponding to one of the first through sixth embodiments described above, for example. The semiconductor package 1001 houses and packages a sensor 1011. The sensor 1011 is equivalent to the sensor 113 described above.

The DSP circuit 1002 is a signal processing circuit that processes a signal supplied from the semiconductor package 1001 The DSP circuit 1002 outputs image data obtained by processing the signal supplied from the semiconductor package 1001. The frame memory 1003 temporarily stores, on a frame-by-frame basis, the image data processed by the DSP circuit 1002.

The display unit 1004 is formed with a panel display device such as a liquid crystal panel, or an organic electroluminescence (EL) panel, for example, and displays a moving image or a still image formed by the semiconductor package 1001. The recording unit 1005 records the image data of the moving image or the still image formed by the semiconductor package 1001 into a recording medium such as a semiconductor memory or a hard disk.

The operation unit 1006 outputs operation instructions as to the various functions of the electronic apparatus 1000, in accordance with operations performed by the user. The power supply unit 1007 supplies the DSP circuit 1002, the frame memory 1003, the display unit 1004, the recording unit 1005, and the operation unit 1006 with various power sources as the operation power sources for these supply destinations, as appropriate.

The electronic apparatus 1000 is configured as above. In the electronic apparatus 1000, any of the semiconductor packages 100A through 100N shown in FIGS. 20 through 33 can be used as the semiconductor package 1001, so that sufficient thermal stability of warpage of the sensor 1011 housed in the semiconductor package 1001 can be maintained, and an optical system that is stable with heat can be provided. As a result, the image quality of captured images can be enhanced, for example.

11. Examples of Use of an Image Sensor

Figure 45:
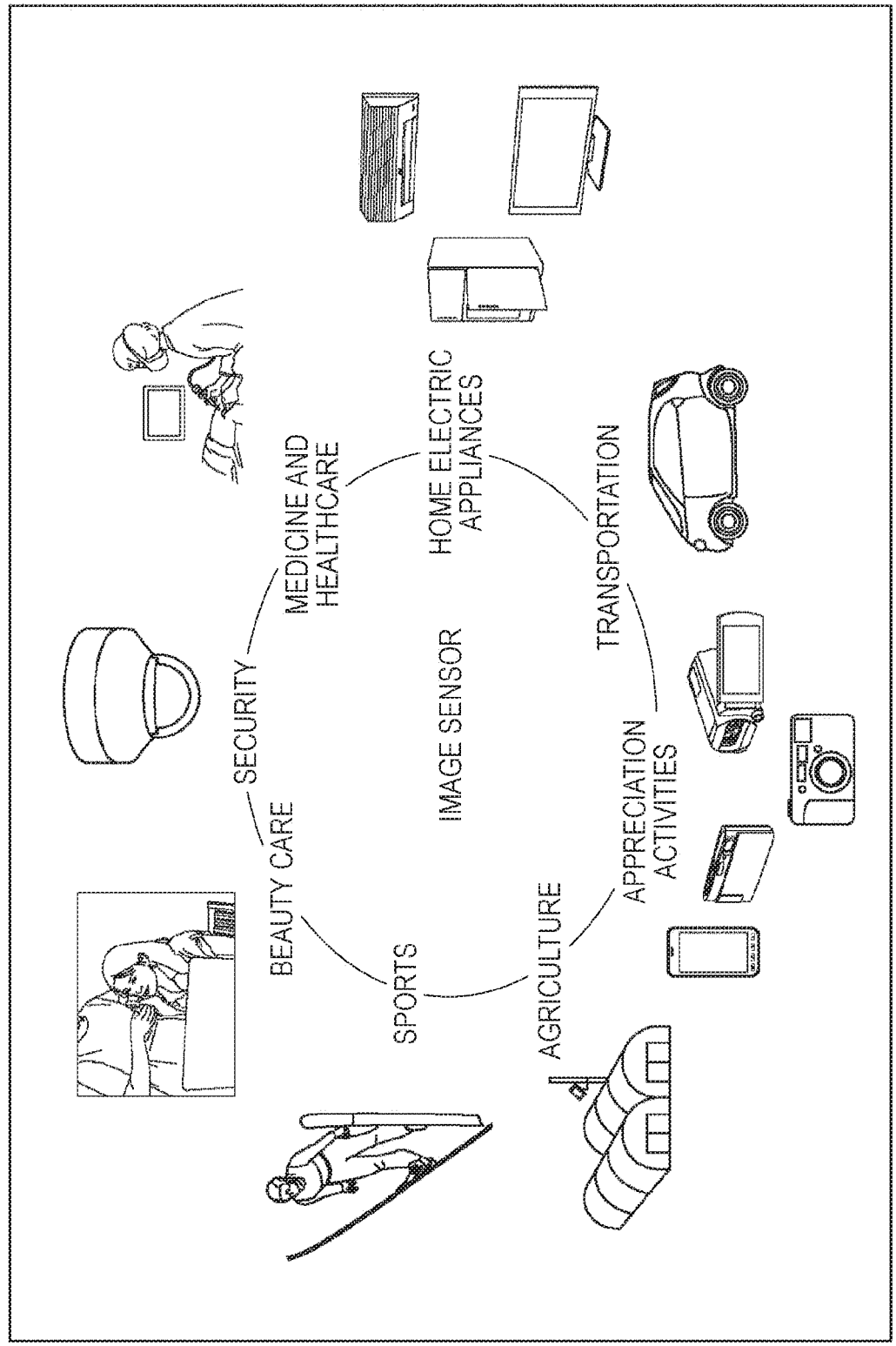

FIG. 45 is a diagram showing examples of use of an image sensor housed in a semiconductor device to which the present technology is applied.

An image sensor as the sensor 113 housed in the semiconductor package 100 can be used in various cases where light, such as visible light, infrared light, ultraviolet light, or X-rays, is to be sensed as described below, for example. That is, as shown in FIG. 45, the image sensor can be used in an apparatus that is used not only in the appreciation activity field where images are taken and are used in appreciation activities, but also in the field of transportation, the field of home electric appliances, the fields of medicine and healthcare, the field of security, the field of beauty care, the field of sports, the field of agriculture, or the like, for example.

Specifically, in the appreciation activity field, the image sensor can be used in an apparatus (such as the electronic apparatus 1000 shown in FIG. 44) for taking images to be used in appreciation activities, such as a digital camera, a smartphone, or a mobile telephone with a camera function, for example.

In the field of transportation, for example, the image sensor can be used in apparatuses for transportation use, such as vehicle-mounted sensors configured to take images of the front, the back, the surroundings, the inside, and the like of an automobile to, for example, perform safe driving like an automatic stop and recognize a driver's condition, surveillance cameras for monitoring running vehicles and roads, and ranging sensors and the like for measuring distances between vehicles and the like. Note that an apparatus mounted in a mobile structure, such as an automobile, will be described later with reference to FIGS. 46 and 47.

In the field of home electric appliances, the image sensor can be used in an apparatus to be used as home electric appliance, such as a television set, a refrigerator, or an air conditioner, to take images of gestures of users and operate the apparatus in accordance with the gestures, for example. Further, in the fields of medicine and healthcare, the image sensor can be used in an apparatus for medical use or healthcare use, such as an endoscope or an apparatus for receiving infrared light for angiography, for example.

In the field of security, the image sensor can be employed in an apparatus for security use, such as a surveillance camera for crime prevention or a camera for personal authentication, for example. Further, in the field of beauty care, the image sensor can be used in an apparatus for beauty care use, such as a skin measurement apparatus configured to image the skin, or a microscope for imaging the scalp, for example.

In the field of sports, the image sensor can be employed in an apparatus for sporting use, such as an action camera or a wearable camera for sports or the like, for example. Further, in the field of agriculture, the image sensor can be employed in an apparatus for agricultural use, such as a camera for monitoring conditions of fields and crops, for example.

12. Example Applications to Moving Objects

The technology according to the present disclosure (the present technology) can be applied to various products. For example, the technology according to the present disclosure may be embodied as an apparatus mounted on any type of moving object, such as an automobile, an electrical vehicle, a hybrid electrical vehicle, a motorcycle, a bicycle, a personal mobility device, an airplane, a drone, a vessel, or a robot.

Figure 46:
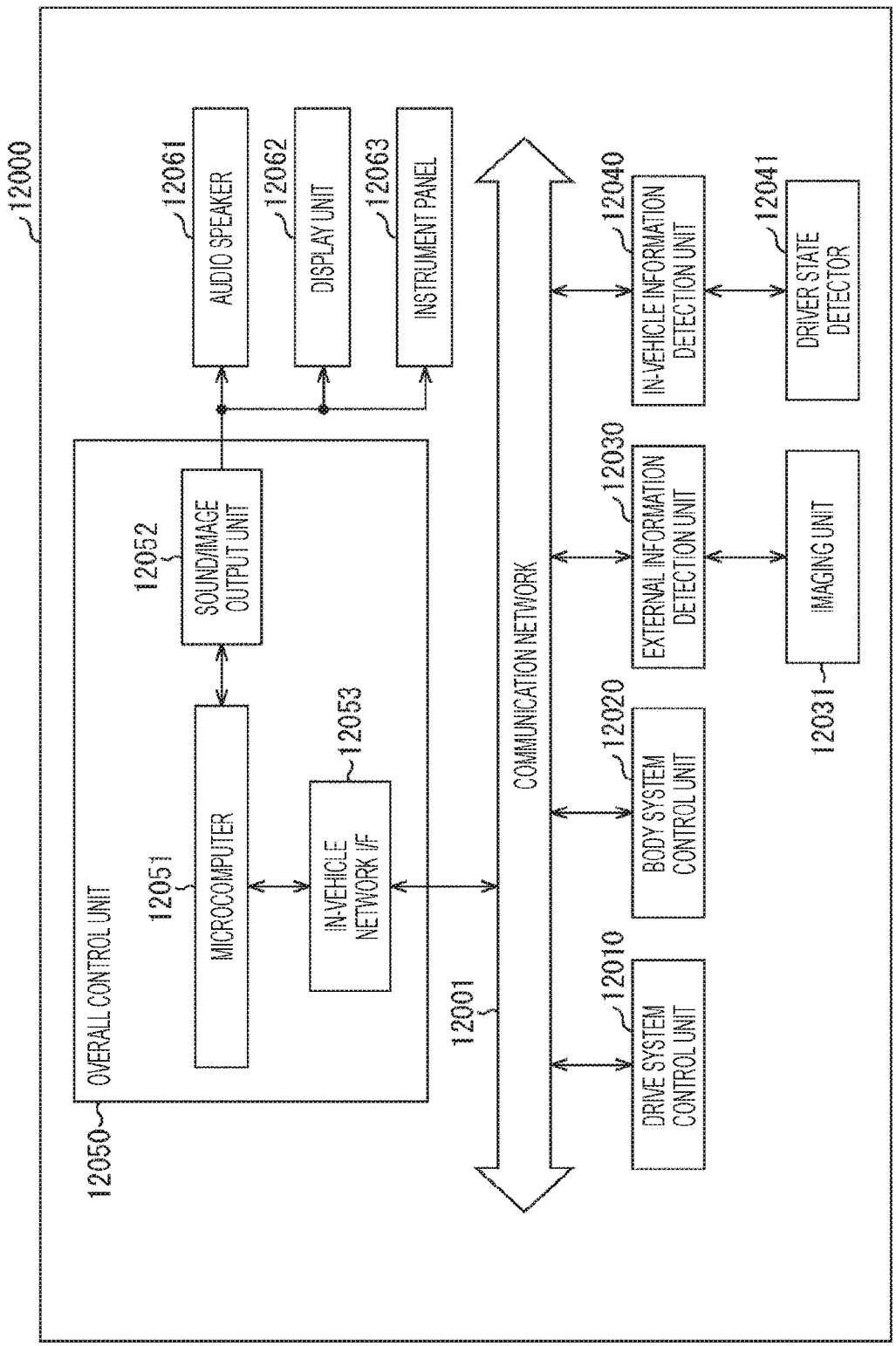

FIG. 46 is a block diagram schematically showing an example configuration of a vehicle control system that is an example of a moving object control system to which the technology according to the present disclosure can be applied.

A vehicle control system 12000 includes a plurality of electronic control units connected via a communication network 12001. In the example shown in FIG. 46, the vehicle control system 12000 includes a drive system control unit 12010, a body system control unit 12020, an external information detection unit 12030, an in-vehicle information detection unit 12040, and an overall control unit 12050. A microcomputer 12051, a sound/image output unit 12052, and an in-vehicle network interface (I/F) 12053 are also shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, or a fog lamp. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. In accordance with the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared light.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, in accordance with detected information input from the driver state detector 12041, the in-vehicle information detection unit 12040 may calculate the degree of fatigue or the degree of concentration of the driver, or determine whether the driver is dozing off.

In accordance with the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle speed maintenance running, vehicle collision warning, vehicle lane deviation warning, or the like.

The microcomputer 12051 can also perform cooperative control to conduct automatic driving or the like for autonomously running not depending on the operation of the driver, by controlling the driving force generation device, the steering mechanism, the braking device, or the like in accordance with information about the surroundings of the vehicle, the information having being acquired by the external information detection unit 12030 or the in-vehicle information detection unit 12040.

The microcomputer 12051 can also output a control command to the body system control unit 12020, in accordance with the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 46, an audio speaker 12061, a display unit 12062, and an instrument panel 12063 are shown as output devices. The display unit 12062 may include an on-board display and/or a head-up display, for example.

Figure 47:
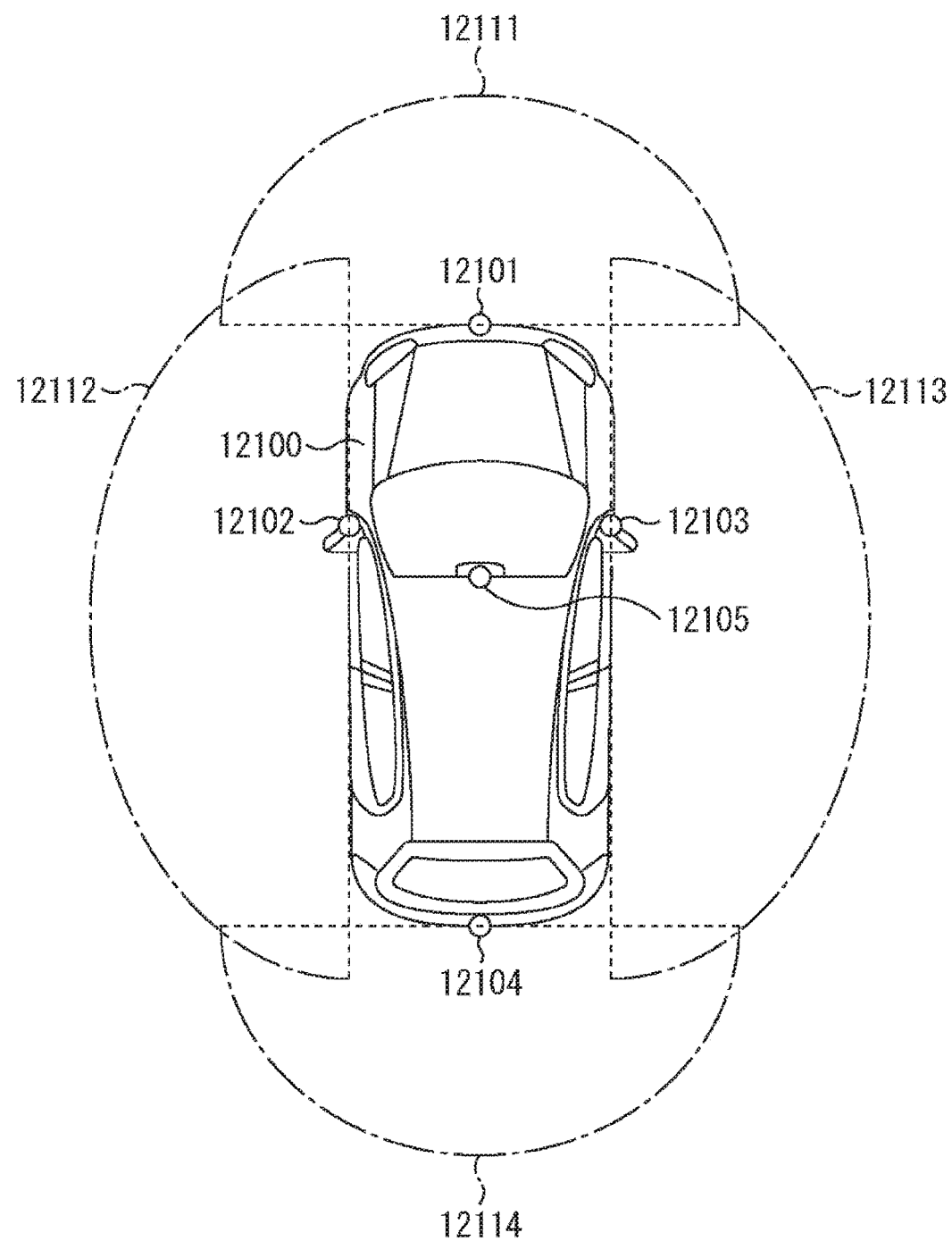

FIG. 47 is a diagram showing an example of the installation positions of the imaging unit 12031.

In FIG. 47, a vehicle 12100 includes imaging units 12101, 12102, 12103, 12104, and 12105 as the imaging unit 12031.

The imaging units 12101, 12102, 12103, 12104, and 12105 are provided at the following positions: the front end edge of the vehicle 12100, a side mirror, the rear bumper, a rear door, an upper portion of the front windshield inside the vehicle, and the like, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 47 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, in accordance with distance information obtained from the imaging units 12101 through 12104, the microcomputer 12051 calculates the distances to the respective three-dimensional objects within the imaging ranges 12111 through 12114, and temporal changes in the distances (the speeds relative to the vehicle 12100). In this manner, the three-dimensional object that is the closest three-dimensional object on the traveling path of the vehicle 12100 and is traveling at a predetermined speed (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 outputs a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared light. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. The sound/image output unit 12052 may also control the display unit 12062 to display an icon or the like indicating the pedestrian at a desired position.

An example of a vehicle control system to which the technology according to the present disclosure can be applied has been described above. The technology according to the present disclosure can be applied to the imaging unit 12031 in the above described configuration. Specifically, the semiconductor packages 100A through 100N shown in FIGS. 20 through 33 can be used in the imaging unit 12031. As the technology according to the present disclosure is applied to the imaging unit 12031, a sufficient thermal stability of warpage of the sensor 113 housed in a semiconductor package 100 is maintained, an optical system stable to heat is provided, and the quality of captured images can be enhanced. Thus, it becomes possible to recognize a target, such as a pedestrian, with a higher degree of accuracy, for example.

Note that embodiments of the present technology are not limited to the above described embodiments, and various modifications may be made to them without departing from the scope of the present technology.

The present technology may also be embodied in the configurations described below.

(1)

A semiconductor device including:

a sensor; and a holding substrate that holds the sensor, in which $$(E_I \times t_I) + (E_S \times t_S) > 30, \text{ and}$$

$$1.5 < CTE_I < 4.5,$$

are satisfied, where $E_S$ (GPa) represents a Young's modulus of the sensor, $t_S$ (mm) represents a thickness of the sensor, $CTE_I$ (ppm/K) represents a linear expansion coefficient of the holding substrate, $E_I$ (GPa) represents a Young's modulus of the holding substrate, and $t_I$ (mm) represents a thickness of the holding substrate.

(2)

The semiconductor device according to (1), in which the holding substrate has a structure in which a peripheral portion of the sensor is held by a substrate electrode from a light receiving surface side, and a total volume of conductive wiring members formed on the holding substrate is not larger than 1/10 of a volume of the holding substrate.

(3)

The semiconductor device according to (1) or (2), further including a backing member that backs the sensor, in which $$(E_C \times t_C) < 40,$$

is satisfied, where $E_C$ (GPa) represents a Young's modulus of the backing member, and $t_C$ (mm) represents a thickness of the backing member.

(4)

The semiconductor device according to any one of (1) to (3), further including a lens group including a plurality of lenses, in which the sensor is a curved sensor that has a curvature radius not smaller than 100 mm, and is concavely curved on a side of the lens group.

(5)

The semiconductor device according to (4), in which $$E_S \times t_S < 10$$

is satisfied.

(6)

The semiconductor device according to any one of (1) to (3), further including a lens group including a plurality of lenses, in which an f-number of the lens group is not greater than 2.8.

(7)

The semiconductor device according to any one of (1) to (6), in which a component as a heating element is mounted on the holding substrate.

(8)

The semiconductor device according to (4), in which a mechanism for driving the lens group is mounted on the holding substrate.

(9)

The semiconductor device according to any one of (1) to (8), in which the sensor is an image sensor including a pixel unit in which a plurality of pixels is two-dimensionally arranged in a matrix form.

(10)

An electronic apparatus including a semiconductor device including:

a sensor; and a holding substrate that holds the sensor, in which $$(E_I \times t_I) + (E_S \times t_S) > 30, \text{ and}$$

$$1.5 < CTE_I < 4.5,$$

are satisfied, where $E_S$ (GPa) represents a Young's modulus of the sensor, $t_S$ (mm) represents a thickness of the sensor, $CTE_I$ (ppm/K) represents a linear expansion coefficient of the holding substrate, $E_I$ (GPa) represents a Young's modulus of the holding substrate, and $t_I$ (mm) represents a thickness of the holding substrate.

REFERENCE SIGNS LIST

100, 100A to 100N Semiconductor package
111 Lens group
112 Sealing member
113 Sensor
113P Pixel
114 Holding substrate
115 Through electrode
116 On-substrate circuit
117 Component
118 Lead-out circuit
119 Electrode
120 Electrode protection member
121 Backing member
122 Adhesive
123 Adhesive
131 Pixel protection member
136 Adjustment member
141 Adjustment member
146 Component
151 First member
152 Second member
153 Third member
161 Conductive member
212 Filter member
214 Holding substrate
1000 Electronic apparatus
1001 Semiconductor package
1011 Sensor
12031 Imaging unit

The invention claimed is:

1. A semiconductor device, comprising:
   a sensor;
   a holding substrate configured to hold the sensor;
   a substrate electrode on a side, of the holding substrate, facing the sensor, wherein
      the substrate electrode is configured to hold the sensor from a peripheral portion of the sensor,
      the holding substrate has a structure in which the peripheral portion of the sensor is held by the substrate electrode from a light receiving surface side of the sensor, and
      a total volume of conductive wiring members on the holding substrate is not larger than 1/10 of a volume of the holding substrate; and
   an electrode protection member configured to protect the substrate electrode,
   wherein $$(E_I \times t_I) + (E_S \times t_S) > 30, \text{ and}$$

$$1.5 < CTE_I < 4.5,$$

are satisfied,
   where
      $E_S$ (GPa) represents a Young's modulus of the sensor,
      $t_S$ (mm) represents a thickness of the sensor,
      $CTE_I$ (ppm/K) represents a linear expansion coefficient of the holding substrate,
      $E_I$ (GPa) represents a Young's modulus of the holding substrate, and
      $t_I$ (mm) represents a thickness of the holding substrate.

2. The semiconductor device according to claim 1, further comprising a backing member configured to back the sensor, wherein $$(E_c \times t_c) < 40,$$

is satisfied,
   where $E_c$ (GPa) represents a Young's modulus of the backing member, and $t_c$ (mm) represents a thickness of the backing member.

3. The semiconductor device according to claim 2, further comprising a lens group including a plurality of lenses, wherein
   the sensor is a curved sensor that has a curvature radius greater than or equal to 100 mm, and
   the sensor is concavely curved on a side of the lens group.

4. The semiconductor device according to claim 3, wherein
   $E_S \times t_S < 10$ is satisfied.

5. The semiconductor device according to claim 2, further comprising a lens group including a plurality of lenses, wherein an f-number of the lens group is less than or equal to 2.8.

6. The semiconductor device according to claim 1, wherein a component as a heating element is mounted on the holding substrate.

7. The semiconductor device according to claim 3, wherein a mechanism for driving the lens group is mounted on the holding substrate.

8. The semiconductor device according to claim 1, wherein the sensor is an image sensor including a pixel unit in which a plurality of pixels is two-dimensionally arranged in a matrix form.

9. An electronic apparatus, comprising:
a semiconductor device including:
  a sensor;
  a holding substrate configured to hold the sensor;
  a substrate electrode on a side, of the holding substrate, facing the sensor, wherein
    the substrate electrode is configured to hold the sensor from a peripheral portion of the sensor,
    the holding substrate has a structure in which the peripheral portion of the sensor is held by the substrate electrode from a light receiving surface side of the sensor, and
  a total volume of conductive wiring members on the holding substrate is not larger than 1/10 of a volume of the holding substrate; and
an electrode protection member configured to protect the substrate electrode,
wherein $(E_I \times t_I) + (E_S \times t_S) > 30$, and $1.5 < CTE_I < 4.5$, are satisfied,
where
  $E_S$ (GPa) represents a Young's modulus of the sensor,
  $t_S$ (mm) represents a thickness of the sensor,
  $CTE_I$ (ppm/K) represents a linear expansion coefficient of the holding substrate,
  $E_I$ (GPa) represents a Young's modulus of the holding substrate, and
  $t_I$ (mm) represents a thickness of the holding substrate.

* * * * *